(12) United States Patent
Yakubo et al.

(10) Patent No.: US 8,508,256 B2
(45) Date of Patent: Aug. 13, 2013

(54) SEMICONDUCTOR INTEGRATED CIRCUIT

(75) Inventors: Yuto Yakubo, Isehara (JP); Shuhei Nagatsuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/471,922

(22) Filed: May 15, 2012

(65) Prior Publication Data

US 2012/0293210 A1 Nov. 22, 2012

(30) Foreign Application Priority Data

May 20, 2011 (JP) ................................. 2011-113711

(51) Int. Cl.
*H03K 19/094* (2006.01)
*H03K 17/00* (2006.01)

(52) U.S. Cl.
USPC ............. 326/103; 326/52; 326/113; 326/102; 327/408

(58) Field of Classification Search
USPC ................. 326/102, 83, 52, 55, 95, 112, 113, 326/122; 327/408, 409
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,617,878 B2 * | 9/2003 | Brownlow et al. | 326/68 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Daniel D Chang
(74) *Attorney, Agent, or Firm* — Eric J. Robinson; Robinson Intellectual Property Law Office, P.C.

(57) ABSTRACT

A novel logic circuit which retains data even when power supply is stopped is provided. Further, a novel logic circuit with low power consumption is provided. In the logic circuit, a comparator comparing two output nodes, a charge retaining portion, and an output-node-potential determining portion are electrically connected to each other. Thus, the logic circuit can retain data even when power supply is stopped. In addition, the total number of transistors included in the logic circuit can be reduced. Further, a transistor including an oxide semiconductor and a transistor including silicon are stacked, whereby the area of the logic circuit can be reduced.

21 Claims, 50 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,411,420 B2 * | 8/2008 | Doi .................................. 326/82 |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,125,268 B2 * | 2/2012 | Pan et al. ....................... 327/563 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0114018 A1 | 6/2006 | Sugahara et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0052777 A1 * | 3/2010 | Pan et al. ....................... 327/563 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062992 A1 | 3/2011 | Okazaki et al. |
| 2011/0069047 A1 | 3/2011 | Koyama et al. |
| 2011/0084731 A1 | 4/2011 | Kawae |
| 2011/0089975 A1 | 4/2011 | Yamazaki et al. |
| 2011/0090184 A1 | 4/2011 | Yamazaki et al. |
| 2011/0101332 A1 | 5/2011 | Yamazaki et al. |
| 2011/0102018 A1 | 5/2011 | Shionoiri et al. |
| 2011/0156027 A1 | 6/2011 | Yamazaki et al. |
| 2011/0285372 A1 | 11/2011 | Takahashi |
| 2011/0285426 A1 | 11/2011 | Takahashi |
| 2011/0285442 A1 | 11/2011 | Saito |
| 2012/0032785 A1 | 2/2012 | Kamata |
| 2012/0057396 A1 | 3/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO2004/086625 | 10/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devicds Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID Internatinal Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono,H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium digest of Technical Papers, 2007, vol. 38, pp. 1673-1676.

Chern.H et al., "An Analytical Model for the Above-Threshold Characteristics of Polysilicon thin-film transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al.,"Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

FIG. 35A  FIG. 35B
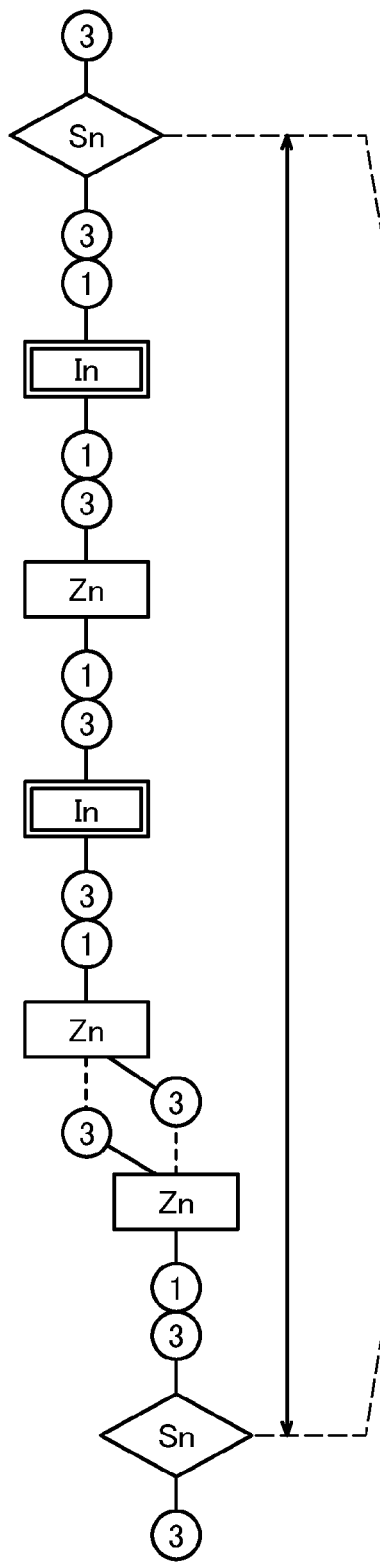
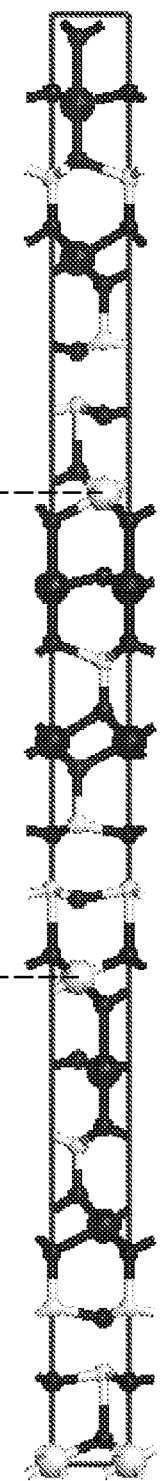
FIG. 35C
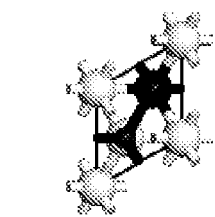
● In
○ Sn
· Zn
• O

FIG. 36A
FIG. 36B
FIG. 36C
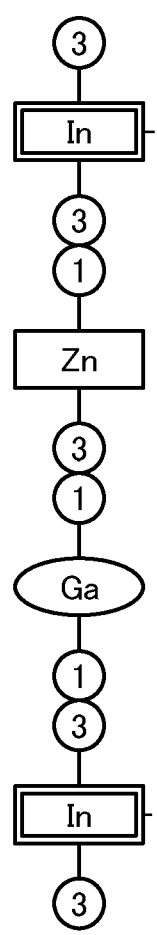
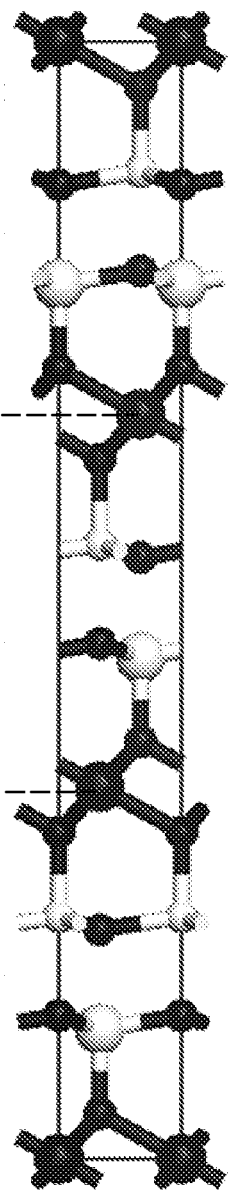
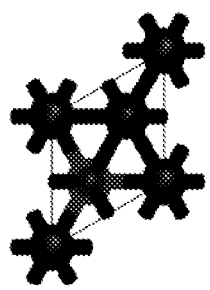
- In
- Ga
- Zn
- O

SEMICONDUCTOR INTEGRATED CIRCUIT

BACKGROUND OF THE INVENTION

1. Field of the Invention

The present invention relates to a semiconductor integrated circuit using an oxide semiconductor and a method of driving the semiconductor integrated circuit.

2. Description of the Related Art

In a semiconductor integrated circuit, a NAND circuit, a NOR circuit, an inverter circuit (NOT circuit), and the like are used in combination.

A conventional logic circuit includes a CMOS circuit in which p-channel transistors and n-channel transistors are used in a complementary combination. The conventional logic circuit loses data when power supply is stopped.

In addition, Patent Document 1 discloses a logic circuit which is formed with a CMOS circuit configuration using a spin MOSFET to maintain a nonvolatile logic function. As one example thereof, a circuit diagram of an XOR circuit from which a result of exclusive OR of one input and another input is obtained is disclosed in Patent Document 1.

REFERENCE

Patent Document

[Patent Document 1] PCT international Publication No. 2004/086625

SUMMARY OF THE INVENTION

An object of one embodiment of the present invention is to provide a novel logic circuit which retains data even when power supply is stopped.

In a conventional logic circuit using a CMOS circuit, power consumption in standby state is large because there are a large number of paths which go from a power supply terminal to a reference potential (GND) terminal.

Another object is to provide a novel logic circuit with low power consumption.

As a novel logic circuit which retains data even when power supply is stopped, an XOR circuit is provided.

As a novel logic circuit which retains data even when power supply is stopped, a MUX circuit is provided.

As a novel logic circuit which retains data even when power supply is stopped, a register circuit is provided.

As a novel logic circuit which retains data even when power supply is stopped, an inverter circuit is provided.

As a novel logic circuit which retains data even when power supply is stopped, a NAND circuit is provided.

One embodiment of the present invention disclosed in this specification is a semiconductor integrated circuit which includes a logic circuit including a comparator comparing two output nodes, a charge retaining portion electrically connected to the comparator, and an output-node-potential determining portion electrically connected to the charge retaining portion. The charge retaining portion includes a first transistor including silicon whose gate is electrically connected to a first transistor including an oxide semiconductor, a second transistor including silicon whose gate is electrically connected to a second transistor including an oxide semiconductor, a third transistor including silicon whose gate is electrically connected to a third transistor including an oxide semiconductor, a fourth transistor including silicon whose gate is electrically connected to a fourth transistor including an oxide semiconductor, a fifth transistor including silicon whose gate is electrically connected to a fifth transistor including an oxide semiconductor, a sixth transistor including silicon whose gate is electrically connected to a sixth transistor including an oxide semiconductor, a seventh transistor including silicon whose gate is electrically connected to a seventh transistor including an oxide semiconductor, and an eighth transistor including silicon whose gate is electrically connected to an eighth transistor including an oxide semiconductor.

In the above structure, the comparator may include two p-channel transistors each including a gate supplied with a clock signal and two p-channel transistors each including a gate connected to a corresponding one of the two output nodes. The output-node-potential determining portion may be an n-channel transistor whose gate is supplied with a clock signal. A drain of the n-channel transistor may be electrically connected to a reference potential terminal. A source of the n-channel transistor may be electrically connected to a power supply potential terminal.

In the above structure, the comparator may include two n-channel transistors each including a gate supplied with a clock signal and two n-channel transistors each including a gate connected to a corresponding one of the two output nodes. The output-node-potential determining portion may be a p-channel transistor whose gate is supplied with a clock signal. A drain of the p-channel transistor may be electrically connected to the power supply potential terminal. A source of the p-channel transistor may be electrically connected to the reference potential terminal.

Note that in this specification, a p-channel transistor is referred to as a transistor (p-channel) and an n-channel transistor is referred to as a transistor (n-channel).

One embodiment of the present invention provides a logic circuit in which a comparator comparing two output nodes, a charge retaining portion, and an output-node-potential determining portion are electrically connected to each other. Thus, the logic circuit can retain data even when power supply is stopped. Since the number of paths which go from a power supply potential terminal to a reference potential terminal can be reduced, power consumption of the logic circuit can be reduced.

BRIEF DESCRIPTION OF THE DRAWINGS

In the accompanying drawings:

FIGS. 35A to 35C illustrate a crystal structure of an oxide material;
FIGS. 36A to 36C illustrate a crystal structure of an oxide material.

DETAILED DESCRIPTION OF THE INVENTION

Figure 1:
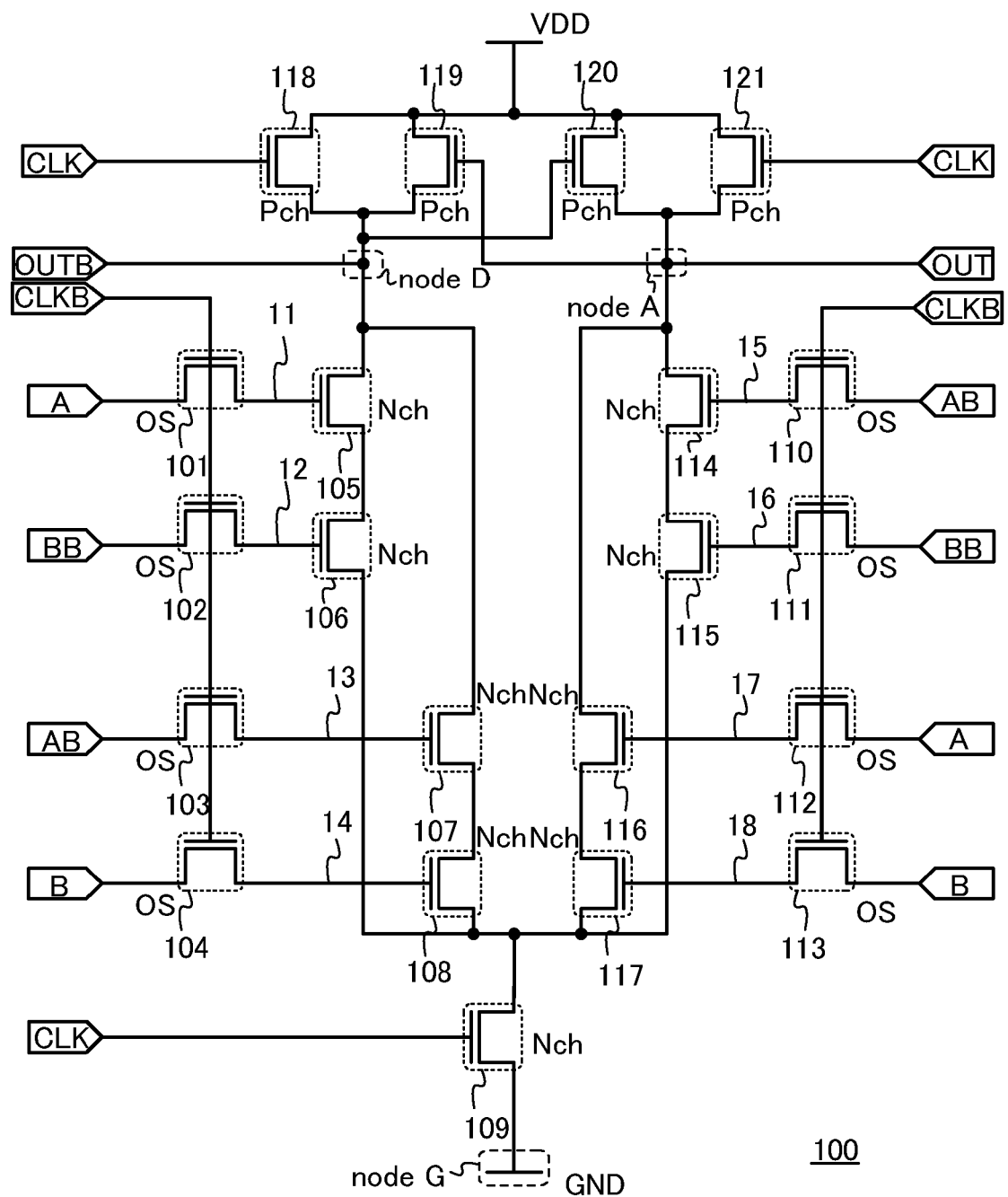
FIG. 1 illustrates an XOR circuit.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

A logic circuit of one embodiment of the present invention includes three portions, i.e., a comparing portion, a charge retaining portion, and a potential determining portion. In the charge retaining portion, two transistors which are electrically connected in series are regarded as one pair, and four pairs are provided. Two pairs of the four pairs are electrically connected in parallel to each other, and the other two pairs are electrically connected in parallel to each other. Regions which include the two pairs connected to a node outputting an output signal are referred to as a region 52 and a region 53. Regions which include the two pairs connected to a node outputting a signal having a phase opposite to that of the output signal are referred to as a region 50 and a region 51.

In the logic circuit described below, four input terminals, the region 50, and the region 51 on the left side of the drawing, and four input terminals, the region 52, and the region 53 on the right side of the drawing are provided symmetrically. The potentials of gates of the eight transistors included in the region 50, the region 51, the region 52, and the region 53 are determined by the respective eight input terminals. Given logic circuits which can be achieved by controlling input signals which are input to the input terminals and combining the input terminals are described with reference to FIG. 1, FIGS. 2A to 2C, FIG. 3, FIG. 4, FIG. 5, FIG. 6, FIG. 7, FIG. 8, FIG. 9, FIG. 10, FIG. 11, FIG. 12, FIG. 13, FIG. 14, and FIG. 15.

<XOR Circuit>

An XOR circuit which has a data retention function and whose power consumption is reduced is described below with reference to FIG. 1, FIGS. 2A to 2C, FIG. 3, FIG. 4, FIG. 5, FIG. 6, FIG. 7, and FIG. 8.

<Structure of XOR Circuit 100>

FIG. 1 is a circuit diagram of an XOR circuit of this embodiment. An XOR circuit 100 illustrated in FIG. 1 includes a 1st transistor 101, a 2nd transistor 102, a 3rd transistor 103, a 4th transistor 104, a 5th transistor 105, a 6th transistor 106, a 7th transistor 107, an 8th transistor 108, a 9th transistor 109, a 10th transistor 110, an 11th transistor 111, a 12th transistor 112, a 13th transistor 113, a 14th transistor 114, a 15th transistor 115, a 16th transistor 116, a 17th transistor 117, an 18th transistor 118, a 19th transistor 119, a 20th transistor 120, and a 21st transistor 121.

N-channel transistors are used as the following nine transistors: the 5th transistor 105, the 6th transistor 106, the 7th transistor 107, the 8th transistor 108, the 9th transistor 109, the 14th transistor 114, the 15th transistor 115, the 16th transistor 116, and the 17th transistor 117. P-channel transistors are used as the following four transistors: the 18th transistor 118, the 19th transistor 119, the 20th transistor 120, and the 21st transistor 121.

Transistors in which channels are formed in oxide semiconductor layers are used as the following eight transistors: the 1st transistor 101, the 2nd transistor 102, the 3rd transistor 103, the 4th transistor 104, the 10th transistor 110, the 11th transistor 111, the 12th transistor 112, and the 13th transistor 113. The transistor including an oxide semiconductor has an advantage of extremely small leakage current (also referred to as off-state current). Note that the transistor including an oxide semiconductor is an n-channel transistor.

For example, an advantage which is obtained because of the extremely small leakage current of the transistor is that a data retention function per unit area is improved in the logic circuit. In general, data retention time is proportional to leakage current. For example, in the case where the leakage current is $1.0 \times 10^{-24}$ A, the data retention time is 10 years, and in the case where the leakage current is $1.0 \times 10^{-21}$ A, the data retention time is three days to four days. When leakage current is changed by one digit, the data retention time is largely changed, which has great influence on the whole logic circuit.

It is preferable that optimal transistors be selected in accordance with needed characteristics.

In the case of an n-channel transistor including an oxide semiconductor, the leakage current can be less than or equal to 100 yA/μm ($1.0 \times 10^{-22}$ A), preferably less than or equal to 10 yA/μm ($1.0 \times 10^{-23}$ A), more preferably less than or equal to 1 yA/μm ($1.0 \times 10^{-24}$ A). Note that the absolute value of a drain voltage is preferably equal to that of a gate voltage at the time of measurement. The leakage current of the transistor including an oxide semiconductor is kept extremely small even when the gate voltage becomes less than or equal to −3 V. On the other hand, in the case of an n-channel transistor including a silicon semiconductor, the leakage current is approximately 10 pA/μm ($1.0 \times 10^{-11}$ A), and when the gate voltage becomes less than or equal to −3 V, the leakage current is rapidly increased. Further, the leakage current also depends on the temperature of the transistor at the time of measurement. As the temperature becomes higher, the leakage current becomes larger.

Transistors in which channels are formed in silicon layers are used as the following 13 transistors: the 5th transistor 105, the 6th transistor 106, the 7th transistor 107, the 8th transistor 108, the 9th transistor 109, the 14th transistor 114, the 15th transistor 115, the 16th transistor 116, the 17th transistor 117, the 18th transistor 118, the 19th transistor 119, the 20th transistor 120, and the 21st transistor 121. The silicon layers may be each a single crystal silicon layer, a microcrystalline silicon layer, or an amorphous silicon layer.

Note that all or some of the nine transistors that are the 5th transistor 105, the 6th transistor 106, the 7th transistor 107, the 8th transistor 108, the 9th transistor 109, the 14th transistor 114, the 15th transistor 115, the 16th transistor 116, and the 17th transistor 117 may be replaced with transistors including an oxide semiconductor. However, a transistor including an oxide semiconductor has a slower operation speed than a transistor including a silicon semiconductor while having extremely small off-state current. Therefore, it is necessary that these transistors be replaced with transistors including an oxide semiconductor in consideration of influence on the operation speed of the XOR circuit 100.

An input signal A of two signals which are input to the XOR circuit 100 is input to one of a source and a drain of the 1st transistor 101 and one of a source and a drain of the 12th transistor 112. An input signal B is input to one of a source and a drain of the 4th transistor 104 and one of a source and a drain of the 13th transistor 113. A signal AB which has a phase opposite to that of the input signal A is input to one of a source and a drain of the 3rd transistor 103 and one of a source and a drain of the 10th transistor 110. A signal BB which has a phase opposite to that of the input signal B is input to one of a source and a drain of the 2nd transistor 102 and one of a source and a drain of the 11th transistor 111.

A signal CLKB which has a phase opposite to that of a clock signal CLK is input to a gate of the 1st transistor 101. The gate of the 1st transistor 101, a gate of the 2nd transistor 102, a gate of the 3rd transistor 103, and a gate of the 4th transistor 104 are electrically connected to each other.

The other of the source and the drain of the 1st transistor 101 and a gate of the 5th transistor 105 are electrically connected to each other. A connection portion of the other of the source and the drain of the 1st transistor 101 and the gate of the 5th transistor 105 is referred to as a node 11. The other of the source and the drain of the 2nd transistor 102 and a gate of the 6th transistor 106 are electrically connected to each other. A connection portion of the other of the source and the drain of the 2nd transistor 102 and the gate of the 6th transistor 106 is referred to as a node 12. The other of the source and the drain of the 3rd transistor 103 and a gate of the 7th transistor 107 are electrically connected to each other. A connection portion of the other of the source and the drain of the 3rd transistor 103 and the gate of the 7th transistor 107 is referred to as a node 13. The other of the source and the drain of the 4th transistor 104 and a gate of the 8th transistor 108 are electrically connected to each other. A connection portion of the other of the source and the drain of the 4th transistor 104 and the gate of the 8th transistor 108 is referred to as a node 14.

The signal CLKB having the phase opposite to that of the clock signal CLK is input to a gate of the 10th transistor 110. The gate of the 10th transistor 110, a gate of the 11th transistor 111, a gate of the 12th transistor 112, and a gate of the 13th transistor 113 are electrically connected to each other.

The other of the source and the drain of the 10th transistor 110 and a gate of the 14th transistor 114 are electrically connected to each other. A connection portion of the other of the source and the drain of the 10th transistor 110 and the gate of the 14th transistor 114 is referred to as a node 15. The other of the source and the drain of the 11th transistor 111 and a gate of the 15th transistor 115 are electrically connected to each other. A connection portion of the other of the source and the drain of the 11th transistor 111 and the gate of the 15th transistor 115 is referred to as a node 16. The other of the source and the drain of the 12th transistor 112 and a gate of the 16th transistor 116 are electrically connected to each other. A connection portion of the other of the source and the drain of the 12th transistor 112 and the gate of the 16th transistor 116 is referred to as a node 17. The other of the source and the drain of the 13th transistor 113 and a gate of the 17th transistor 117 are electrically connected to each other. A connection portion of the other of the source and the drain of the 13th transistor 113 and the gate of the 17th transistor 117 is referred to as a node 18.

One of a source and a drain of the 18th transistor 118, one of a source and a drain of the 19th transistor 119, one of a source and a drain of the 20th transistor 120, and one of a source and a drain of the 21st transistor 121 are electrically connected to each other and supplied with a power supply potential VDD. The clock signal CLK is input to a gate of the 18th transistor 118. The clock signal CLK is input to a gate of the 21st transistor 121.

The other of the source and the drain of the 18th transistor 118, the other of the source and the drain of the 19th transistor 119, a gate of the 20th transistor 120, one of a source and a drain of the 5th transistor 105, and one of a source and a drain of the 7th transistor 107 are electrically connected to each other. Note that a connection portion of other of the source and the drain of the 18th transistor 118, the other of the source and the drain of the 19th transistor 119, the gate of the 20th transistor 120, the one of the source and the drain of the 5th transistor 105, and the one of the source and the drain of the 7th transistor 107 is referred to as a node D.

The other of the source and the drain of the 20th transistor 120, the other of the source and the drain of the 21st transistor 121, a gate of the 19th transistor 119, one of a source and a drain of the 14th transistor 114, and one of a source and a drain of the 16th transistor 116 are electrically connected to each other. Note that a connection portion of the other of the source and the drain of the 20th transistor 120, the other of the source and the drain of the 21st transistor 121, the gate of the 19th transistor 119, the one of the source and the drain of the 14th transistor 114, and the one of the source and the drain of the 16th transistor 116 is referred to as a node A.

The other of the source and the drain of the 5th transistor 105 and one of a source and a drain of the 6th transistor 106 are electrically connected to each other. The other of the source and the drain of the 14th transistor 114 and one of a source and a drain of the 15th transistor 115 are electrically connected to each other. The other of the source and the drain of the 7th transistor 107 and one of a source and a drain of the 8th transistor 108 are electrically connected to each other. The other of the source and the drain of the 16th transistor 116 and one of a source and a drain of the 17th transistor 117 are electrically connected to each other.

The other of the source and the drain of the 6th transistor 106, the other of the source and the drain of the 8th transistor 108, the other of the source and the drain of the 15th transistor 115, the other of the source and the drain of the 17th transistor 117, and one of a source and a drain of the 9th transistor 109 are electrically connected to each other.

The clock signal CLK is input to a gate of the 9th transistor 109, and the other of the source and the drain of the 9th transistor 109 is electrically connected to a reference potential GND terminal. Note that a connection portion of the other of the source and the drain of the 9th transistor 109 and the reference potential GND terminal is referred to as a node G.

The potential of the node A is output as an output signal OUT of the XOR circuit 100. The potential of the node D is output as a signal OUTB which has a phase opposite to that of the output signal OUT of the XOR circuit 100.

In the XOR circuit 100 of this embodiment, when the gates of the transistors including an oxide semiconductor are closed, there is only one path of leakage current, which goes from a power supply potential VDD terminal to the reference potential GND terminal; therefore, the power consumption of the XOR circuit 100 can be reduced.

Figure 2A:
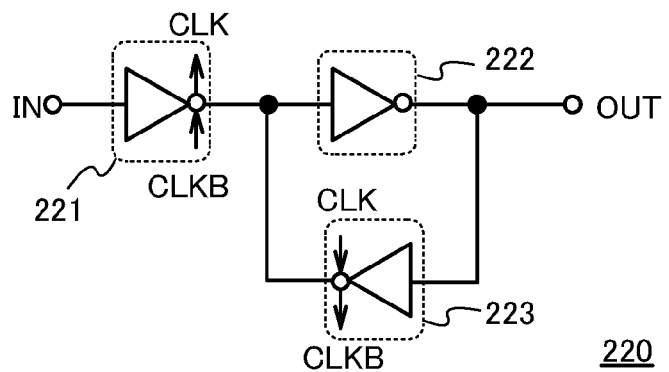
FIGS. 2A to 2C are circuit diagrams of a latch circuit, an inverter, and a clocked inverter.
Figure 2B:
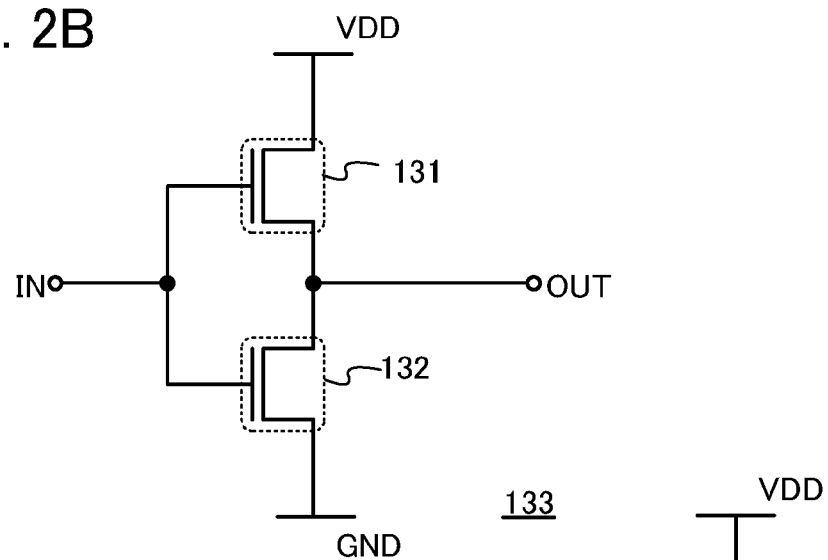
Figure 2C:
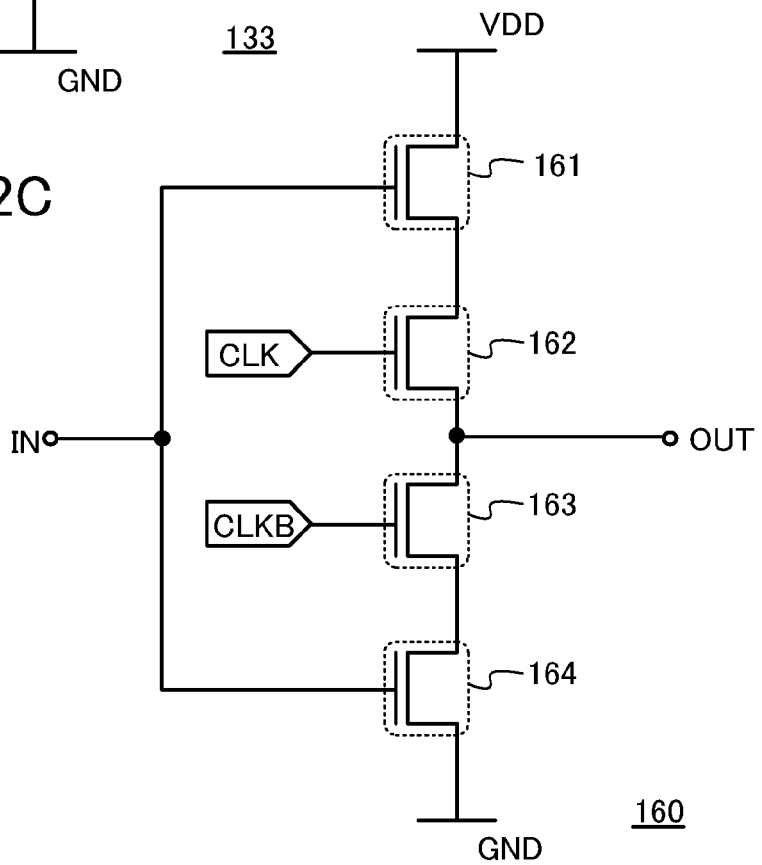

FIGS. 2A to 2C illustrate a conventional latch circuit as a comparative example. A latch circuit 220 illustrated in FIG. 2A includes a clocked inverter 221, an inverter 222, and a clocked inverter 223.

An input terminal of the clocked inverter 221 functions as an input terminal IN of the latch circuit 220.

An output terminal of the clocked inverter 221 is electrically connected to an input terminal of the inverter 222 and an output terminal of the clocked inverter 223. An input terminal of the clocked inverter 223 is electrically connected to an output terminal of the inverter 222 and functions as an output terminal OUT of the latch circuit 220.

FIG. 2B illustrates a circuit configuration applicable to the inverter 222.

An inverter 133 illustrated in FIG. 2B includes a transistor 131 that is a p-channel transistor and a transistor 132 that is an n-channel transistor.

A gate of the transistor 131 is electrically connected to a gate of the transistor 132 in the inverter 133, and functions as an input terminal IN of the inverter 133. One of a source and a drain of the transistor 131 is supplied with a power supply potential VDD. The other of the source and the drain of the transistor 131 is electrically connected to one of a source and a drain of the transistor 132 and functions as an output terminal OUT of the inverter 133.

The other of the source and the drain of the transistor 132 is electrically connected to a reference potential GND terminal.

FIG. 2C illustrates a circuit configuration applicable to each of the clocked inverter 221 and the clocked inverter 223.

A clocked inverter 160 illustrated in FIG. 2C includes a transistor 161 that is a p-channel transistor, a transistor 162 that is a p-channel transistor, a transistor 163 that is an n-channel transistor, and a transistor 164 that is an n-channel transistor.

A gate of the transistor 161 is electrically connected to a gate of the transistor 164 and functions as an input terminal IN of the clocked inverter 160. One of a source and a drain of the transistor 161 is supplied with the power supply potential VDD. The other of the source and the drain of the transistor 161 is electrically connected to one of a source and a drain of the transistor 162.

A clock signal CLK is input to a gate of the transistor 162. The other of the source and the drain of the transistor 162 is electrically connected to one of a source and a drain of the transistor 163, and functions as an output terminal OUT of the clocked inverter 160.

A signal CLKB which has a phase opposite to that of the clock signal CLK is input to a gate of the transistor 163. The other of the source and the drain of the transistor 163 is electrically connected to one of a source and a drain of the transistor 164.

The other of the source and the drain of the transistor 164 is electrically connected to the reference potential GND terminal.

Figure 3:
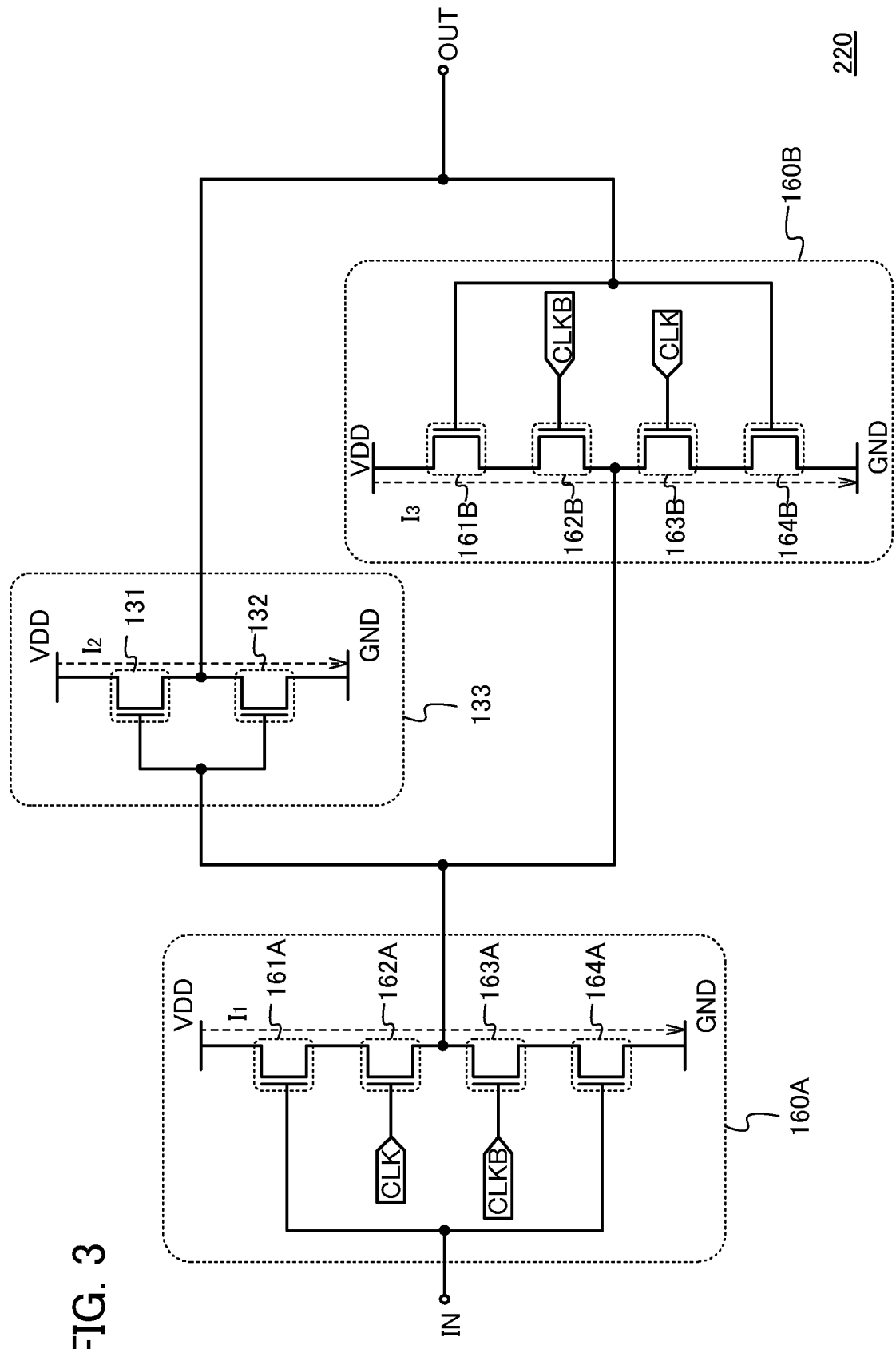
FIG. 3 is a circuit diagram of a latch circuit.

FIG. 3 illustrates a specific circuit configuration of the latch circuit 220 including the inverter 133, a clocked inverter 160A, and a clocked inverter 160B. Note that the clocked inverter 160A and the clocked inverter 160B are each similar to the clocked inverter 160. Further, transistors in the clocked inverter 160A and transistors in the clocked inverter 160B are similar to those in the clocked inverter 160 and additionally denoted by "A" and "B", respectively in FIG. 3.

As illustrated in FIG. 3, there are three paths of leakage current which go from the power supply potential VDD terminal to the reference potential GND terminal (paths $I_1$ to $I_3$) in the latch circuit 220. Accordingly, the power consumption of the latch circuit 220 might be increased.

As described above, the XOR circuit 100 has the one path of leakage current, which goes from the power supply potential VDD terminal to the reference potential GND terminal. Therefore, the power consumption of the XOR circuit 100 can be reduced.

The XOR circuit 100 can be formed using the 8 transistors including an oxide semiconductor and the 13 transistors including a silicon semiconductor.

As described above, the leakage current of the transistor including an oxide semiconductor is extremely small. Therefore, even when supply of the power supply potential VDD to the XOR circuit 100 is stopped, charge accumulated between the gate of the 5th transistor 105 and the other of the source and the drain of the 1st transistor 101 that is the transistor including an oxide semiconductor is retained, for example. Accordingly, in response to restart of the supply of the power supply potential VDD, the XOR circuit 100 which is in the state before the stop of the supply of the power supply potential VDD can start its operation.

In this manner, the XOR circuit 100 does not lose data even when the supply of the power supply potential VDD is stopped. In other words, the XOR circuit 100 is a nonvolatile memory circuit. Since data is not lost even when the supply of the power supply potential VDD is stopped, it is possible to stop the supply of the power supply potential VDD when the gates of the transistors including an oxide semiconductor are closed in the XOR circuit 100. Therefore, the power consumption of the nonvolatile XOR circuit 100 can be reduced.

Further, in the XOR circuit 100, the transistor including an oxide semiconductor and the transistor including a silicon semiconductor can be stacked (which is described later). Therefore, it is possible to reduce the area of the XOR circuit 100.

<Operation of XOR Circuit 100>

Figure 4:
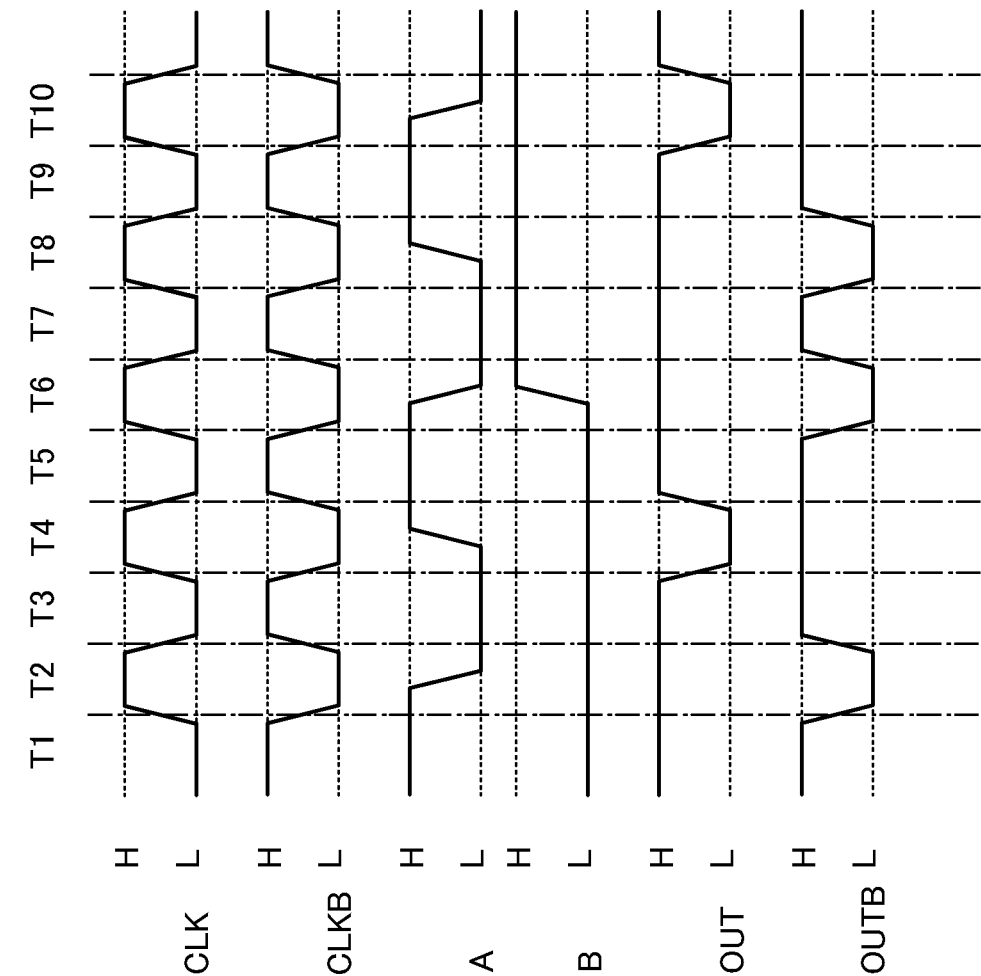
FIG. 4 is a timing chart of an XOR circuit.
Figure 5:
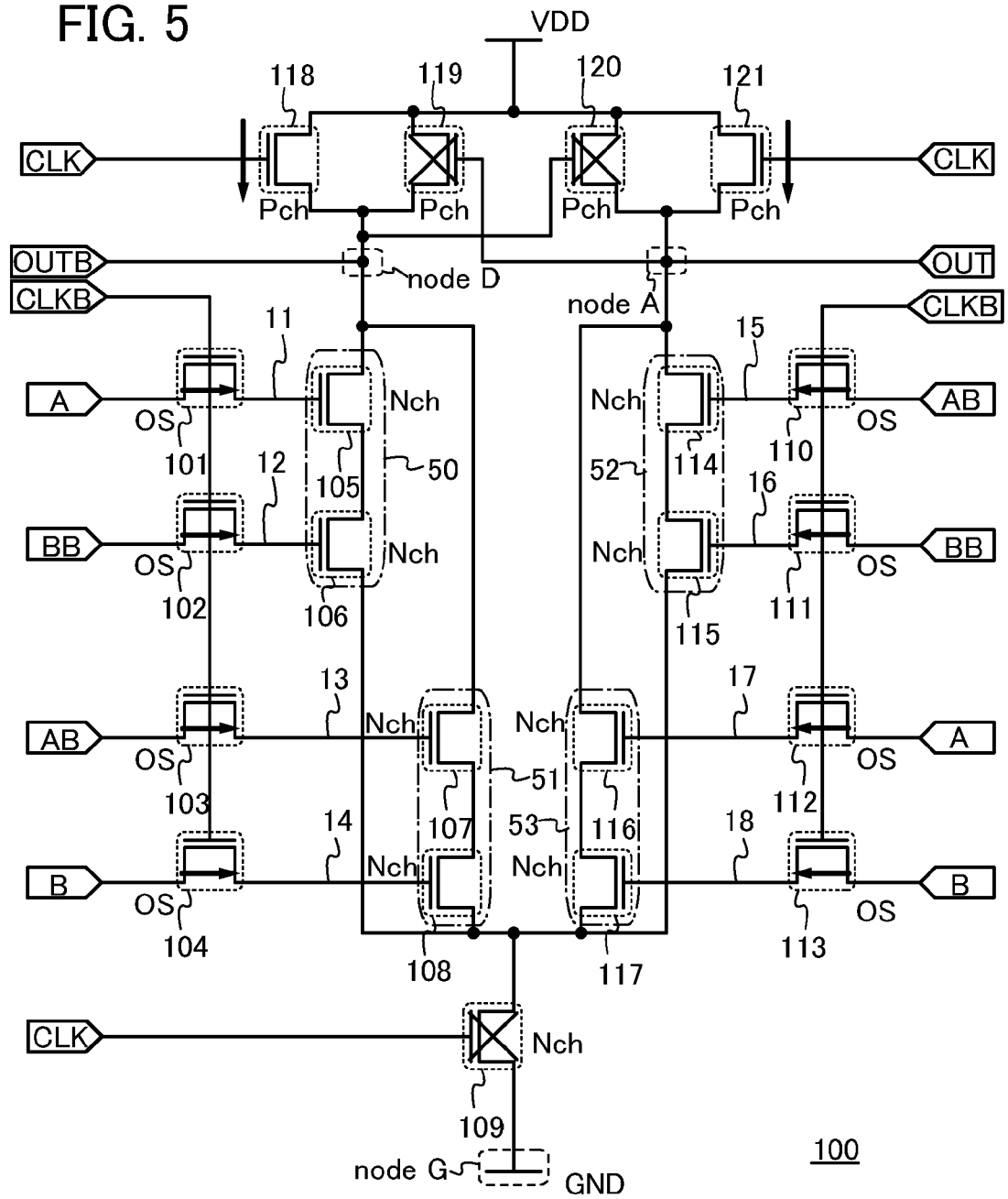
FIG. 5 shows operation of an XOR circuit.
Figure 6:
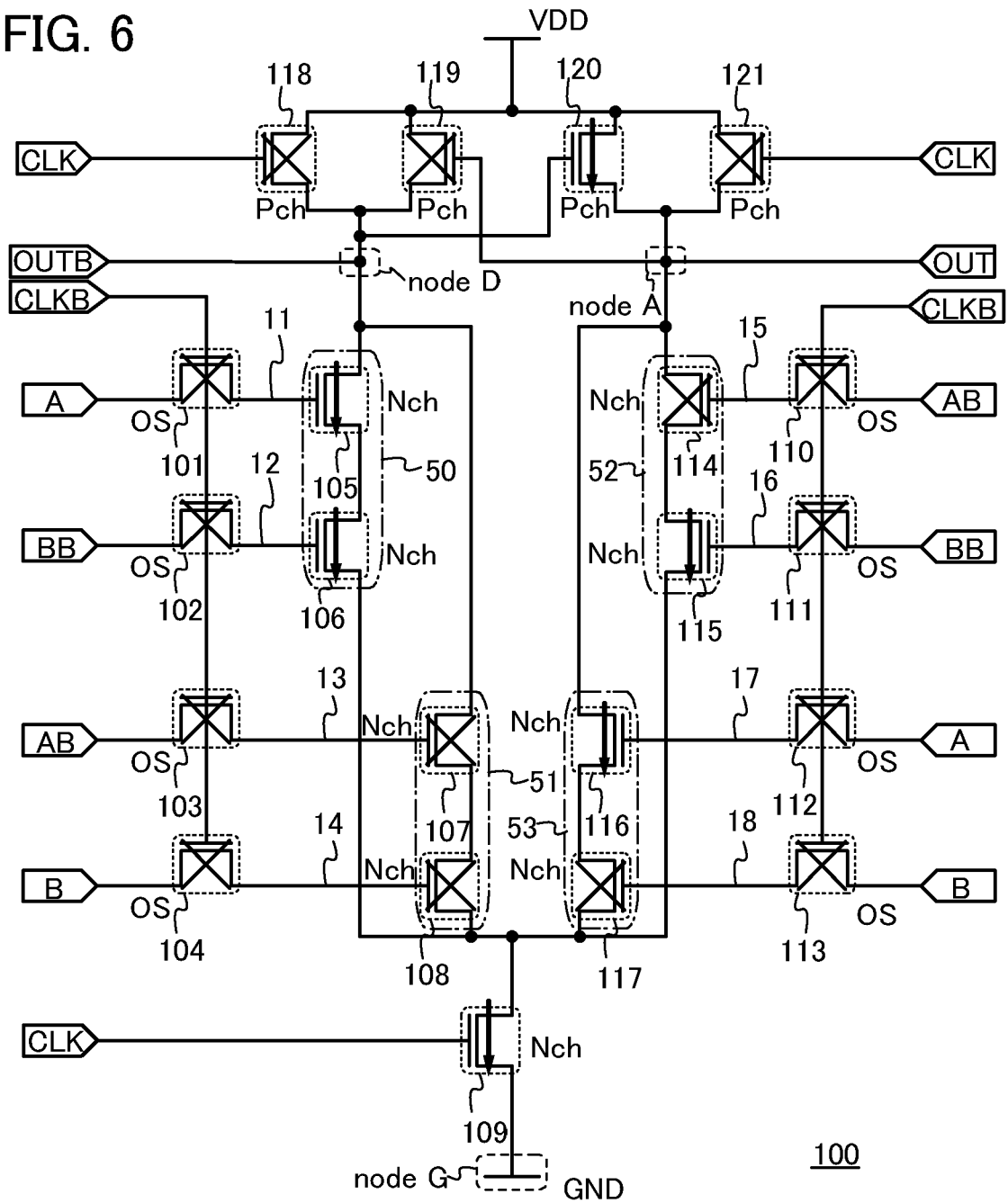
FIG. 6 shows operation of an XOR circuit.
Figure 7:
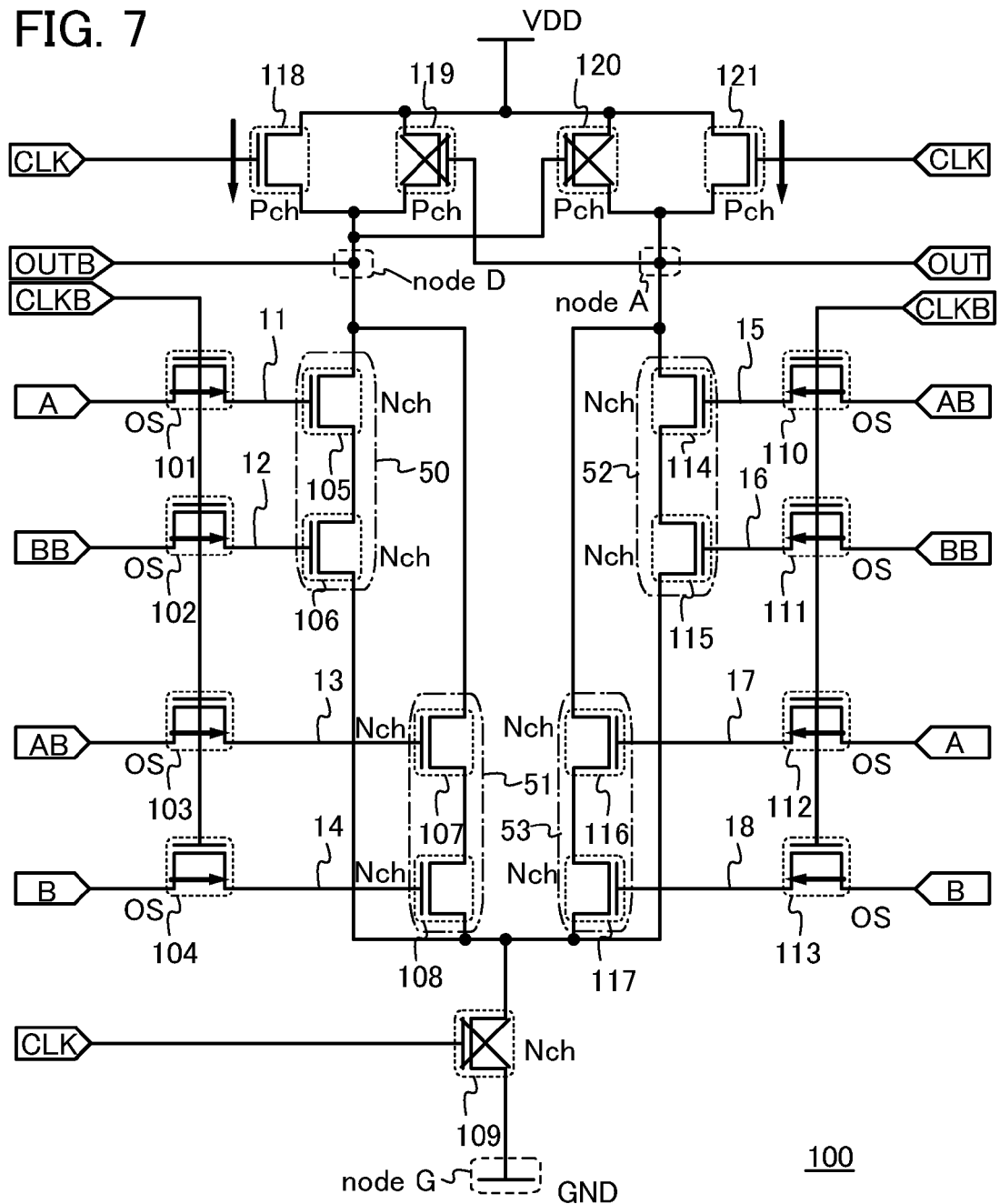
FIG. 7 shows operation of an XOR circuit.
Figure 8:
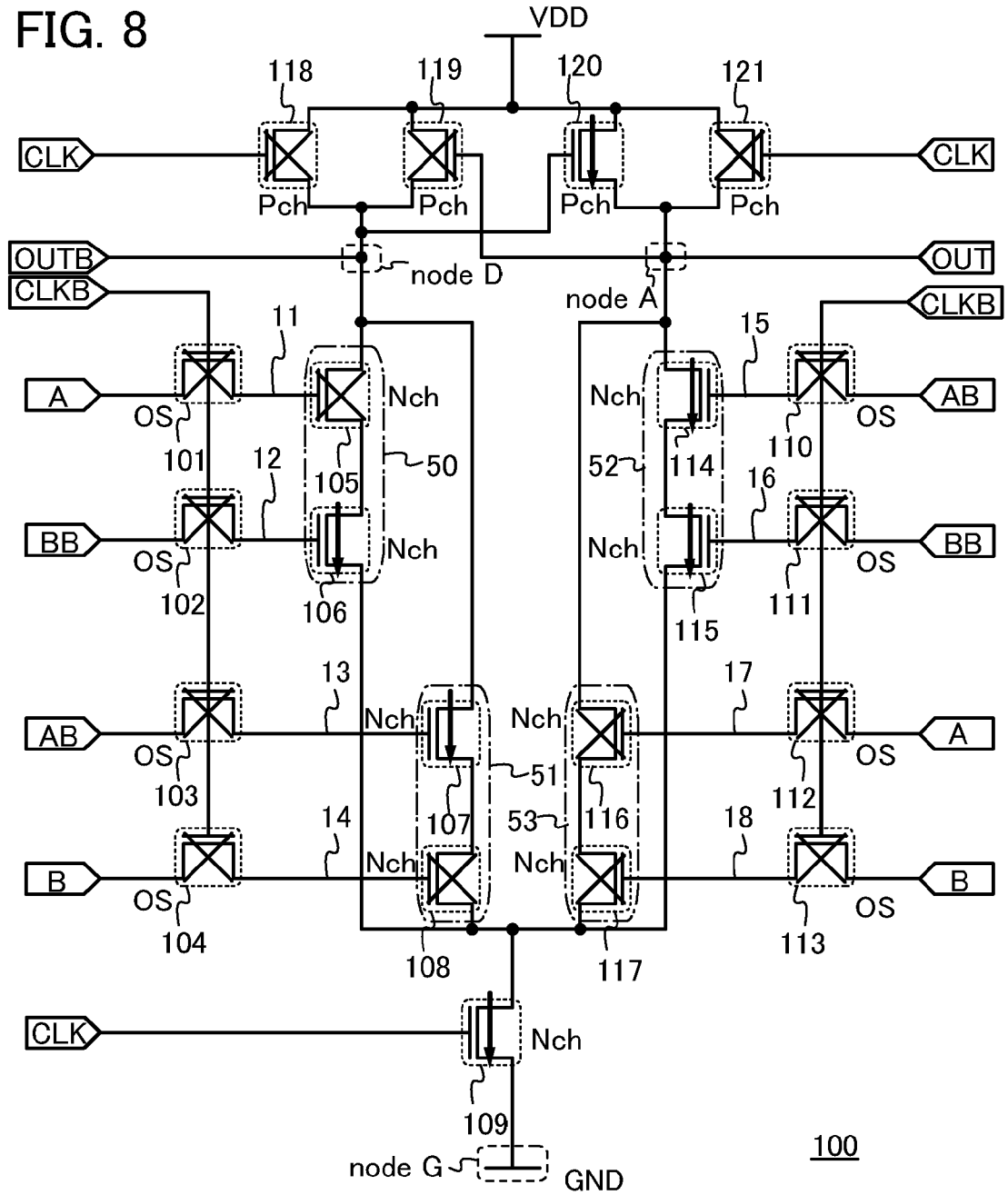
FIG. 8 shows operation of an XOR circuit.

The operation of the XOR circuit 100 of this embodiment is described with reference to FIG. 4, FIG. 5, FIG. 6, FIG. 7, and FIG. 8. FIG. 4 shows a timing chart of the XOR circuit 100. In the timing chart in FIG. 4, a period is divided into a period T1, a period T2, a period T3, a period T4, a period T5, a period T6, a period T7, a period T8, a period T9, and a period T10. FIG. 5, FIG. 6, FIG. 7, and FIG. 8 show operation states of the XOR circuit 100 in the period T1, the period T2, the period T3, and the period T4, respectively.

The XOR circuit 100 is a clock synchronization circuit and functions as an XOR circuit when the same clock signal CLK is input to the 9th transistor 109, the 18th transistor 118, and the 21st transistor 121. Note that the output signal OUT is determined only in the period T2, the period T4, the period T6, the period T8, and the period T10, in which the 9th transistor 109 is on in synchronization with the clock signal CLK.

<Period T1 (see FIG. 5)>

First, as shown in the period T1 in FIG. 4, a case where the input signal A and the input signal B are set to H potential (VDD) and L potential (VSS), respectively, is given. Note that in this specification, H potential (VDD) refers to a high potential (power supply potential) and L potential (VSS) refers to a low potential (reference potential). At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus, the 1st transistor 101, the 2nd transistor 102, the 3rd transistor 103, and the 4th transistor 104 are turned on. Accordingly, the gate of the 5th transistor 105 (the node 11) is charged with the H potential (VDD) that is the same as that of the input signal A, the gate of the 6th transistor 106 (the node 12) is charged with the H potential (VDD) that is the same as that of the signal BB having the phase opposite to that of the input signal B, the gate of the 7th transistor 107 (the node 13) is charged with the L potential (VSS) that is the same as that of the signal AB having the phase opposite to that of the input signal A, and the gate of the 8th transistor 108 (the node 14) is charged with the L potential (VSS) that is the same as that of the input signal B.

Further, since the signal CLKB having the phase opposite to that of the clock signal CLK is set to the H potential (VDD), the 10th transistor 110, the 11th transistor 111, the 12th transistor 112, and the 13th transistor 113 are turned on. Accordingly, the gate of the 14th transistor 114 (the node 15) is charged with the L potential (VSS) that is the same as that of the signal AB having the phase opposite to that of the input signal A, the gate of the 15th transistor 115 (the node 16) is charged with the H potential (VDD) that is the same as that of the signal BB having the phase opposite to that of the input signal B, the gate of the 16th transistor 116 (the node 17) is charged with the H potential (VDD) that is the same as that of the input signal A, and the gate of the 17th transistor 117 (the node 18) is charged with the L potential (VSS) that is the same as that of the input signal B.

As described above, in the period T1, the node 11, the node 12, the node 13, the node 14, the node 15, the node 16, the node 17, and the node 18 are charged with the potentials corresponding to the input signal A and the potentials corresponding to the input signal B, and the node A and the node D are charged with the H potential (VDD).

<Period T2 (see FIG. 6)>

Next, as shown in the period T2 in FIG. 4, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the H potential (VDD) is accumulated in the node 11, when the 1st transistor 101 is off, the charge corresponding to the H potential (VDD) is retained in the node 11 (charge retention operation). Further, the 5th transistor 105 is turned on in response to the potential of the node 11. Since charge corresponding to the H potential (VDD) is accumulated in the node 12, when the 2nd transistor 102 is off, the charge corresponding to the H potential (VDD) is retained in the node 12 (charge retention operation). Further, the 6th transistor 106 is turned on in response to the potential of the node 12. Since charge corresponding to the L potential (VSS) is accumulated in the node 13, when the 3rd transistor 103 is off, the charge corresponding to the L potential (VSS) is retained in the node 13 (charge retention operation). Further, the 7th transistor 107 is turned off in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the L potential (VSS) is accumulated in the node 15, when the 10th transistor 110 is off, the charge corresponding to the L potential (VSS) is retained in the node 15 (charge retention operation). Further, the 14th transistor 114 is turned off in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the H potential (VDD) is accumulated in the node 17, when the 12th transistor 112 is off, the charge corresponding to the H potential (VDD) is retained in the node 17 (charge retention operation). Further, the 16th transistor 116 is turned on in response to the potential of in the node 17. Since charge corresponding to the L potential (VSS) is accumulated in the node 18, when the 13th transistor 113 is off, the charge corresponding to the L potential (VSS) is retained in the node 18 (charge retention operation). Further, the 17th transistor 117 is turned off in response to the potential of the node 18.

In the XOR circuit 100, the 5th transistor 105 and the 6th transistor 106 are electrically connected in series (the region 50), the 7th transistor 107 and the 8th transistor 108 are electrically connected in series (the region 51), and the two transistors connected in series (the region 50) are electrically connected in parallel to the two transistors connected in series (the region 51). The 14th transistor 114 and the 15th transistor 115 are electrically connected in series (the region 52), the 16th transistor 116 and the 17th transistor 117 are electrically connected in series (the region 53), and the two transistors connected in series (the region 52) are electrically connected in parallel to the two transistors connected in series (the region 53).

At this time, current flows in the region 50 but does not flow in the region 51, the region 52, and the region 53. Therefore, charge corresponding to the H potential (VDD) accumulated in the node D is extracted to a reference potential (GND) of the node G via the region 50 and the 9th transistor 109. In short, current flows from the node D to the node G.

Since current flows from the node D to the node G, the potential of the node D is gradually reduced from the H potential (VDD) to the L potential (VSS). As a result, the L potential (VSS) is applied to the gate of the 20th transistor 120, so that the 20th transistor 120 (p-channel) is turned on. At this time, the potential of the node A is determined, and the output signal OUT has the H potential (VDD).

The 19th transistor 119 and the 20th transistor 120 have functions of compensating the potentials of the node A and the node D. "Compensating the potentials of the node A and the node D" means that, for example, when the node D is set to the L potential (VSS), the 20th transistor 120 supplies the H potential (VDD) to the node A. For example, when the node A is set to the L potential (VSS), the 19th transistor 119 supplies the H potential (VDD) to the node D. That is, when one of the node A and the node D is set to the L potential (VSS), the H potential (VDD) is supplied to the other of the node A and the node D.

Note that the potential of the node A and the potential of the node D depend on the on state and the off state of the 9th transistor 109. In other words, the potential of the output signal OUT is determined only when the clock signal CLK is set to the H potential (VDD). Accordingly, the potential of the output signal OUT of the XOR circuit 100 is determined in the period T2, the period T4, the period T6, the period T8, and the period T10 in the timing chart of FIG. 4.

In this manner, in the period T2, the output signal OUT at the H potential (VDD) is determined in response to the input of the input signal A at the H potential (VDD) and the input of the input signal B at the L potential (VSS).

As described above, the 19th transistor 119 and the 20th transistor 120 each have a function of compensating a potential, and the 18th transistor 118 and the 21st transistor 121 each have a charging function. Accordingly, these four transistors have a function as a comparator which continuously compares the potential of the node A with the potential of the node D and supplies the H potential (VDD) to a node opposite to a node which is set to the L potential (VSS).

In addition, the 9th transistor 109 has a discharging function. The potential of the node A or the potential of the node D is extracted to the reference potential (GND) of the node G via the 9th transistor 109 which is on. As a result, only when the 9th transistor 109 is on (the clock signal CLK is set to the H potential (VDD)), the potential of the output signal OUT is determined. Therefore, the 9th transistor 109 also has a function of determining a definitive potential of the output signal OUT (a function of determining a potential).

<Period T3 (see FIG. 7)>

Next, as shown in the period T3 in FIG. 4, a case where the input signal A and the input signal B are set to the L potential (VSS) is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus, the 1st transistor 101, the 2nd transistor 102, the 3rd transistor 103, and the 4th transistor 104 are turned on. Accordingly, the gate of the 5th transistor 105 (the node 11) is charged with the L potential (VSS) that is the same as that of the input signal A, the gate of the 6th transistor 106 (the node 12) is charged with the H potential (VDD) that is the same as that of the signal BB having the phase opposite to that of the input signal B, the gate of the 7th transistor 107 (the node 13) is charged with the H potential (VDD) that is the same as that of the signal AB having the phase opposite to that of the input signal A, and the gate of the 8th transistor 108 (the node 14) is charged with the L potential (VSS) that is the same as that of the input signal B.

Further, since the signal CLKB having the phase opposite to that of the clock signal CLK is set to the H potential (VDD), the 10th transistor 110, the 11th transistor 111, the 12th transistor 112, and the 13th transistor 113 are turned on. Accordingly, the gate of the 14th transistor 114 (the node 15) is charged with the H potential (VDD) that is the same as that of the signal AB having the phase opposite to that of the input signal A, the gate of the 15th transistor 115 (the node 16) is charged with the H potential (VDD) that is the same as that of the signal BB having the phase opposite to that of the input signal B, the gate of the 16th transistor 116 (the node 17) is charged with the L potential (VSS) that is the same as that of the input signal A, and the gate of the 17th transistor 117 (the node 18) is charged with the L potential (VSS) that is the same as that of the input signal B.

As described above, in the period T3, the node 11, the node 12, the node 13, the node 14, the node 15, the node 16, the node 17, and the node 18 are charged with the potentials corresponding to the input signal A and the potentials corresponding to the input signal B, and the node A and the node D are charged with the H potential (VDD).

<Period T4 (see FIG. 8)>

Next, as shown in the period T4 in FIG. 4, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the L potential (VSS) is accumulated in the node 11, when the 1st transistor 101 is off, the charge corresponding to the L potential (VSS) is retained in the node 11 (charge retention operation). Further, the 5th transistor 105 is turned off in response to the potential of the node 11. Since charge corresponding to the H potential (VDD) is accumulated in the node 12, when the 2nd transistor 102 is off, the charge corresponding to the H potential (VDD) is retained in the node 12 (charge retention operation). Further, the 6th transistor 106 is turned on in response to the potential of the node 12. Since charge corresponding to the H potential (VDD) is accumulated in the node 13, when the 3rd transistor 103 is off, the charge corresponding to the H potential (VDD) is retained in the node 13 (charge retention operation). Further, the 7th transistor 107 is turned on in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112 (n-channel), and the 13th transistor 113 (n-channel) are turned off. Since charge corresponding to the H potential (VDD) is accumulated in the node 15, when the 10th transistor 110 is off, the charge corresponding to the H potential (VDD) is retained in the node 15 (charge retention operation). Further, the 14th transistor 114 is turned on in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the L potential (VSS) is accumulated in the node 17, when the 12th transistor 112 is off, the charge corresponding to the L potential (VSS) is retained in the node 17 (charge retention operation). Further, the 16th transistor 116 is turned off in response to the potential of the node 17. Since charge corresponding to the L potential (VSS) is accumulated in the node 18, when the 13th transistor 113 is off, the charge corresponding to the L potential (VSS) is retained in the node 18 (charge retention operation). Further, the 17th transistor 117 is turned off in response to the potential of the node 18.

At this time, current flows in the region 52 but does not flow in the region 50, the region 51, and the region 53. Therefore, the H potential (VDD) accumulated in the node A is extracted to the reference potential (GND) of the node G via the region 52 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 20th transistor 120 (p-channel) is turned on. At this time, the potential of the node A is determined, and the output signal OUT has the L potential (VSS).

In this manner, in the period T4, the output signal OUT at the L potential (VSS) is determined in response to the input of the input signal A at the L potential (VSS) and the input of the input signal B at the L potential (VSS).

Therefore, when the L potential (VSS) is input as the input signal A (input signal B) and the H potential (VDD) is input as the input signal B (input signal A), a current path which goes through the region 50 (or the region 51) and the 9th transistor 109 is formed, so that a current path which goes from the node D to the node G is formed. In addition, when the H potential (VDD) (the L potential (VSS)) is input as the input signal A and the input signal B, a current path which goes through the region 52 (or the region 53) and the 9th transistor 109 is formed, so that a current path which goes from the node A to the node G is formed.

In other words, when different potentials are input as the input signal A and the input signal B, the node A is always set to the H potential (VDD) and the output signal OUT is always set to the H potential (VDD). On the other hand, when the same potential is input as the input signal A and the input signal B, the node A is always set to the L potential (VSS) and the output signal OUT is always set to the L potential (VSS). The XOR circuit is configured to operate in this manner.

Accordingly, the input signal A and the input signal B which are input to the eight input terminals are controlled utilizing the symmetry of the charge retaining portion, whereby the XOR circuit whose output signal is changed depending on whether the input signal A is equal to the input signal B can be obtained.

Operations in the period T5 and the period T6 are similar to those in the period T1 and the period T2. Operations in the period T7 and the period T8 correspond to the operations in the period T1 and the period T2 in the case where the L potential (VSS) and the H potential (VDD) are input as the input signal A and the input signal B, respectively. Operations in the period T9 and the period T10 correspond to the operations in the period T3 and the period T4 in the case where the H potential (VDD) is input as the input signal A and the input signal B.

According to this embodiment, increase in the number of paths of leakage current in the XOR circuit can be suppressed. Accordingly, the power consumption of the XOR circuit can be reduced.

According to this embodiment, the XOR circuit can retain data even when power supply is stopped.

According to this embodiment, it is possible to stack the transistor including an oxide semiconductor and the transistor including a silicon semiconductor in the XOR circuit; therefore, the area of the circuit can be reduced.

<MUX Circuit>

A MUX circuit which has a data retention function and whose power consumption is reduced is described with reference to FIG. 9, FIG. 10, FIG. 11, FIG. 12, FIG. 13, FIG. 14, and FIG. 15.

<Structure of MUX Circuit 200>

Figure 9:
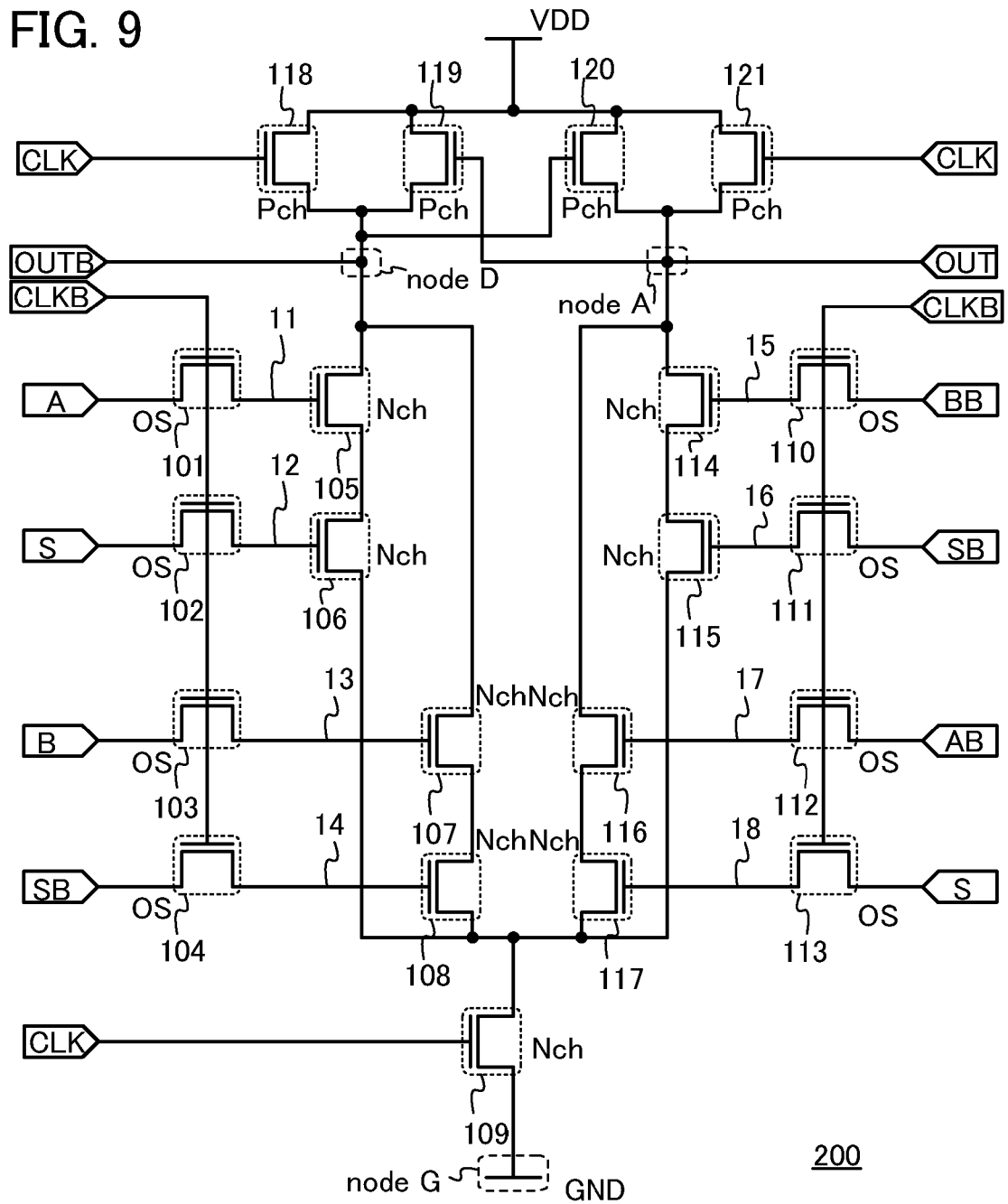
FIG. 9 illustrates a MUX circuit.

FIG. 9 is a circuit diagram of a MUX circuit of this embodiment. A MUX circuit 200 in FIG. 9 has a structure similar to that of the XOR circuit 100 in FIG. 1, in which the signal BB that has the phase opposite to that of the input signal B and is input to the one of the source and the drain of the 2nd transistor 102 is replaced with an input signal S, the signal AB that has the phase opposite to that of the input signal A and is input to the one of the source and the drain of the 3rd transistor 103 is replaced with the input signal B, the input signal B which is input to the one of the source and the drain of the 4th transistor 104 is replaced with a signal SB which has a phase opposite to that of the input signal S, the signal AB that has the phase opposite to that of the input signal A and is input to the one of the source and the drain of the 10th transistor 110 is replaced with the signal BB having the phase opposite to that of the input signal B, the signal BB that has the phase opposite to that of the input signal B and is input to the one of the source and the drain of the 11th transistor 111 is replaced with the signal SB having the phase opposite to that of the input signal S, the input signal A which is input to the one of the source and the drain of the 12th transistor 112 is replaced with the signal AB having the phase opposite to that of the input signal A, and the input signal B which is input to the one of the source and the drain of the 13th transistor 113 is replaced with the input signal S. Note that the signal input to the one of the source and the drain of the 1st transistor 101 is the same as that in the XOR circuit 100 in FIG. 1.

Note that when the input signal A is selected, the H potential (VDD) is input as the input signal S, whereas when the input signal B is selected, the L potential (VSS) is input as the input signal S.

In the MUX circuit 200 of this embodiment, when the gates of the transistors including an oxide semiconductor are closed, there is only one path of leakage current, which goes from the power supply potential VDD terminal to the reference potential GND terminal; therefore, the power consumption of the MUX circuit 200 can be reduced.

The MUX circuit 200 does not lose data even when the supply of the power supply potential VDD is stopped. In other words, the MUX circuit 200 is a nonvolatile memory circuit. Since data is not lost even when the supply of the power supply potential VDD is stopped, it is possible to stop the supply of the power supply potential VDD when the gates of the transistors including an oxide semiconductor are closed in the MUX circuit 200. Therefore, the power consumption of the nonvolatile MUX circuit 200 can be reduced.

Further, in the MUX circuit 200, the transistor including an oxide semiconductor and the transistor including a silicon semiconductor can be stacked (which is described later). Therefore, it is possible to reduce the area of the MUX circuit 200.

<Operation of MUX Circuit 200>

Figure 10:
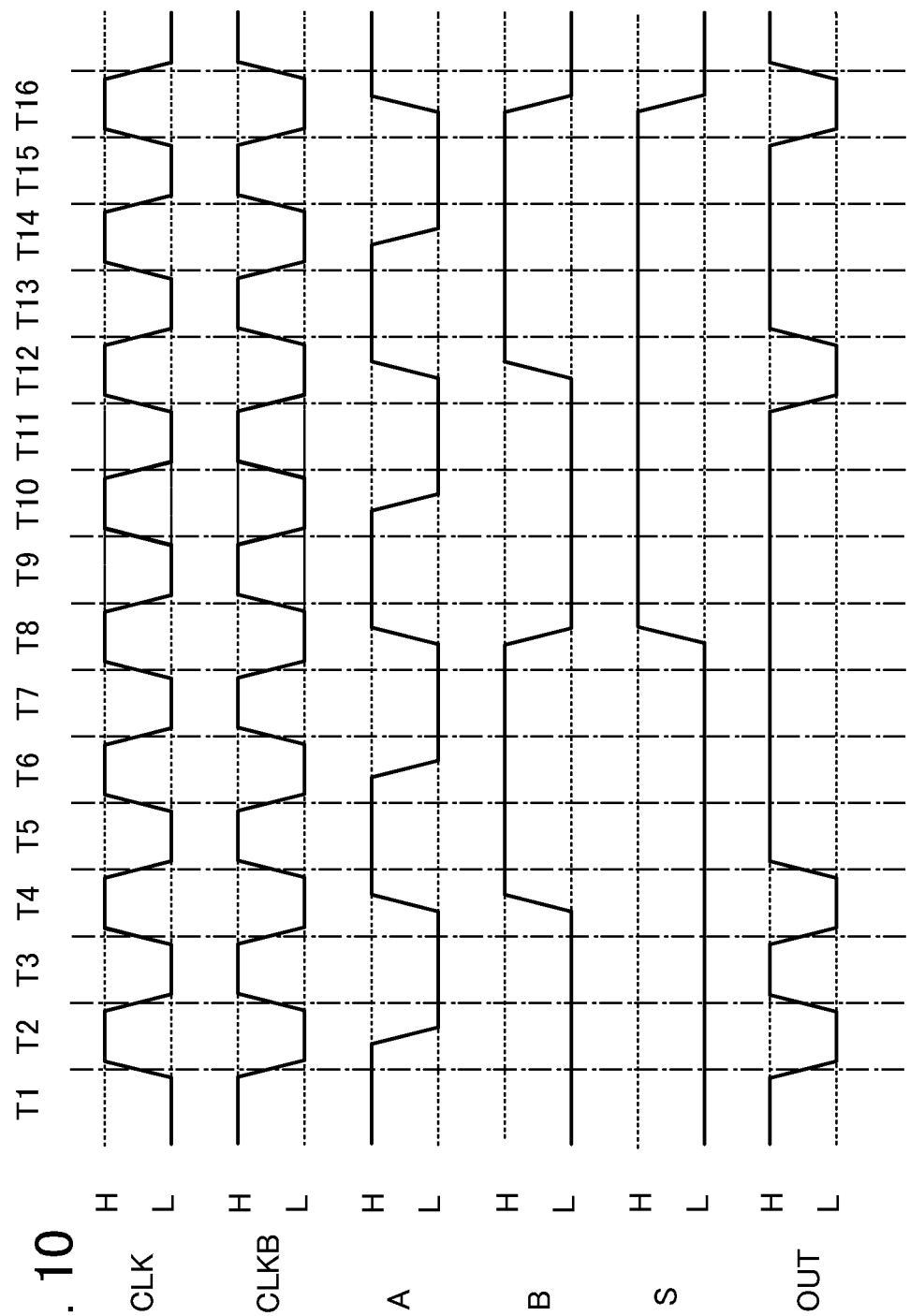
FIG. 10 is a timing chart of a MUX circuit.
Figure 11:
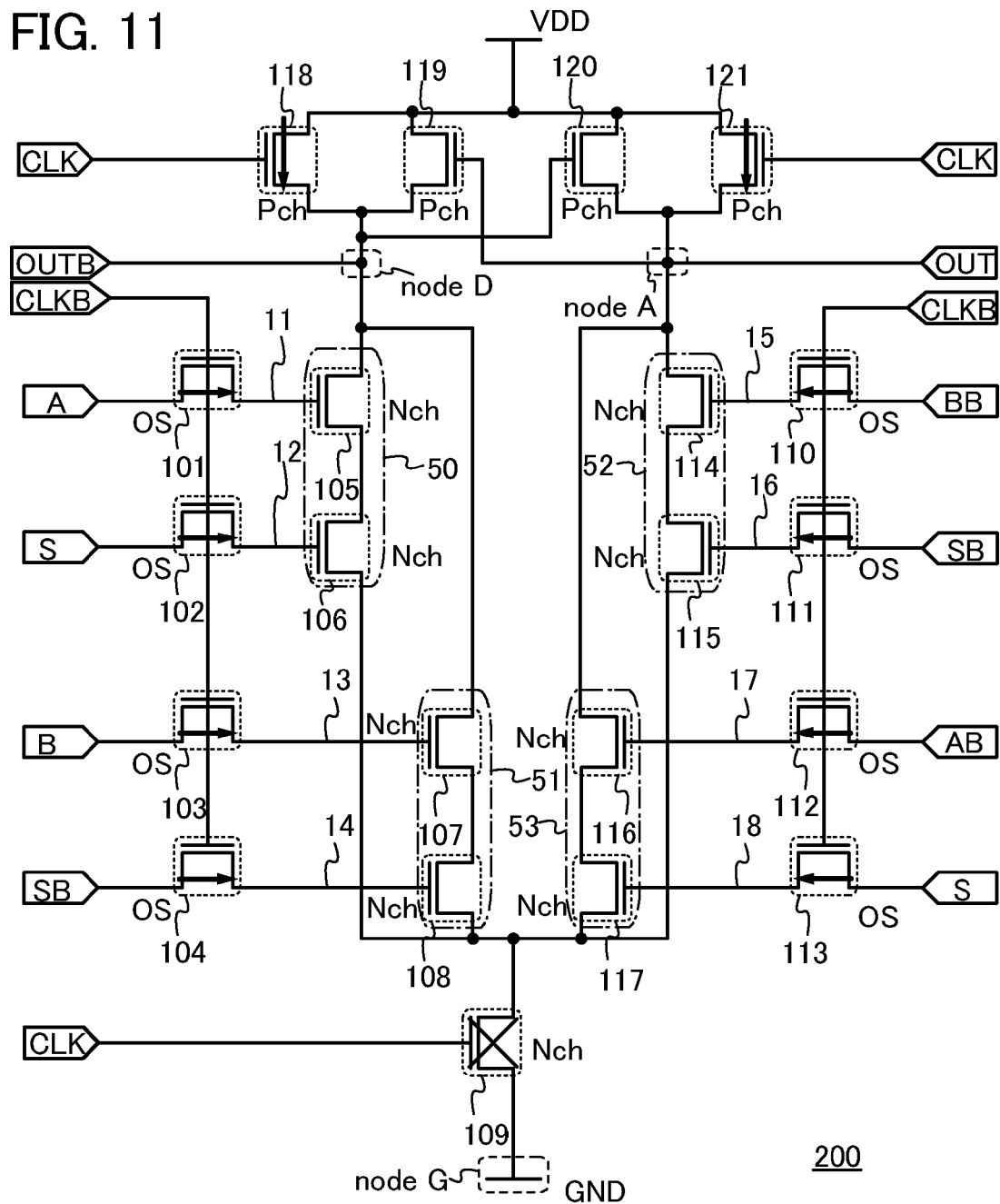
FIG. 11 shows operation of a MUX circuit.
Figure 12:
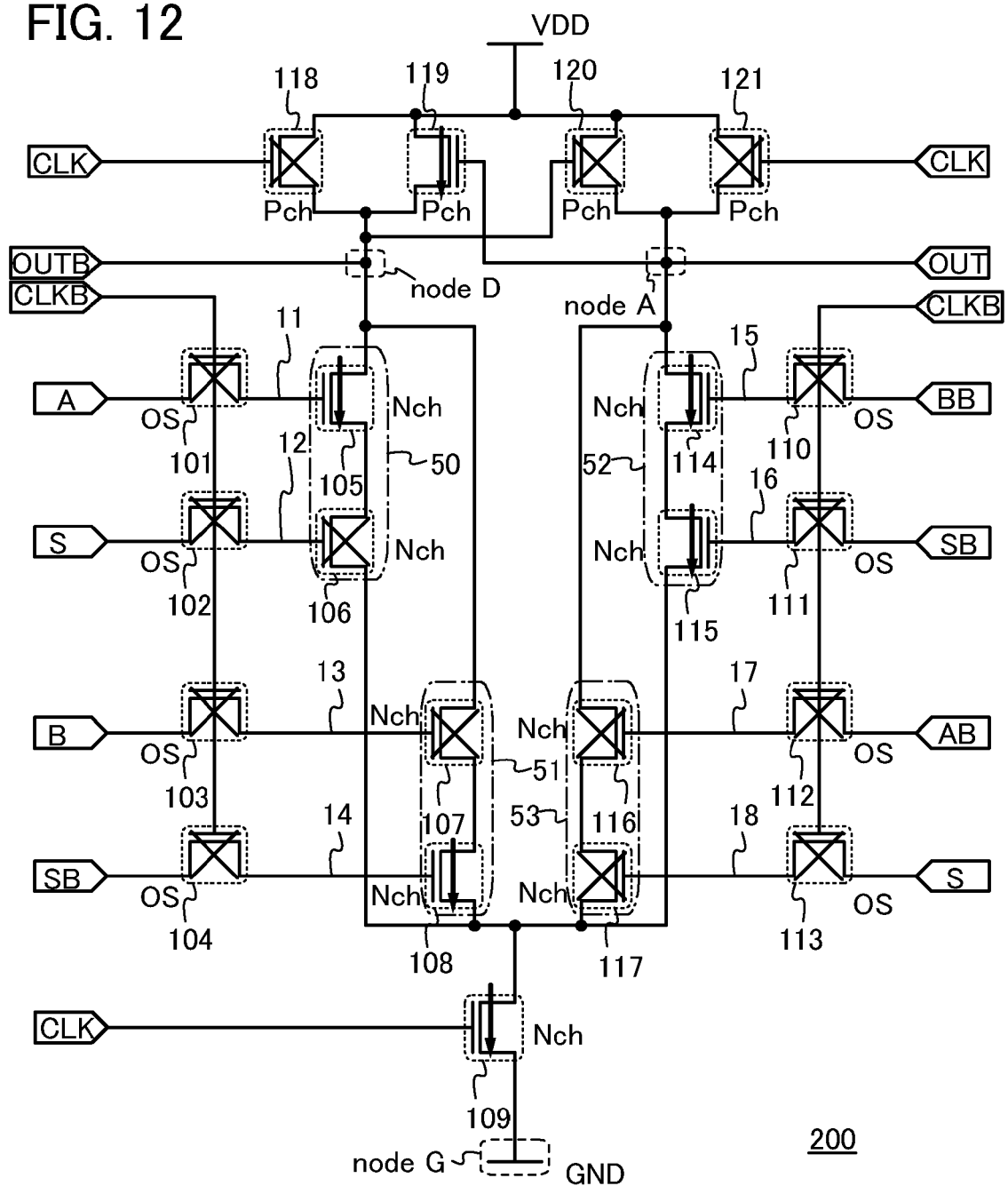
FIG. 12 shows operation of a MUX circuit.

The operation of the MUX circuit 200 is described with reference to FIG. 10, FIG. 11, FIG. 12, FIG. 13, FIG. 14, and FIG. 15. FIG. 10 shows a timing chart of the MUX circuit 200. In the timing chart in FIG. 10, a period is divided into a period T1, a period T2, a period T3, a period T4, a period T5, a period T6, a period T7, a period T8, a period T9, a period T10, a period T11, a period T12, a period T13, a period T14, a period T15, and a period T16. FIG. 11, FIG. 12, FIG. 13, FIG. 14, and FIG. 15 show operation states of the MUX circuit 200 in the period T1, the period T2, the period T3, the period T4, the period T9, the period T10, the period T15, and the period T16.

The MUX circuit 200 is a clock synchronization circuit and functions as a MUX circuit when the same clock signal CLK is input to the 18th transistor 118, the 21st transistor 121, and the 9th transistor 109. Note that the output signal OUT is determined only in the period T2, the period T4, the period T6, the period T8, the period T10, the period T12, the period T14, and the period T16 in which the 9th transistor 109 is on in synchronization with the clock signal CLK.

<Period T1 (see FIG. 11)>

First, as shown in the period T1 in FIG. 10, a case where the input signal A is set to the H potential (VDD), the input signal B is set to the L potential (VSS), and the input signal S is set to the L potential (VSS) is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus, the 1st transistor 101, the 2nd transistor 102, the 3rd transistor 103, and the 4th transistor 104 are turned on. Accordingly, the gate of the 5th transistor 105 (the node 11) is charged with the H potential (VDD) that is the same as that of the input signal A, the gate of the 6th transistor 106 (the node 12) is charged with the L potential (VSS) that is the same as that of the input signal S, the gate of the 7th transistor 107 (the node 13) is charged with the L potential (VSS) that is the same as that of the input signal B, and the gate of the 8th transistor 108 (the node 14) is charged with the H potential (VDD) that is the same as that of the signal SB having the phase opposite to that of the input signal S.

Further, since the signal CLKB having the phase opposite to that of the clock signal CLK is set to the H potential (VDD), the 10th transistor 110, the 11th transistor 111, the 12th transistor 112, and the 13th transistor 113 are turned on. Accordingly, the gate of the 14th transistor 114 (the node 15) is charged with the H potential (VDD) that is the same as that of the signal BB having the phase opposite to that of the input signal B, the gate of the 15th transistor 115 (the node 16) is charged with the H potential (VDD) that is the same as that of the signal SB having the phase opposite to that of the input signal S, the gate of the 16th transistor 116 (the node 17) is charged with the L potential (VSS) that is the same as that of the signal AB having the phase opposite to that of the input signal A, and the gate of the 17th transistor 117 (the node 18) is charged with the L potential (VSS) that is the same as that of the input signal S.

As described above, in the period T1, the node 11, the node 12, the node 13, the node 14, the node 15, the node 16, the node 17, and the node 18 are charged with the potentials corresponding to the input signal A, the potentials corresponding to the input signal B, and the potentials corresponding to the input signal S, and the node A and the node D are charged with the H potential (VDD).

<Period T2 (see FIG. 12)>

Next, as shown in the period T2 in FIG. 10, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the H potential (VDD) is accumulated in the node 11, when the 1st transistor 101 is off, the charge corresponding to the H potential (VDD) is retained in the node 11 (charge retention operation). Further, the 5th transistor 105 is turned on in response to in the potential of the node 11. Since charge corresponding to the L potential (VSS) is accumulated in the node 12, when the 2nd transistor 102 is off, the charge corresponding to the L potential (VSS) is retained in the node 12 (charge retention operation). Further, the 6th transistor 106 is turned off in response to the potential of the node 12. Since charge corresponding to the L potential (VSS) is accumulated in the node 13, when the 3rd transistor 103 is off, the charge corresponding to the L potential (VSS) is retained in the node 13 (charge retention operation). Further, the 7th transistor 107 is turned off in response to the potential of the node 13. Since charge corresponding to the H potential (VDD) is accumulated in the node 14, when the 4th transistor 104 is off, the charge corresponding to the H potential (VDD) is retained in the node 14 (charge retention operation). Further, the 8th transistor 108 is turned on in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the H potential (VDD) is accumulated in the node 15, when the 10th transistor 110 is off, the charge corresponding to the H potential (VDD) is retained in the node 15 (charge retention operation). Further, the 14th transistor 114 is turned on in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the L potential (VSS) is accumulated in the node 17, when the 12th transistor 112 is off, the charge corresponding to the L potential (VSS) is retained in the node 17 (charge retention operation). Further, the 16th transistor 116 is turned off in response to the potential of the node 17. Since charge corresponding to the L potential (VSS) is accumulated in the node 18, when the 13th transistor 113 is off, the charge corresponding to the L potential (VSS) is retained in the node 18 (charge retention operation). Further, the 17th transistor 117 is turned off in response to the potential of the node 18.

At this time, current flows in the region 52 but does not flow in the region 50, the region 51, and the region 53. Therefore, the H potential (VDD) accumulated in the node A is extracted to the reference potential (GND) of the node G via the region 52 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node A is determined, and the output signal OUT has the L potential (VSS).

As described above, the L potential (VSS) which is the potential of the input signal B and is selected as the input signal S is determined and output as the output signal OUT in the period T2.

Figure 13:
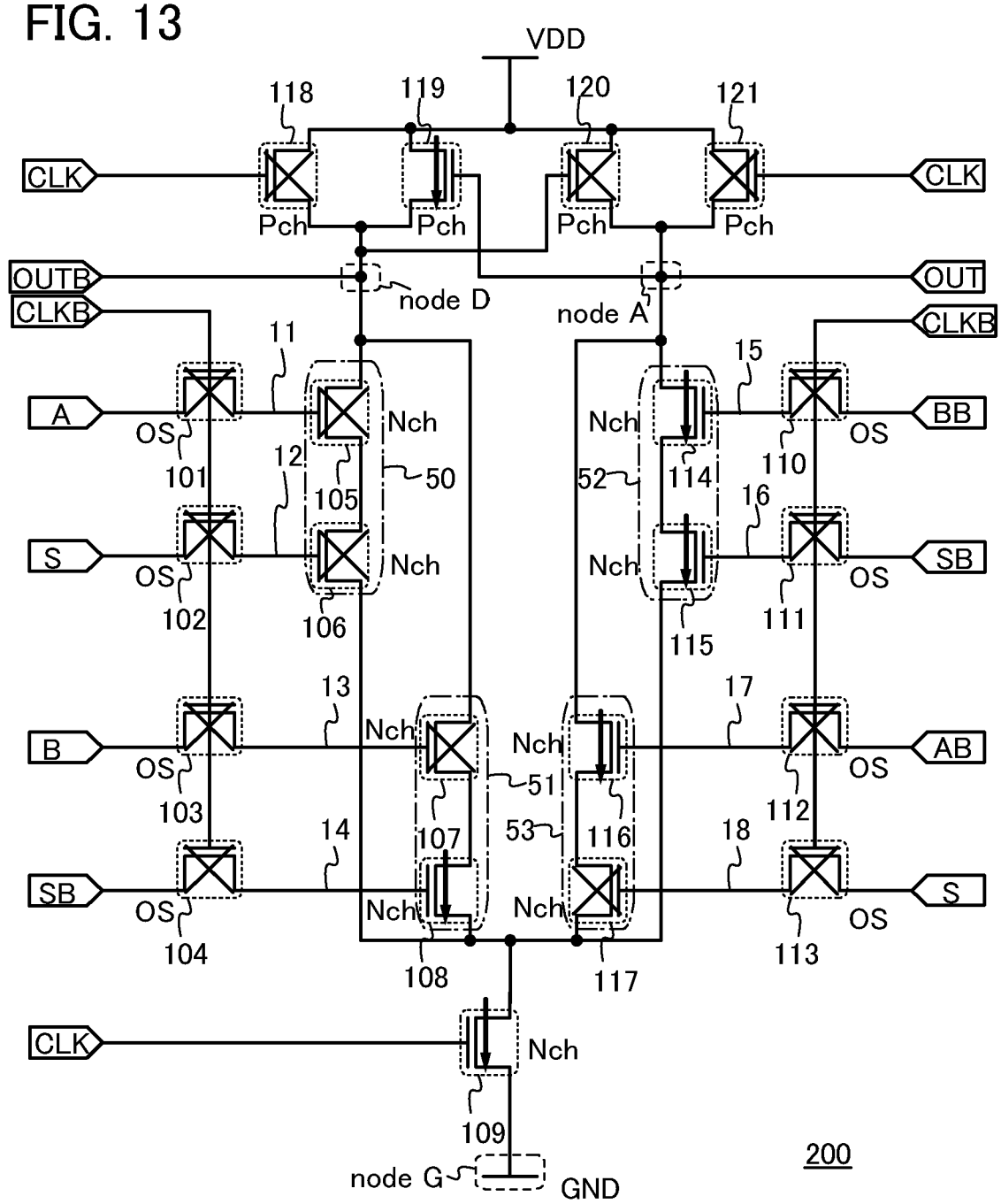
FIG. 13 shows operation of a MUX circuit.

The operation principle in the period T3 and the period T4 is similar to that in the period T1 and the period T2. When the L potential (VSS) is input as the input signal A, the input signal B, and the input signal S, current flows in the region 52 but does not flow in the region 50, the region 51, and the region 53 as illustrated in FIG. 13. Accordingly, the H potential (VDD) accumulated in the node A is extracted to the reference potential (GND) of the node G via the region 52 and the 9th transistor 109. That is, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node A is determined, and the output signal OUT has the L potential (VSS).

As described above, the L potential (VSS) which is the potential of the input signal B and is selected as the input signal S is determined and output as the output signal OUT in the period T3 and the period T4.

Figure 14:
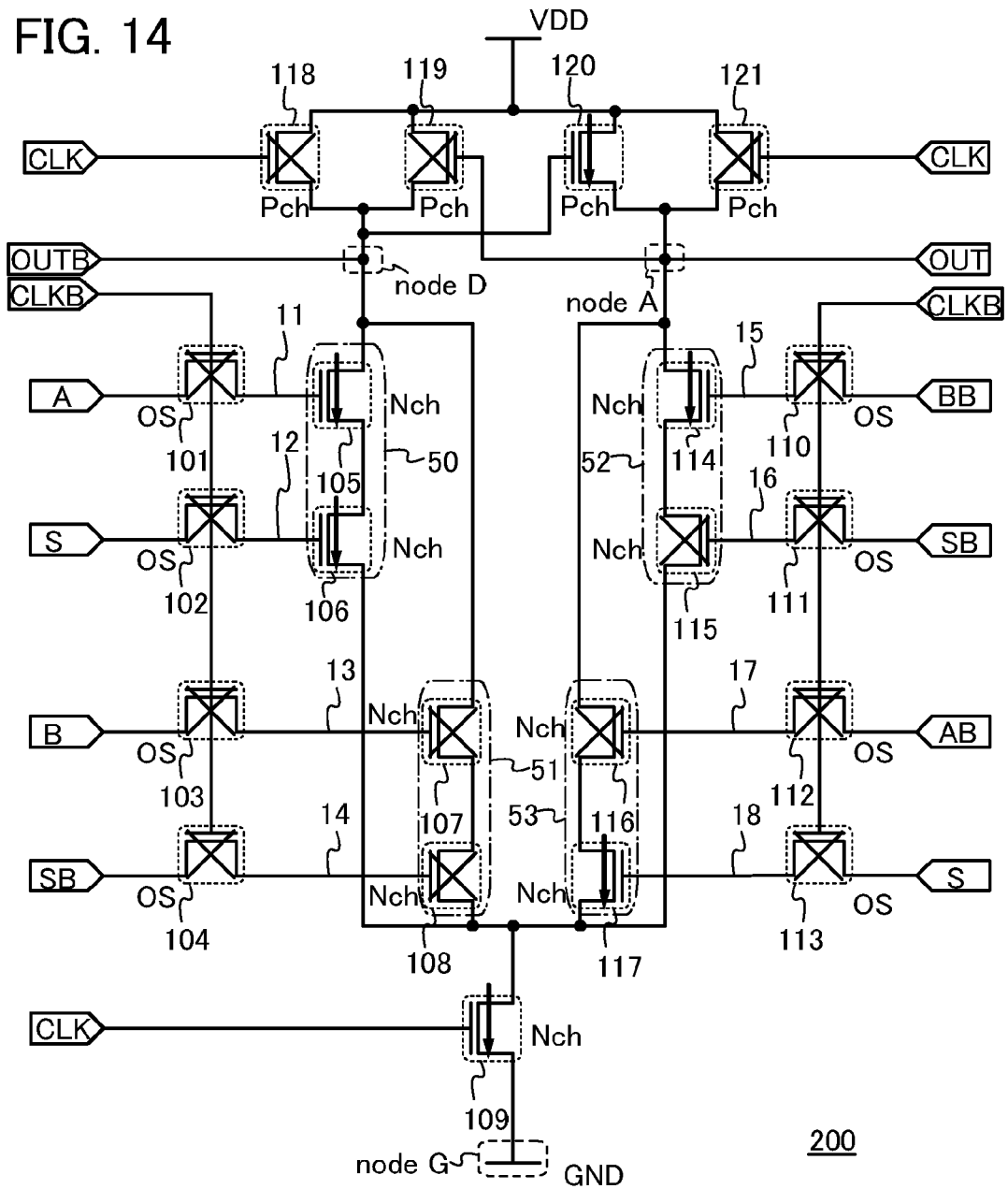
FIG. 14 shows operation of a MUX circuit.

The operation principle in the period T9 and the period T10 is similar to that in the period T1 and the period T2. When the H potential (VDD) is input as the input signal A and the input signal S, and the L potential (VSS) is input as the input signal B, current flows in the region 50 but does not flow in the region 51, the region 52, and the region 53 as illustrated in FIG. 14. Accordingly, the H potential (VDD) accumulated in the node D is extracted to the reference potential (GND) of the node G via the region 50 and the 9th transistor 109. That is, current flows from the node D to the node G.

Since current flows from the node D to the node G, the potential of the node D is gradually reduced from the H potential (VDD) to the L potential (VSS). As a result, the L potential (VSS) is applied to the gate of the 20th transistor 120, so that the 20th transistor 120 (p-channel) is turned on. The 20th transistor 120 is turned on, whereby the H potential (VDD) is supplied to the node A. At this time, the potential of the node A is determined, and the output signal OUT has the H potential (VDD).

As described above, the H potential (VDD) which is the potential of the input signal A and is selected as the input signal S is determined and output as the output signal OUT in the period T9 and the period T10.

Figure 15:
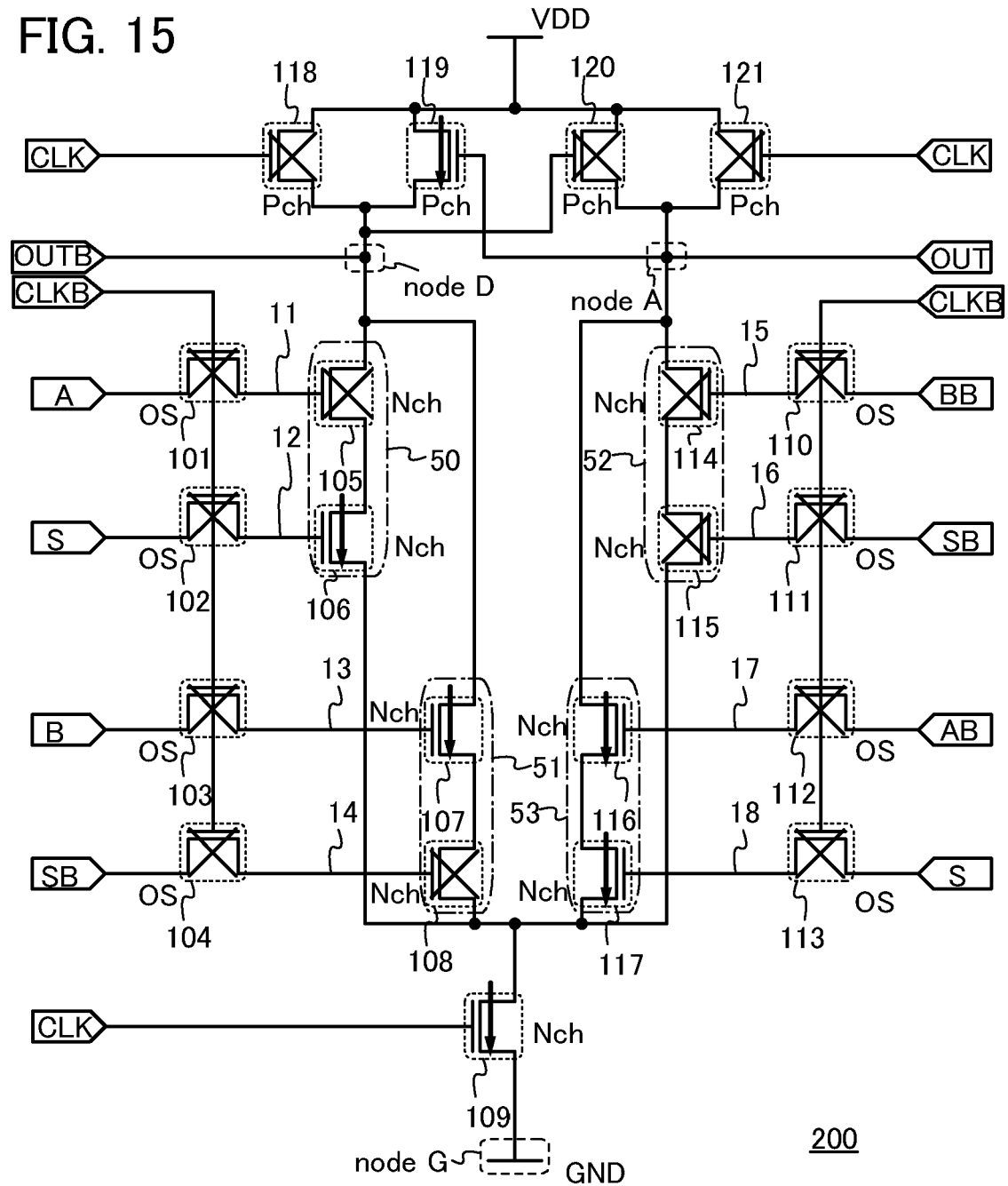
FIG. 15 shows operation of a MUX circuit.

The operation principle in the period T15 and the period T16 is similar to that in the period T1 and the period T2. When the L potential (VSS) is input as the input signal A, and the H potential (VDD) is input as the input signal B and the input signal S, current flows in the region 53 but does not flow in the region 50, the region 51, and the region 52 as illustrated in FIG. 15. Accordingly, the H potential (VDD) accumulated in the node A is extracted to the reference potential (GND) of the node G via the region 53 and the 9th transistor 109. That is, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node A is determined, and the L potential (VSS) is output as the output signal OUT.

As described above, the L potential (VSS) which is the potential of the input signal A and is selected as the input signal S is determined and output as the output signal OUT in the period T15 and the period T16.

FIG. 10, FIG. 11, FIG. 12, FIG. 13, FIG. 14, and FIG. 15 show that the output signal OUT depends only on the signal selected as the input signal S and does not depend on the other input signals. In the case of the MUX circuit 200, the H potential (VDD) is input as the input signal S when the input signal A is selected, whereas the L potential (VSS) is input as the input signal S when the input signal B is selected. Therefore, in the case where the input signal S is set to the H potential (VDD), a potential corresponding to the potential of the input signal A that is input in the period is output as the output signal OUT, whereas in the case where the input signal S is set to the L potential (VSS), a potential corresponding to the potential of the input signal B that is input in the period is output as the output signal OUT.

Accordingly, the input signal A, the input signal B, and the input signal S which are input to the eight input terminals are controlled utilizing the symmetry of the charge retaining portion, whereby the MUX circuit which selects one input signal from a plurality of input signals and outputs the one input signal as an output signal can be provided.

Note that the same applies to the period T5, the period T6, the period T7, the period T8, the period T11, the period T12, the period T13, and the period T14, and thus description thereof is omitted. The H potential (VDD) which is the potential of the input signal B and is selected as the input signal S is determined and output as the output signal OUT in the period T5 and the period T6. The H potential (VDD) which is the potential of the input signal B and is selected as the input signal S is determined and output as the output signal OUT in the period T7 and the period T8. The L potential (VSS) which is the potential of the input signal A and is selected as the input signal S is determined and output as the output signal OUT in the period T11 and the period T12. The H potential (VDD) which is the potential of the input signal A and is selected as the input signal S is determined and output as the output signal OUT in the period T13 and the period T14.

According to this embodiment, increase in the number of paths of the leakage current of the MUX circuit can be suppressed. As a result, the power consumption of the MUX circuit can be reduced.

According to this embodiment, the MUX circuit can retain data even when power supply is stopped.

According to this embodiment, it is possible to stack the transistor including an oxide semiconductor and the transistor including a silicon semiconductor in the MUX circuit; therefore, the area of the circuit can be reduced.

This embodiment can be appropriately combined with any of the other embodiments in this specification.

Embodiment 2

In this embodiment, the input terminals in the logic circuit which is described in Embodiment 1 are combined. Specifically, the four input terminals which determine the levels of the gate potentials of the four transistors included in the region 50 and the region 51 are electrically connected to each other, and the four input terminals which determine the levels of the gate potentials of the four transistors included in the region 52 and the region 53 are electrically connected to each other. In short, the eight input terminals are combined to form two input terminals. Given logic circuits which can be achieved by controlling input signals which are input to the input terminals and combining the input terminals will be described with reference to FIG. 16, FIG. 17, FIG. 18, FIG. 19, FIG. 20, FIG. 21, FIG. 22, FIG. 23, FIG. 24, and FIG. 25.

<Inverter Circuit>

An inverter circuit which has a data retention function and whose power consumption is reduced is described with reference to FIG. 16, FIG. 17, FIG. 18, and FIG. 19.

<Structure of Inverter Circuit 300>

Figure 16:
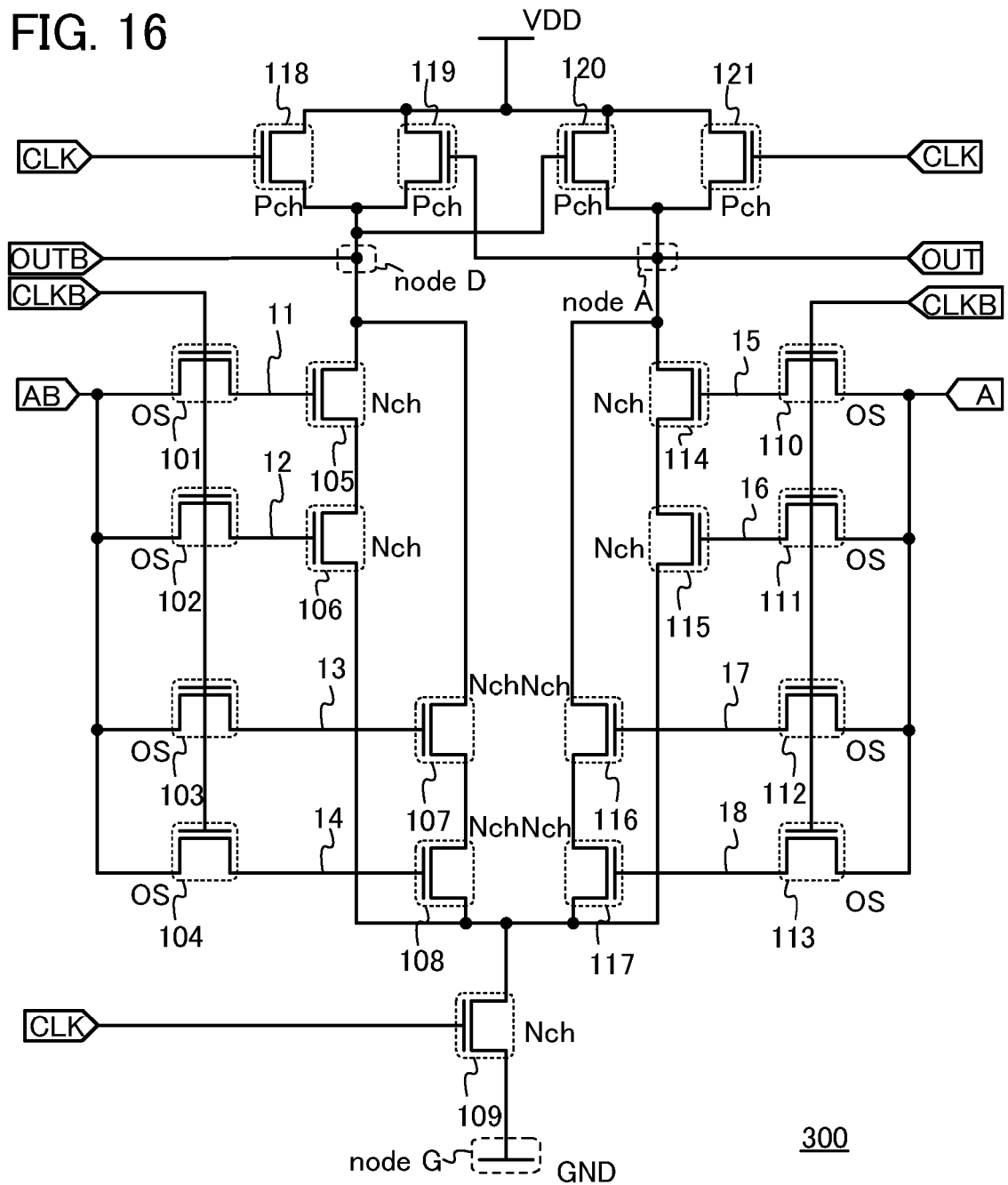
FIG. 16 illustrates an inverter circuit.

FIG. 16 is a circuit diagram of an inverter circuit of this embodiment. An inverter circuit 300 in FIG. 16 has a structure similar to that of the XOR circuit 100 in FIG. 1, in which the input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other. The electrically connected input terminals are referred to as a first input terminal.

In other words, the input signal A which is input to the one of the source and the drain of the 1st transistor 101, the signal BB that has the phase opposite to that of the input signal B and is input to the one of the source and the drain of the 2nd transistor 102, and the input signal B which is input to the one of the source and the drain of the 4th transistor 104 are replaced with the signal AB having the phase opposite to that of the input signal B. Note that the signal which is input to the one of the source and the drain of the 3rd transistor 103 is the same as that in the XOR circuit in FIG. 1.

In addition, the input terminal which inputs an input signal to the one of the source and the drain of the 10th transistor 110, the input terminal which inputs the input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other. The electrically connected input terminals are referred to as a second input terminal.

In other words, the signal AB that has the phase opposite to that of the input signal A and is input to the one of the source and the drain of the 10th transistor 110, the signal BB that has the phase opposite to that of the input signal B and is input to the one of the source and the drain of the 11th transistor 111, and the input signal B which is input to the one of the source and the drain of the 13th transistor 113 are replaced with the input signal A. Note that the signal which is input to the one of the source and the drain of the 12th transistor 112 is the same as that of the XOR circuit in FIG. 1.

In the inverter circuit 300, when the gates of the transistors including an oxide semiconductor are closed, there is only one path for leakage current, which goes from the power supply potential VDD terminal to the reference potential GND terminal; therefore, power consumption of the inverter circuit 300 can be reduced.

The inverter circuit 300 does not lose data even when the supply of the power supply potential VDD is stopped. In other words, the inverter circuit 300 is a nonvolatile memory circuit. Since data is not lost even when the supply of the power supply potential VDD is stopped, it is possible to stop the supply of the power supply potential VDD when the gates of the transistors including an oxide semiconductor are closed in the inverter circuit 300. Therefore, the power consumption of the nonvolatile inverter circuit 300 can be reduced.

Further, in the inverter circuit 300, the transistor including an oxide semiconductor and the transistor including a silicon semiconductor can be stacked (which is described later). Therefore, it is possible to reduce the area of the inverter circuit 300.

<Operation of Inverter Circuit 300>

Figure 17:
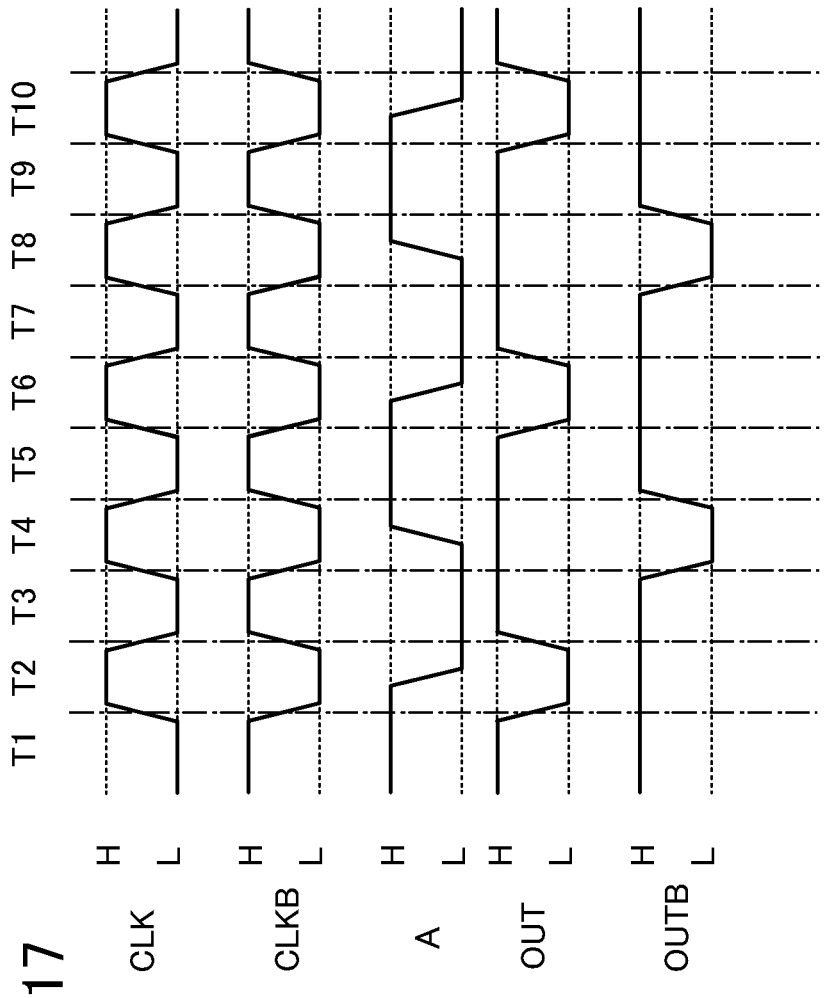
FIG. 17 is a timing chart of an inverter circuit
Figure 18:
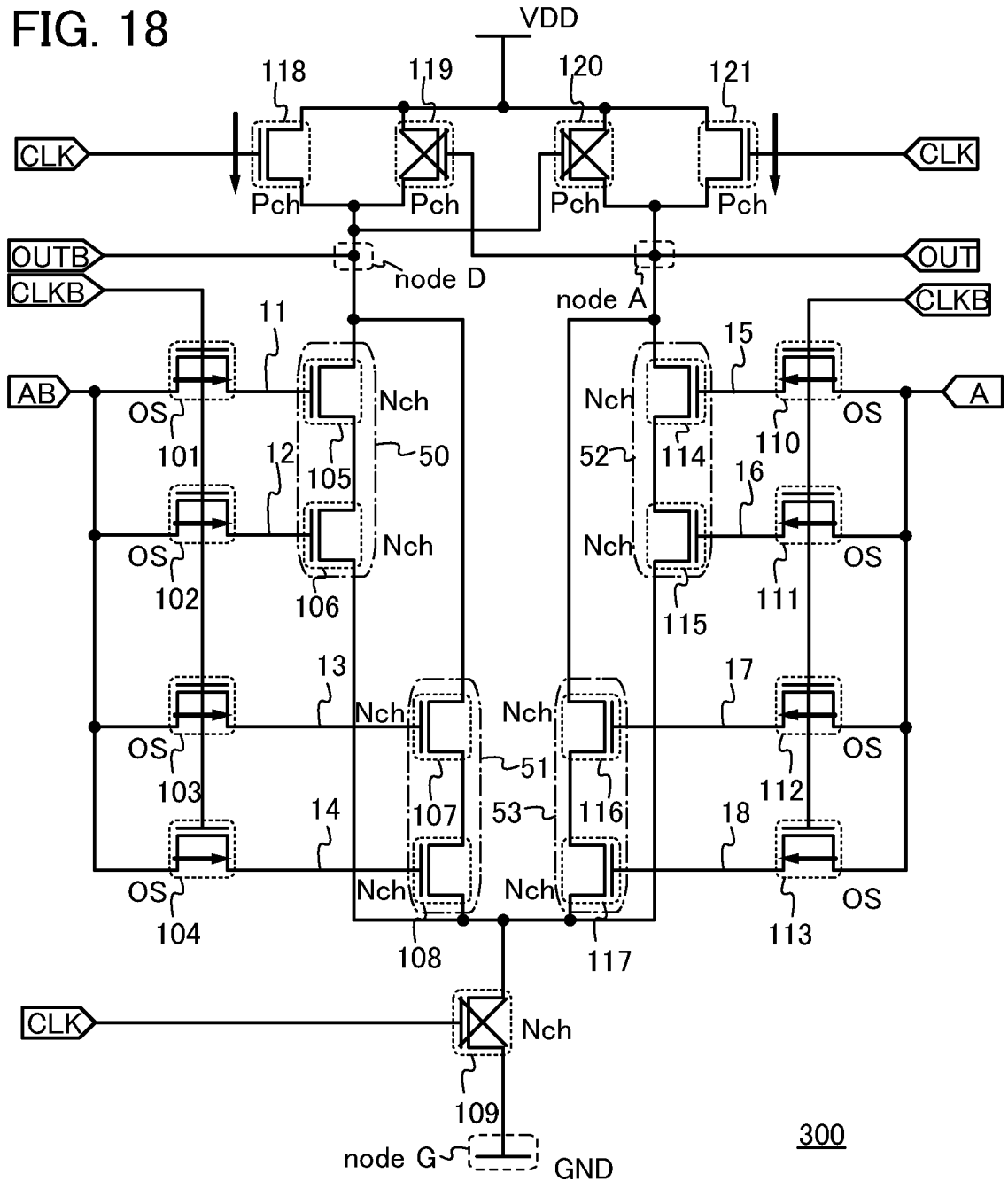
FIG. 18 shows operation of an inverter circuit.
Figure 19:
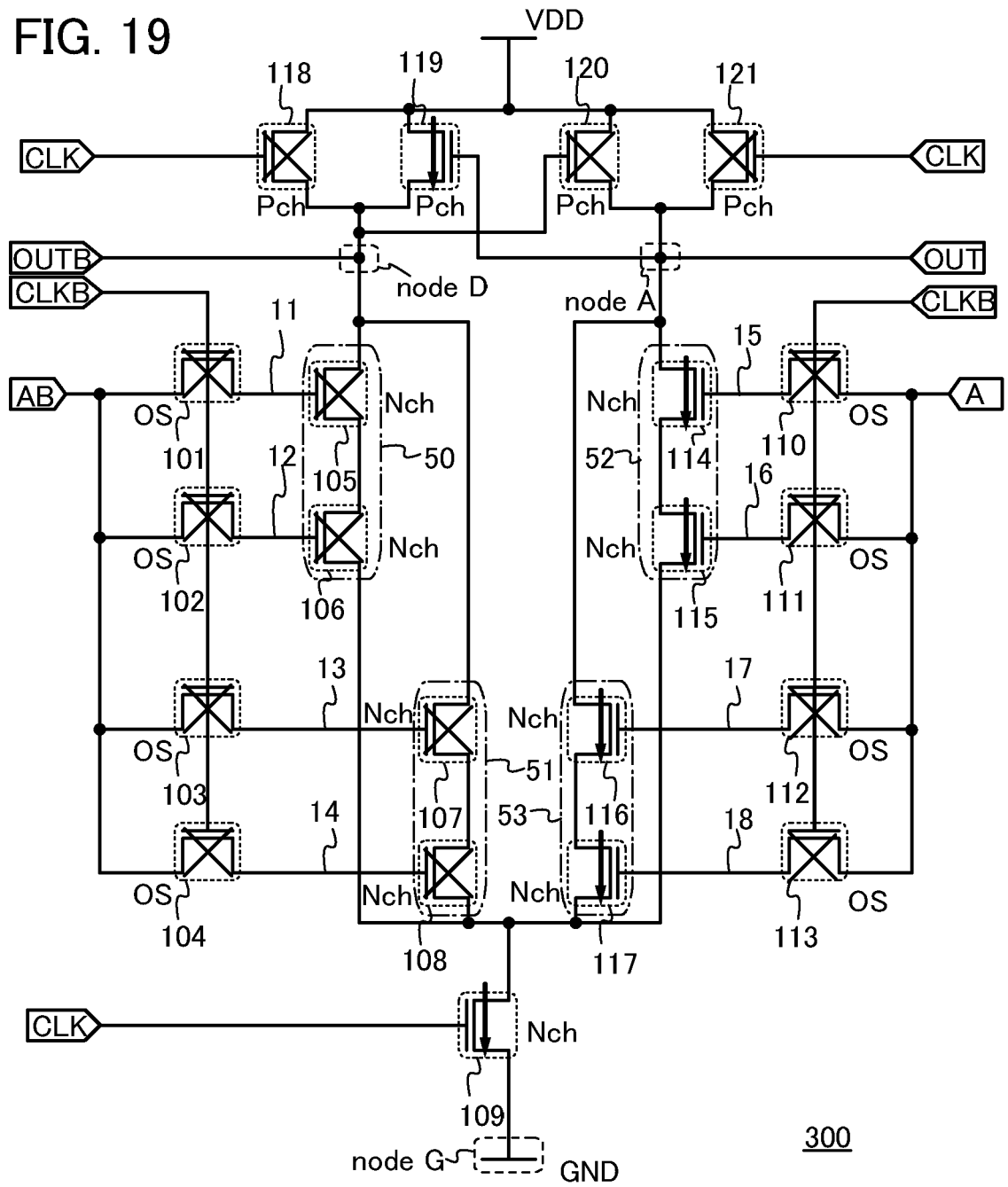
FIG. 19 shows operation of an inverter circuit.
Figure 20:
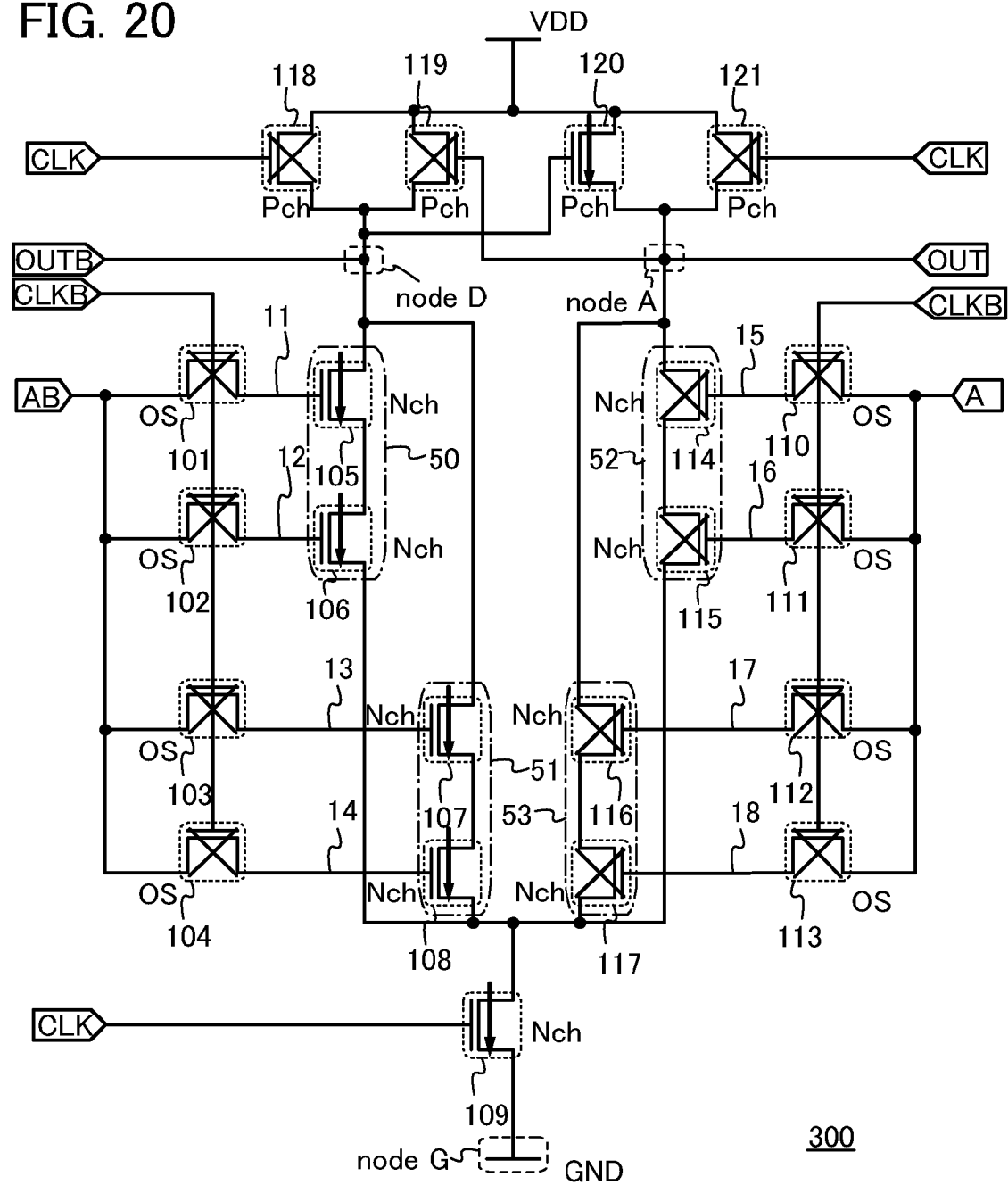
FIG. 20 shows operation of an inverter circuit.

The operation of the inverter circuit 300 is described with reference to FIG. 18, FIG. 19, and FIG. 20. FIG. 17 shows a timing chart of the inverter circuit 300. In the timing chart in FIG. 17, a period is divided into a period T1, a period T2, a period T3, a period T4, a period T5, a period T6, a period T7, a period T8, a period T9, and a period T10. FIG. 18, FIG. 19, and FIG. 20 show operation states of the inverter circuit 300 in the period T1, the period T2, the period T3, and the period T4.

The inverter circuit 300 is a clock synchronization circuit and functions as an inverter circuit when the same clock signal CLK is input to the 18th transistor 118, the 21st transistor 121, and the 9th transistor 109. Note that the output signal OUT is determined only in the period T2, the period T4, the period T6, the period T8, and the period T10, in which the 9th transistor 109 is on in synchronization with the clock signal CLK.

<Period T1 (see FIG. 18)>

First, as shown in the period T1 in FIG. 17, a case where the H potential (VDD) is input as the input signal A to the second input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other (the first input terminal).

Accordingly, the gate of the 5th transistor 105 (the node 11), the gate of the 6th transistor 106 (the node 12), the gate of the 7th transistor 107 (the node 13), and the gate of the 8th transistor 108 (the node 14) are charged with the L potential (VSS) which is the same as that of the signal AB having the phase opposite to that of the input signal A.

Further, since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110, the input terminal which inputs an input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other (the second input terminal).

Accordingly, the gate of the 14th transistor 114 (the node 15), the gate of the 15th transistor 115 (the node 16), the gate of the 16th transistor 116 (the node 17), and the gate of the 17th transistor 117 (the node 18) are charged with the H potential (VDD) that is the same as that of the input signal A.

As described above, in the period T1, the node 11, the node 12, the node 13, the node 14, the node 15, the node 16, the node 17, and the node 18 are charged with the potential corresponding to the input signal A and the potential corresponding to the signal AB having the phase opposite to that of the input signal A, and the node A and the node D are charged with the H potential (VDD).
<Period T2 (see FIG. 19)>

Next, as shown in the period T2 in FIG. 17, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the L potential (VSS) is accumulated in the node 11, when the 1st transistor 101 is off, the charge corresponding to the L potential (VSS) is retained in the node 11 (charge retention operation). Further, the 5th transistor 105 is turned off in response to the potential of the node 11. Since charge corresponding to the L potential (VSS) is accumulated in the node 12, when the 2nd transistor 102 is off, the charge corresponding to the L potential (VSS) is retained in the node 12 (charge retention operation). Further, the 6th transistor 106 is turned off in response to the potential of the node 12. Since charge corresponding to the L potential (VSS) is accumulated in the node 13, when the 3rd transistor 103 is off, the charge corresponding to the L potential (VSS) is retained in the node 13 (charge retention operation). Further, the 7th transistor 107 is turned off in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the H potential (VDD) is accumulated in the node 15, when the 10th transistor 110 is off, the charge corresponding to the H potential (VDD) is retained in the node 15 (charge retention operation). Further, the 14th transistor 114 is turned on in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the H potential (VDD) is accumulated in the node 17, when the 12th transistor 112 is off, the charge corresponding to the H potential (VDD) is retained in the node 17 (charge retention operation). Further, the 16th transistor 116 is turned on in response to the potential of the node 17. Since charge corresponding to the H potential (VDD) is accumulated in the node 18, when the 13th transistor 113 is off, the charge corresponding to the H potential (VDD) is retained in the node 18 (charge retention operation). Further, the 17th transistor 117 is turned on in response to the potential of the node 18.

At this time, current flows in the region 52 and the region 53 but does not flow in the region 50 and the region 51. Therefore, the H potential (VDD) accumulated in the node A is extracted to the reference potential (GND) of the node G via the region 52 or the region 53 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node A is determined, and the output signal OUT has the L potential (VSS).

As described above, the L potential (VSS) that is the inverse of the H potential (VDD) that is the potential of the input signal A is determined and output as the output signal OUT in the period T2.
<Period T3 (see FIG. 18)>

First, as shown in the period T3 in FIG. 17, a case where the L potential (VSS) is input as the input signal A to the second input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other (the first input terminal).

Accordingly, the gate of the 5th transistor 105 (the node 11), the gate of the 6th transistor 106 (the node 12), the gate of the 7th transistor 107 (the node 13), and the gate of the 8th transistor 108 (the node 14) are charged with the H potential (VDD) which is the same as that of the signal AB having the phase opposite to that of the input signal A.

Since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110, the input terminal which inputs an input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other (the second input terminal).

Accordingly, the gate of the 14th transistor 114 (the node 15), the gate of the 15th transistor 115 (the node 16), the gate of the 16th transistor 116 (the node 17), and the gate of the 17th transistor 117 (the node 18) are charged with the L potential (VSS) that is the same as that of the input signal A.

As described above, in the period T3, the node 11, the node 12, the node 13, the node 14, the node 15, the node 16, the node 17, and the node 18 are charged with the potential corresponding to the input signal A and the potential corresponding to the signal AB having the phase opposite to that of the input signal A, and the node A and the node D are charged with the H potential (VDD).

<Period T4 (see FIG. 20)>

Next, as shown in the period T4 in FIG. 17, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the H potential (VDD) is accumulated in the node 11, when the 1st transistor 101 is off, the charge corresponding to the H potential (VDD) is retained in the node 11 (charge retention operation). Further, the 5th transistor 105 is turned on in response to the potential of the node 11. Since charge corresponding to the H potential (VDD) is accumulated in the node 12, when the 2nd transistor 102 is off, the charge corresponding to the H potential (VDD) is retained in the node 12 (charge retention operation). Further, the 6th transistor 106 is turned on in response to the potential of the node 12. Since charge corresponding to the H potential (VDD) is accumulated in the node 13, when the 3rd transistor 103 is off, the charge corresponding to the H potential (VDD) is retained in the node 13 (charge retention operation). Further, the 7th transistor 107 is turned on in response to the potential of the node 13. Since charge corresponding to the H potential (VDD) is accumulated in the node 14, when the 4th transistor 104 is off, the charge corresponding to the H potential (VDD) is retained in the node 14 (charge retention operation). Further, the 8th transistor 108 is turned on in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the L potential (VSS) is accumulated in the node 15, when the 10th transistor 110 is off, the charge corresponding to the L potential (VSS) is retained in the node 15 (charge retention operation). Further, the 14th transistor 114 is turned off in response to the potential of the node 15. Since charge corresponding to the L potential (VSS) is accumulated in the node 16, when the 11th transistor 111 is off, the charge corresponding to the L potential (VSS) is retained in the node 16 (charge retention operation). Further, the 15th transistor 115 is turned off in response to the potential of the node 16. Since charge corresponding to the L potential (VSS) is accumulated in the node 17, when the 12th transistor 112 is off, the charge corresponding to the L potential (VSS) is retained in the node 17 (charge retention operation). Further, the 16th transistor 116 is turned off in response to the potential of the node 17. Since charge corresponding to the L potential (VSS) is accumulated in the node 18, when the 13th transistor 113 is off, the charge corresponding to the L potential (VSS) is retained in the node 18 (charge retention operation). Further, the 17th transistor 117 is turned off in response to the potential of the node 18.

At this time, current flows in the region 50 and the region 51 but does not flow in the region 52 and the region 53. Therefore, the H potential (VDD) accumulated in the node D is extracted to the reference potential (GND) of the node G via the region 50 or the region 51 and the 9th transistor 109. In short, current flows from the node D to the node G.

Since current flows from the node D to the node G, the potential of the node D is gradually reduced from the H potential (VDD) to the L potential (VSS). As a result, the L potential (VSS) is applied to the gate of the 20th transistor 120, so that the 20th transistor 120 (p-channel) is turned on. At this time, the potential of the node A is determined, and the output signal OUT has the H potential (VDD).

As described above, in the period T4, the H potential (VDD) which is the inverse of the L potential (VSS) that is the potential of the input signal A is determined and output as the output signal OUT.

Operations in the period T5 and the period T6 are similar to those in the period T1 and the period T2. Operations in the period T9 and the period T10 are also similar to those in the period T1 and the period T2. In the case where the H potential (VDD) is input as the input signal A to the second input terminal, current flows in the region 52 and the region 53 but does not flow in the region 50 and the region 51 as illustrated in FIG. 19. In short, current flows from the node A to the node G. As a result, the L potential (VSS) is applied to the gate of the 19th transistor 119, and thus the 19th transistor 119 (p-channel) is turned on. At this time, the potential of the node A is determined and the output signal OUT has the L potential (VSS).

As described above, in the period T6 and the period T10, the L potential (VSS) which is the inverse of the H potential (VDD) that is the potential of the input signal A is determined and output as the output signal OUT.

Operations in the period T7 and the period T8 are similar to those in the period T3 and the period T4. In the case where the L potential (VSS) is input as the input signal A to the second input terminal, current flows in the region 50 and the region 51 but does not flow in the region 52 and the region 53 as illustrated in FIG. 20. In short, current flows from the node D to the node G. As a result, the L potential (VSS) is applied to the gate of the 20th transistor 120, and thus the 20th transistor 120 (p-channel) is turned on. At this time, the potential of the node A is determined and the output signal OUT has the H potential (VDD).

As described above, in the period T8, the H potential (VDD) which is the inverse of the L potential (VSS) that is the potential of the input signal A is determined and output as the output signal OUT.

FIG. 16, FIG. 17, FIG. 18, FIG. 19, and FIG. 20 show that a potential which is opposite to a potential which is input as the input signal A is output as the output signal OUT. In the inverter circuit 300, in the case where the input signal A is set to the H potential (VDD), the L potential (VSS) that is opposite to the potential of the input signal A which is input in that period is output as the output signal OUT; in the case where the input signal A is set to the L potential (VSS), the H potential (VDD) that is opposite to the potential of the input signal A which is input in that period is output as the output signal OUT.

Thus, the four input terminals closer to the region 50 and the region 51 are electrically connected to each other and the four input terminals closer to the region 52 and the region 53 are electrically connected to each other, thereby achieving the inverter circuit which outputs, as an output signal, a potential which is opposite to the potential of the input signal input to the second input terminal.

According to this embodiment, increase in the number of paths of leakage current in the inverter circuit can be suppressed. Accordingly, the power consumption of the inverter circuit can be reduced.

According to this embodiment, the inverter circuit can retain data even when power supply is stopped.

According to this embodiment, it is possible to stack the transistor including an oxide semiconductor and the transistor including a silicon semiconductor in the inverter circuit; therefore, the area of the circuit can be reduced.

<Register Circuit>

A register circuit which has a data retention function and whose power consumption is reduced is described below with reference to FIG. 21, FIG. 22, FIG. 23, FIG. 24, and FIG. 25.

<Structure of Register Circuit 400>

Figure 21:
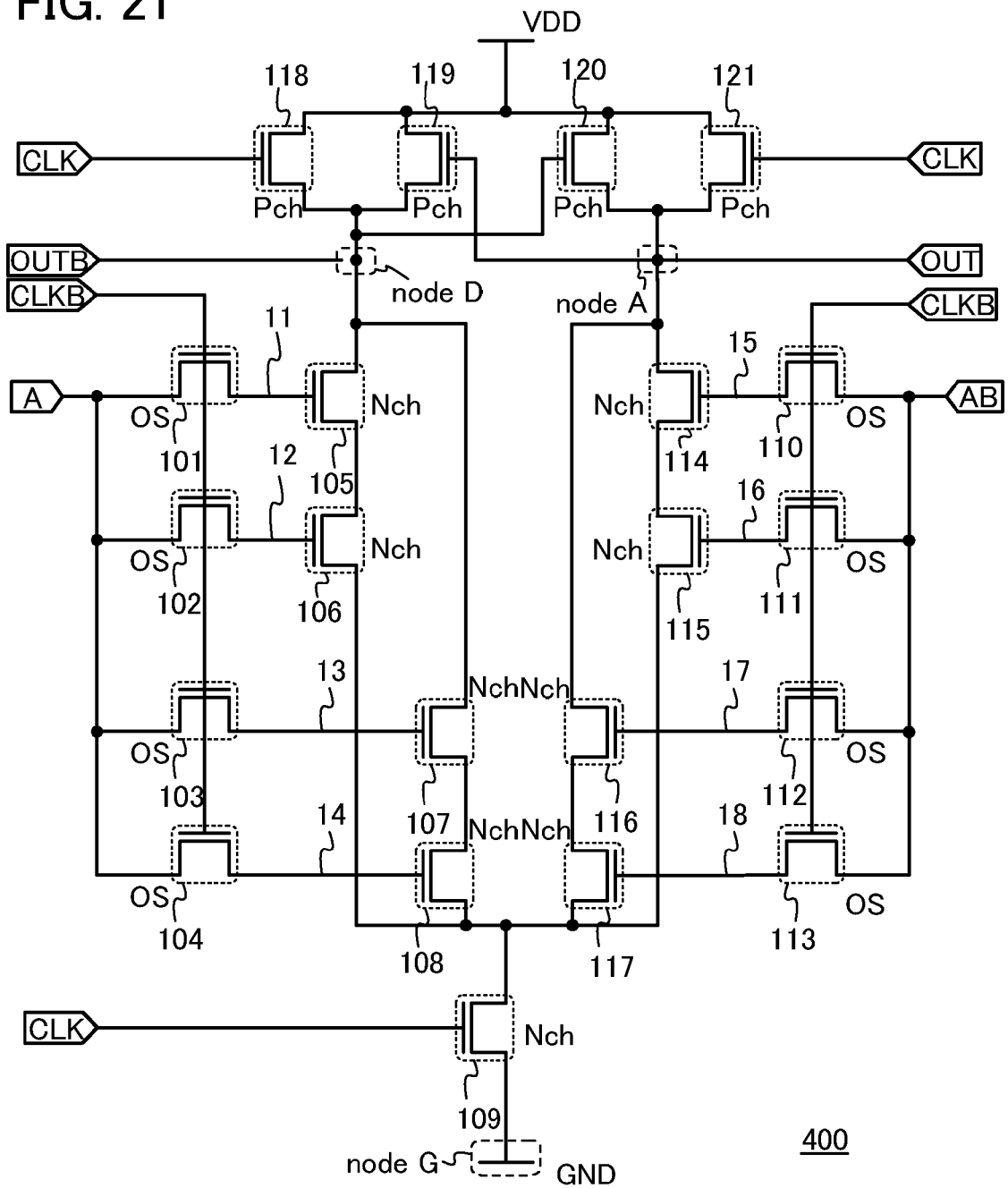
FIG. 21 illustrates a register circuit.

FIG. 21 is a circuit diagram of a register circuit of this embodiment. A register circuit 400 illustrated in FIG. 21 has a structure similar to that of the XOR circuit 100 in FIG. 1, in which the input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other. The electrically connected input terminals are referred to as a first input terminal.

In other words, the signal BB that has the phase opposite to that of the input signal B and is input to the one of the source and the drain of the 2nd transistor 102, the signal AB that has the phase opposite to that of the input signal A and is input to the one of the source and the drain of the 3rd transistor 103, and the input signal B which is input to the one of the source and the drain of the 4th transistor 104 are replaced with the input signal A. Note that the signal input to the one of the source and the drain of the 1st transistor 101 is the same as that in the XOR circuit 100 in FIG. 1.

In addition, the input terminal which inputs an input signal to the one of the source and the drain of the 10th transistor 110, the input terminal which inputs the input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other. The electrically connected input terminals are referred to as a second input terminal.

In other words, the signal BB that has the phase opposite to that of the input signal B and is input to the one of the source and the drain of the 11th transistor 111, the input signal A which is input to the one of the source and the drain of the 12th transistor 112, and the input signal B which is input to the one of the source and the drain of the 13th transistor 113 are replaced with the signal AB having the phase opposite to that of the input signal A. Note that the signal input to the one of the source and the drain of the 10th transistor 110 is the same as that in the XOR circuit 100 in FIG. 1.

In the register circuit 400, when the gates of the transistors including an oxide semiconductor are closed, there is only one path for leakage current, which goes from the power supply potential VDD terminal to the reference potential GND terminal; therefore, power consumption of the register circuit 400 can be reduced.

The register circuit 400 does not lose data even when the supply of the power supply potential VDD is stopped. In other words, the register circuit 400 is a nonvolatile memory circuit. Since data is not lost even when the supply of the power supply potential VDD is stopped, it is possible to stop the supply of the power supply potential VDD when the gates of the transistors including an oxide semiconductor are closed in the register circuit 400. Therefore, the power consumption of the nonvolatile register circuit 400 can be reduced.

Further, in the register circuit 400, the transistor including an oxide semiconductor and the transistor including a silicon semiconductor can be stacked (which is described later). Therefore, it is possible to reduce the area of the register circuit 400.

<Operation of Register Circuit 400>

Figure 22:
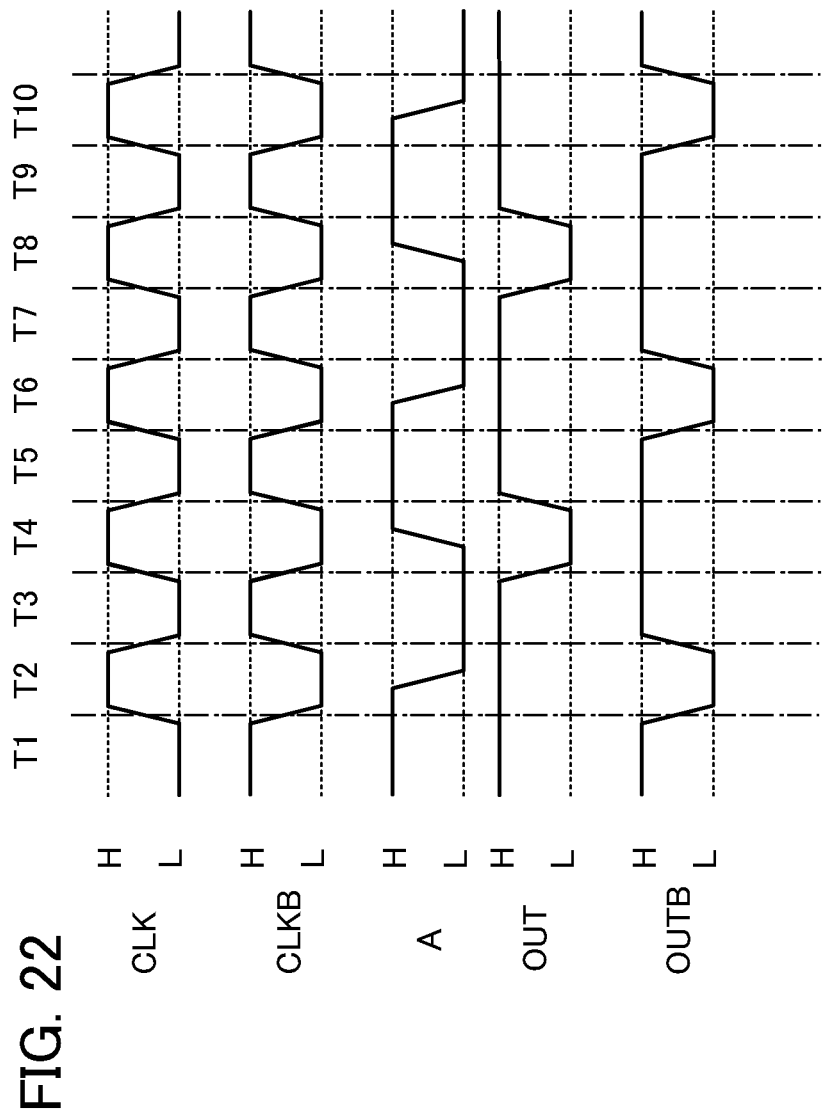
FIG. 22 is a timing chart of a register circuit.
Figure 23:
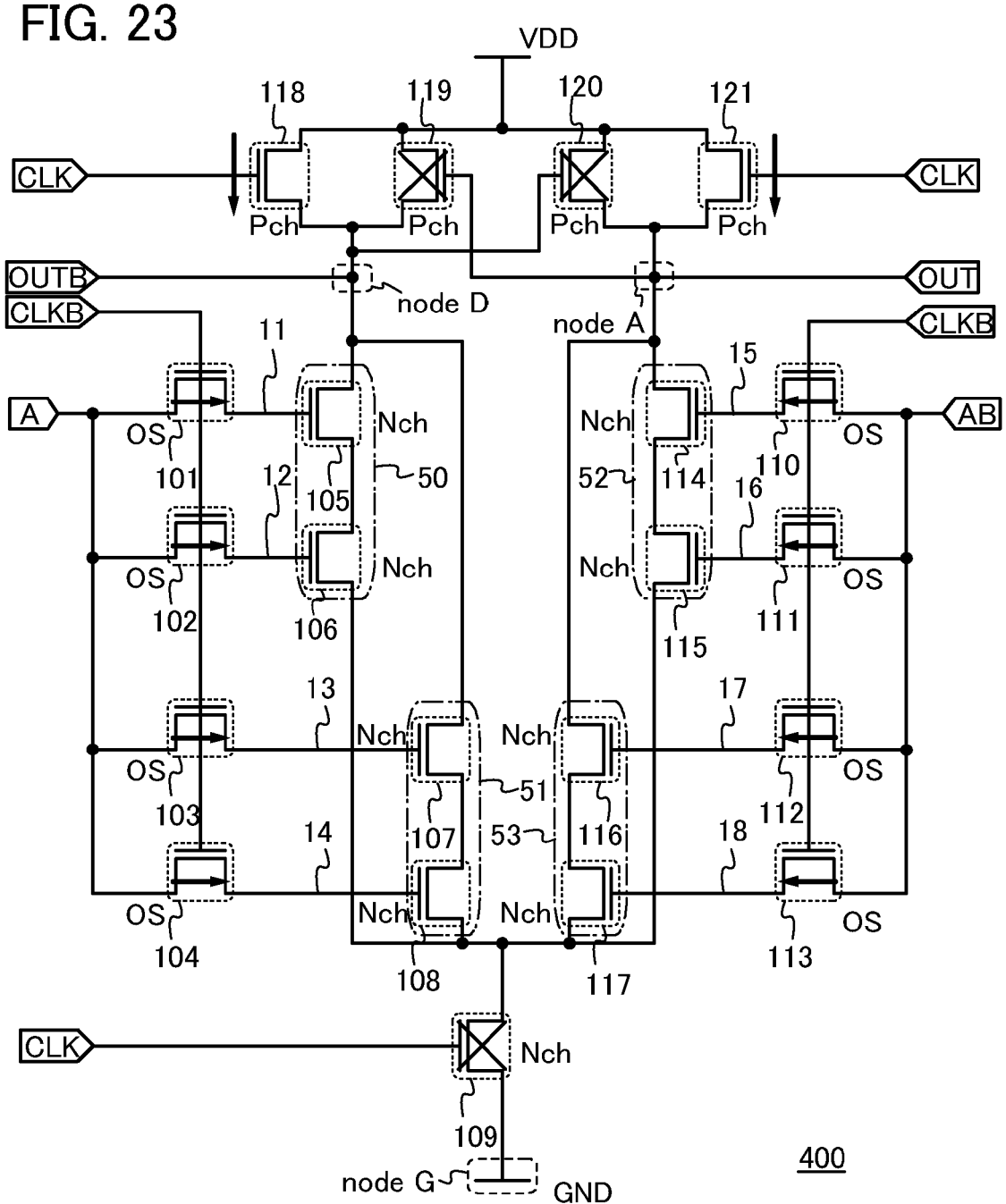
FIG. 23 shows operation of a register circuit.
Figure 24:
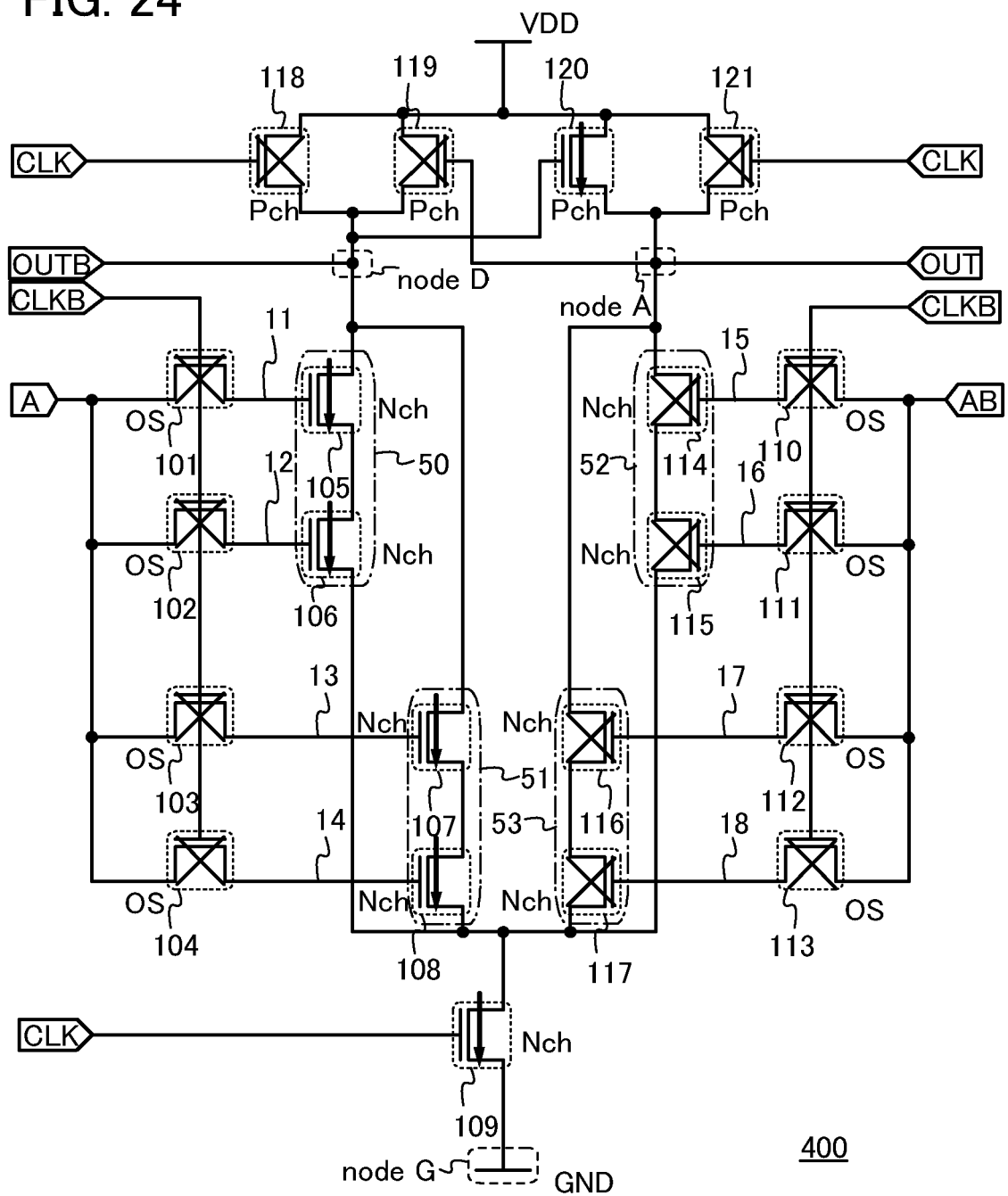
FIG. 24 shows operation of a register circuit.
Figure 25:
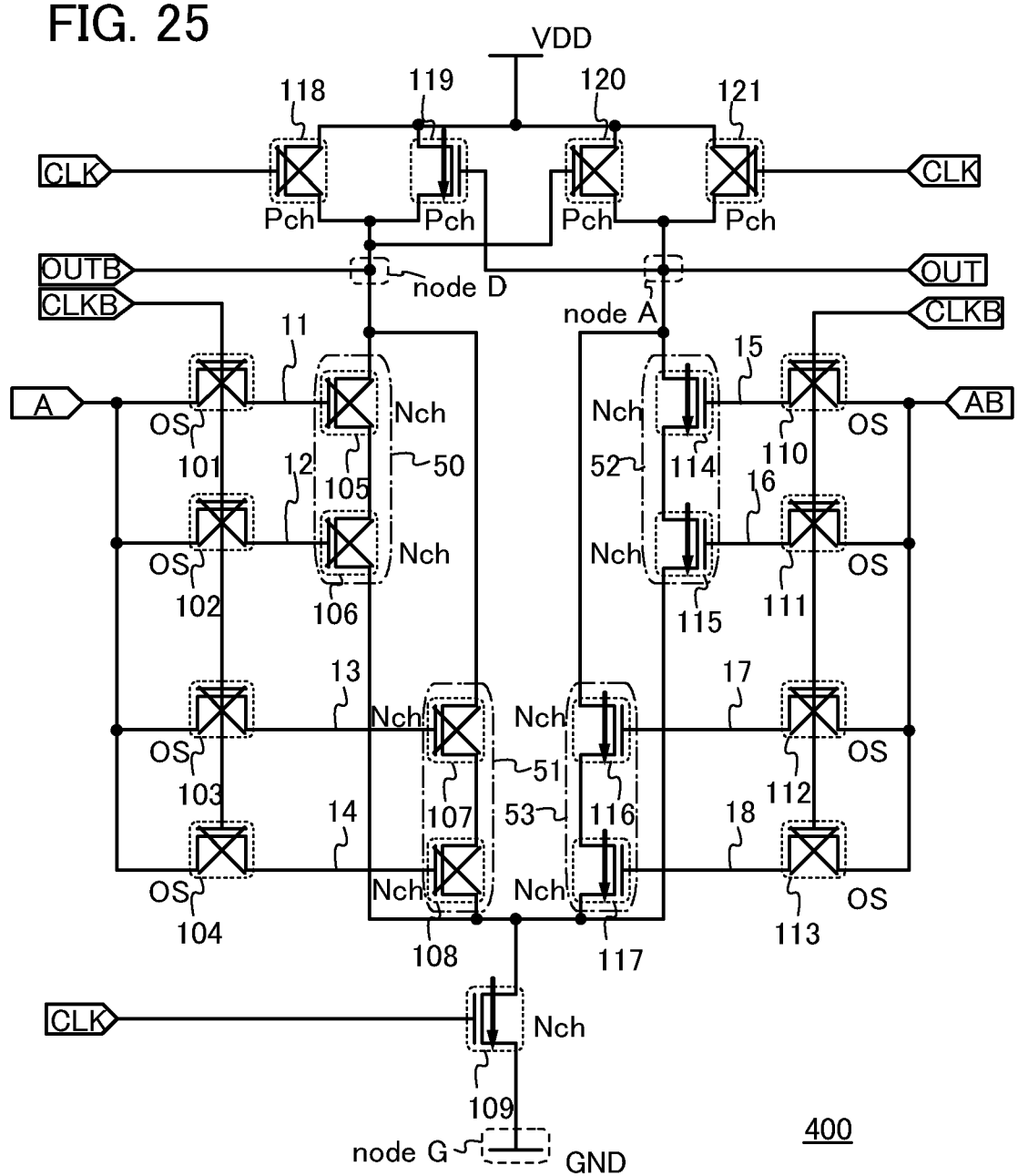
FIG. 25 shows operation of a register circuit.

Operations of the register circuit 400 are described with reference to FIG. 23, FIG. 24, and FIG. 25. FIG. 22 is a timing chart of the register circuit 400. In the timing chart in FIG. 22, a period is divided into a period T1, a period T2, a period T3, a period T4, a period T5, a period T6, a period T7, a period T8, a period T9, and a period T10. FIG. 23, FIG. 24, and FIG. 25 show operation states of the register circuit 400 in the period T1, the period T2, the period T3, and the period T4.

The register circuit 400 is a clock synchronization circuit and functions as a register circuit when the same clock signal CLK is input to the 18th transistor 118, the 21st transistor 121, and the 9th transistor 109. Note that the output signal OUT is determined only in the period T2, the period T4, the period T6, the period T8, and the period T10, in which the 9th transistor 109 is on in synchronization with the clock signal CLK.

<Period T1 (see FIG. 23)>

First, as shown in the period T1 in FIG. 22, a case where the H potential (VDD) is input as the input signal A to the first input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other (the first input terminal).

Accordingly, the gate of the 5th transistor 105 (the node 11), the gate of the 6th transistor 106 (the node 12), the gate of the 7th transistor 107 (the node 13), and the gate of the 8th transistor 108 (the node 14) are charged with the H potential (VDD) which is the same as that of the input signal A.

Since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110, the input terminal which inputs an input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other (the second input terminal).

Accordingly, the gate of the 14th transistor 114 (the node 15), the gate of the 15th transistor 115 (the node 16), the gate of the 16th transistor 116 (the node 17), and the gate of the 17th transistor 117 (the node 18) are charged with the L potential (VSS) that is the same as that of the signal AB having the phase opposite to the input signal A.

As described above, in the period T1, the node 11, the node 12, the node 13, the node 14, the node 15, the node 16, the node 17, and the node 18 are charged with the potential corresponding to the input signal A and the potential corresponding to the signal AB having the phase opposite to that of the input signal A, and the node A and the node D are charged with the H potential (VDD).

<Period T2 (see FIG. 24)>

Next, as shown in the period T2 in FIG. 22, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the H potential (VDD) is accumulated in the node 11, when the 1st transistor 101 is off, the charge corresponding to the H potential (VDD) is retained in the node 11 (charge retention operation). Further, the 5th transistor 105 is turned on in response to the potential of the node 11. Since charge corresponding to the H potential (VDD) is accumulated in the node 12, when the 2nd transistor 102 is off, the charge corresponding to the H potential (VDD) is retained in the node 12 (charge retention operation). Further, the 6th transistor 106 is turned on in response to the potential of the node 12. Since charge corresponding to the H potential (VDD) is accumulated in the node 13, when the 3rd transistor 103 is off, the charge corresponding to the H potential (VDD) is retained in the node 13 (charge retention operation). Further, the 7th transistor 107 is turned on in response to the potential of the node 13. Since charge corresponding to the H potential (VDD) is accumulated in the node 14, when the 4th transistor 104 is off, the charge corresponding to the H potential (VDD) is retained in the node 14 (charge retention operation). Further, the 8th transistor 108 is turned on in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the L potential (VSS) is accumulated in the node 15, when the 10th transistor 110 is off, the charge corresponding to the L potential (VSS) is retained in the node 15 (charge retention operation). Further, the 14th transistor 114 is turned off in response to the potential of the node 15. Since charge corresponding to the L potential (VSS) is accumulated in the node 16, when the 11th transistor 111 is off, the charge corresponding to the L potential (VSS) is retained in the node 16 (charge retention operation). Further, the 15th transistor 115 is turned off in response to the potential of the node 16. Since charge corresponding to the L potential (VSS) is accumulated in the node 17, when the 12th transistor 112 is off, the charge corresponding to the L potential (VSS) is retained in the node 17 (charge retention operation). Further, the 16th transistor 116 is turned off in response to the potential of the node 17. Since charge corresponding to the L potential (VSS) is accumulated in the node 18, when the 13th transistor 113 is off, the charge corresponding to the L poten- tial (VSS) is retained in the node 18 (charge retention operation). Further, the 17th transistor 117 is turned off in response to the potential of the node 18.

At this time, current flows in the region 50 and the region 51 but does not flow in the region 52 and the region 53. Therefore, the H potential (VDD) accumulated in the node D is extracted to the reference potential (GND) of the node G via the region 50 or the region 51 and the 9th transistor 109. In short, current flows from the node D to the node G.

Since current flows from the node D to the node G, the potential of the node D is gradually reduced from the H potential (VDD) to the L potential (VSS). As a result, the L potential (VSS) is applied to the gate of the 20th transistor 120, so that the 20th transistor 120 (p-channel) is turned on. At this time, the potential of the node A is determined, and the output signal OUT has the H potential (VDD).

As described above, in the period T2, the H potential (VDD) which is the same as that of the input signal A is determined and output as the output signal OUT.

<Period T3 (see FIG. 23)>

First, as shown in the period T3 in FIG. 22, a case where the L potential (VSS) is input as the input signal A to the first input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101, the input terminal which inputs an input signal to the one of the source and the drain of the 2nd transistor 102, the input terminal which inputs an input signal to the one of the source and the drain of the 3rd transistor 103, and the input terminal which inputs an input signal to the one of the source and the drain of the 4th transistor 104 are electrically connected to each other (the first input terminal).

Accordingly, the gate of the 5th transistor 105 (the node 11), the gate of the 6th transistor 106 (the node 12), the gate of the 7th transistor 107 (the node 13), and the gate of the 8th transistor 108 (the node 14) are charged with the L potential (VSS) which is the same as that of the input signal A.

Further, since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110, the input terminal which inputs an input signal to the one of the source and the drain of the 11th transistor 111, the input terminal which inputs an input signal to the one of the source and the drain of the 12th transistor 112, and the input terminal which inputs an input signal to the one of the source and the drain of the 13th transistor 113 are electrically connected to each other (the second input terminal).

Accordingly, the gate of the 14th transistor 114 (the node 15), the gate of the 15th transistor 115 (the node 16), the gate of the 16th transistor 116 (the node 17), and the gate of the 17th transistor 117 (the node 18) are charged with the H potential (VDD) that is the same as that of the signal AB having the phase opposite to that of the input signal A.

As described above, in the period T3, the node 11, the node 12, the node 13, the node 14, the node 15, the node 16, the node 17, and the node 18 are charged with the potential corresponding to the input signal A and the potential corresponding to the signal AB having the phase opposite to that of the input signal A, and the node A and the node D are charged with the H potential (VDD).

<Period T4 (see FIG. 25)>

Next, as shown in the period T4 in FIG. 22, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the L potential (VSS) is accumulated in the node 11, when the 1st transistor 101 is off, the charge corresponding to the L potential (VSS) is retained in the node 11 (charge retention operation). Further, the 5th transistor 105 is turned off in response to the potential of the node 11. Since charge corresponding to the L potential (VSS) is accumulated in the node 12, when the 2nd transistor 102 is off, the charge corresponding to the L potential (VSS) is retained in the node 12 (charge retention operation). Further, the 6th transistor 106 is turned off in response to the potential of the node 12. Since charge corresponding to the L potential (VSS) is accumulated in the node 13, when the 3rd transistor 103 is off, the charge corresponding to the L potential (VSS) is retained in the node 13 (charge retention operation). Further, the 7th transistor 107 is turned off in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the H potential (VDD) is accumulated in the node 15, when the 10th transistor 110 is off, the charge corresponding to the H potential (VDD) is retained in the node 15 (charge retention operation). Further, the 14th transistor 114 is turned on in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the H potential (VDD) is accumulated in the node 17, when the 12th transistor 112 is off, the charge corresponding to the H potential (VDD) is retained in the node 17 (charge retention operation).

Further, the 16th transistor 116 is turned on in response to the potential of the node 17. Since charge corresponding to the H potential (VDD) is accumulated in the node 18, when the 13th transistor 113 is off, the charge corresponding to the H potential (VDD) is retained in the node 18 (charge retention operation). Further, the 17th transistor 117 is turned on in response to the potential of the node 18.

At this time, current flows in the region 52 and the region 53 but does not flow in the region 50 and the region 51. Therefore, the H potential (VDD) accumulated in the node A is extracted to the reference potential (GND) of the node G via the region 52 or the region 53 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node A is determined and the output signal OUT has the L potential (VSS).

As described above, in the period T4, the L potential (VSS) which is the same as that of the input signal A is determined and output as the output signal OUT.

Operations in the period T5 and the period T6 are similar to those in the period T1 and the period T2. Operations in the period T9 and the period T10 are also similar to those in the period T1 and the period T2. In the case where the H potential (VDD) is input as the input signal A to the first input terminal, current flows in the region 50 and the region 51 but does not flow in the region 52 and the region 53 as illustrated in FIG. 24. In short, current flows from the node D to the node G. As a result, the L potential (VSS) is applied to the gate of the 20th transistor 120, and thus the 20th transistor 120 (p-channel) is turned on. At this time, the potential of the node A is determined and the output signal OUT has the H potential (VDD).

As described above, the same potential as the H potential (VDD) that is the potential of the input signal A is determined and output as the output signal OUT in the period T6 and the period T10.

Operations in the period T7 and the period T8 are similar to those in the period T3 and the period T4. In the case where the L potential (VSS) is input as the input signal A to the first input terminal, current flows in the region 52 and the region 53 but does not flow in the region 50 and the region 51 as illustrated in FIG. 25. In short, current flows from the node A to the node G. As a result, the L potential (VSS) is applied to the gate of the 19th transistor 119, and thus the 19th transistor 119 (p-channel) is turned on. At this time, the potential of the node A is determined and the output signal OUT has the L potential (VSS).

As described above, in the period T8, the L potential (VSS) which is the same as that of the input signal A is determined and output as the output signal OUT.

FIG. 21, FIG. 22, FIG. 23, FIG. 24, and FIG. 25 show that a potential which is the same as the potential which is input as the input signal A is output as the output signal OUT. In the register circuit 400, in the case where the input signal A is set to the H potential (VDD), the H potential (VDD) that is the same as the potential of the input signal A which is input in that period is output as the output signal OUT; in the case where the input signal A is set to the L potential (VSS), the L potential (VSS) that is the same as the potential of the input signal A which is input in that period is output as the output signal OUT.

Thus, the four input terminals closer to the region 50 and the region 51 are electrically connected to each other and the four input terminals closer to the region 52 and the region 53 are electrically connected to each other, thereby achieving the register circuit which outputs, as an output signal, a potential which is the same as the potential of the input signal input to the first input terminal.

According to this embodiment, increase in the number of paths of leakage current in the register circuit can be suppressed. Accordingly, the power consumption of the register circuit can be reduced.

According to this embodiment, the register circuit can retain data even when power supply is stopped.

According to this embodiment, it is possible to stack the transistor including an oxide semiconductor and the transistor including a silicon semiconductor in the register circuit; therefore, the area of the circuit can be reduced.

This embodiment can be appropriately combined with any of the other embodiments in this specification.

Embodiment 3

In this embodiment, the input terminals in the logic circuit which is described in Embodiment 1 are combined. Specifically, one input terminal which determines the level of a gate potential of one of the transistors included in the region 50 and one input terminal which determines the level of a gate potential of one of the transistors included in the region 51 are electrically connected to each other. One input terminal which determines the level of a gate potential of the other of the transistors included in the region 50 and one input terminal which determines the level of a gate potential of the other of the transistors included in the region 51 are electrically connected to each other. Further, two input terminals which determine the levels of the gate potentials of the two transistors included in the region 52 are electrically connected to each other, and two input terminals which determine the levels of the gate potentials of the two transistors included in the region 53 are electrically connected to each other. In short, the eight input terminals are combined to form four input terminals. A given logic circuit (NAND circuit) which can be achieved by controlling input signals which are input to the input terminals and combining the input terminals will be described with reference to FIG. 26, FIG. 27, FIG. 28, FIG. 29, FIG. 30, and FIG. 31.

<NAND Circuit>

A NAND circuit which has a data retention function and whose power consumption is reduced is described with reference to FIG. 26, FIG. 27, FIG. 28, FIG. 29, FIG. 30, and FIG. 31.

<Structure of NAND Circuit 500>

Figure 26:
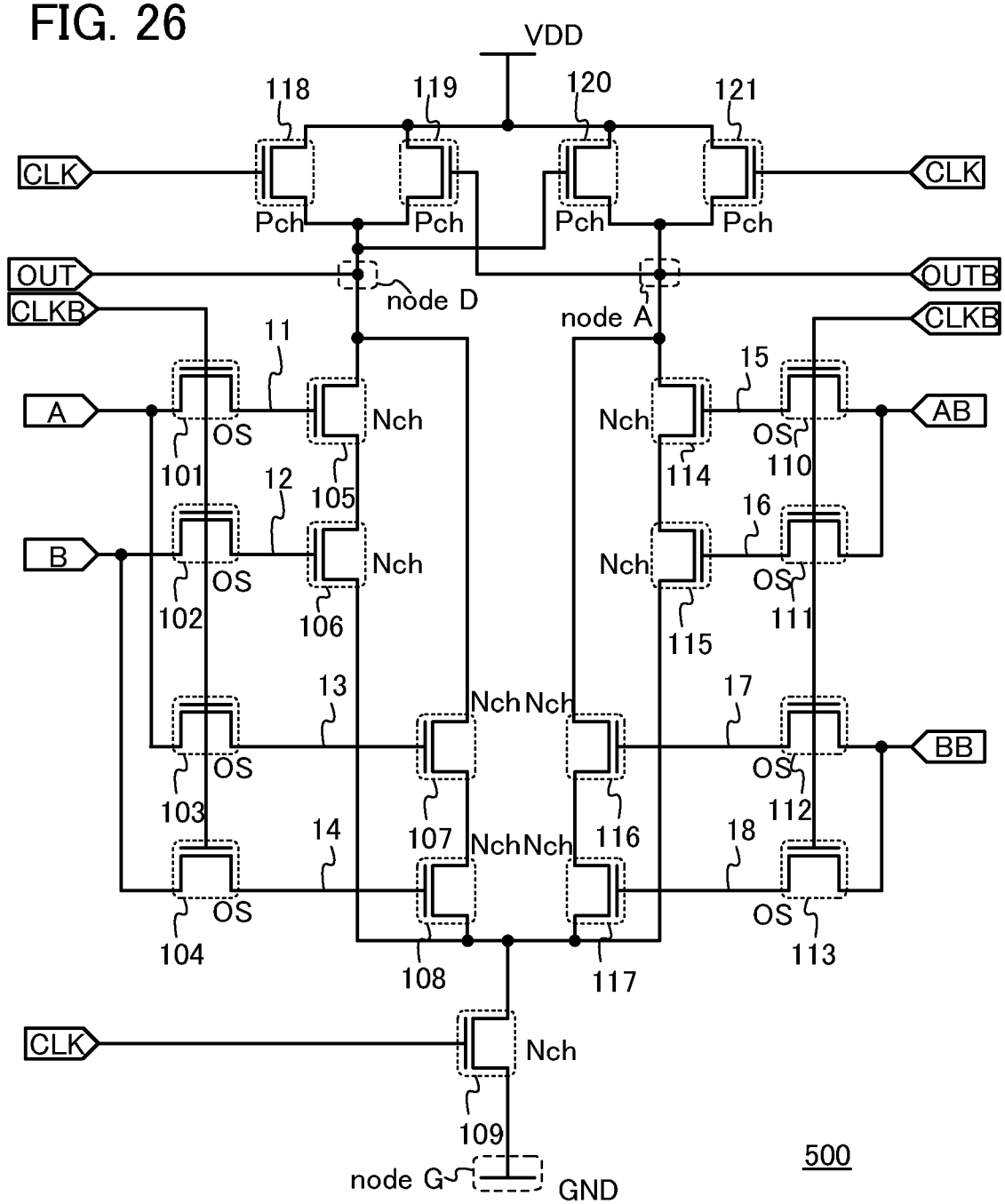
FIG. 26 illustrates a NAND circuit.

FIG. 26 is a circuit diagram of a NAND circuit of this embodiment. A NAND circuit 500 in FIG. 26 has a structure similar to that of the XOR circuit 100 in FIG. 1, in which the input terminal that inputs an input signal to the one of the source and the drain of the 1st transistor 101 and the input terminal that inputs an input signal to the one of the source and the drain of the 3rd transistor 103 are electrically connected to each other. The electrically connected input terminals are referred to a first input terminal. In addition, the input terminal which inputs an input signal to the one of the source and the drain of the 2nd transistor 102 and the input terminal which inputs an input signal to the one of the source and the drain of the 4th transistor 104 are electrically connected to each other. The electrically connected input terminals are referred to as a second input terminal.

In other words, the signal BB that has the phase opposite to that of the input signal B and is input to the one of the source and the drain of the 2nd transistor 102 is replaced with the input signal B, and the signal AB that has the phase opposite to that of the input signal A and is input to the one of the source and the drain of the 3rd transistor 103 is replaced with the input signal A. Note that the signal which is input to the one of the source and the drain of the 1st transistor 101 and the signal which is input to the one of the source and the drain of the 4th transistor 104 are the same as those in the XOR circuit 100 in FIG. 1.

The input terminal which inputs an input signal to the one of the source and the drain of the 10th transistor 110 and the input terminal which inputs an input signal to the one of the source and the drain of the 11th transistor 111 are electrically connected to each other. The electrically connected input terminals are referred to as a third input terminal. In addition, the input terminal which inputs an input signal to the one of the source and the drain of the 12th transistor 112 and the input terminal which inputs an input signal to the one of the source and the drain of the 13th transistor 113 are electrically connected to each other. The electrically connected input terminals are referred to as a fourth input terminal.

In other words, the signal BB that has the phase opposite to that of the input signal B and is input to the one of the source and the drain of the 11th transistor 111 is replaced with the signal AB having the phase opposite to that of the input signal A, and the input signal A which is input to the one of the source and the drain of the 12th transistor 112 and the input signal B which is input to the one of the source and the drain of the 13th transistor 113 are replaced with the signal BB having the phase opposite to that of the input signal B. Note that the signal which is input to the one of the source and the drain of the 10th transistor 110 is the same as that in the XOR circuit 100 in FIG. 1.

In the NAND circuit 500, when the gates of the transistors including an oxide semiconductor are closed, there is only one path for leakage current, which goes from the power supply potential VDD terminal to the reference potential GND terminal; therefore, power consumption of the NAND circuit 500 can be reduced.

The NAND circuit 500 does not lose data even when the supply of the power supply potential VDD is stopped. In other words, the NAND circuit 500 is a nonvolatile memory circuit. Since data is not lost even when the supply of the power supply potential VDD is stopped, it is possible to stop the supply of the power supply potential VDD when the gates of the transistors including an oxide semiconductor are closed in the NAND circuit 500. Therefore, the power consumption of the nonvolatile NAND circuit 500 can be reduced.

Further, in the NAND circuit 500, the transistor including an oxide semiconductor and the transistor including a silicon semiconductor can be stacked (which is described later). Therefore, it is possible to reduce the area of the NAND circuit 500.

<Operation of NAND Circuit 500>

Figure 27:
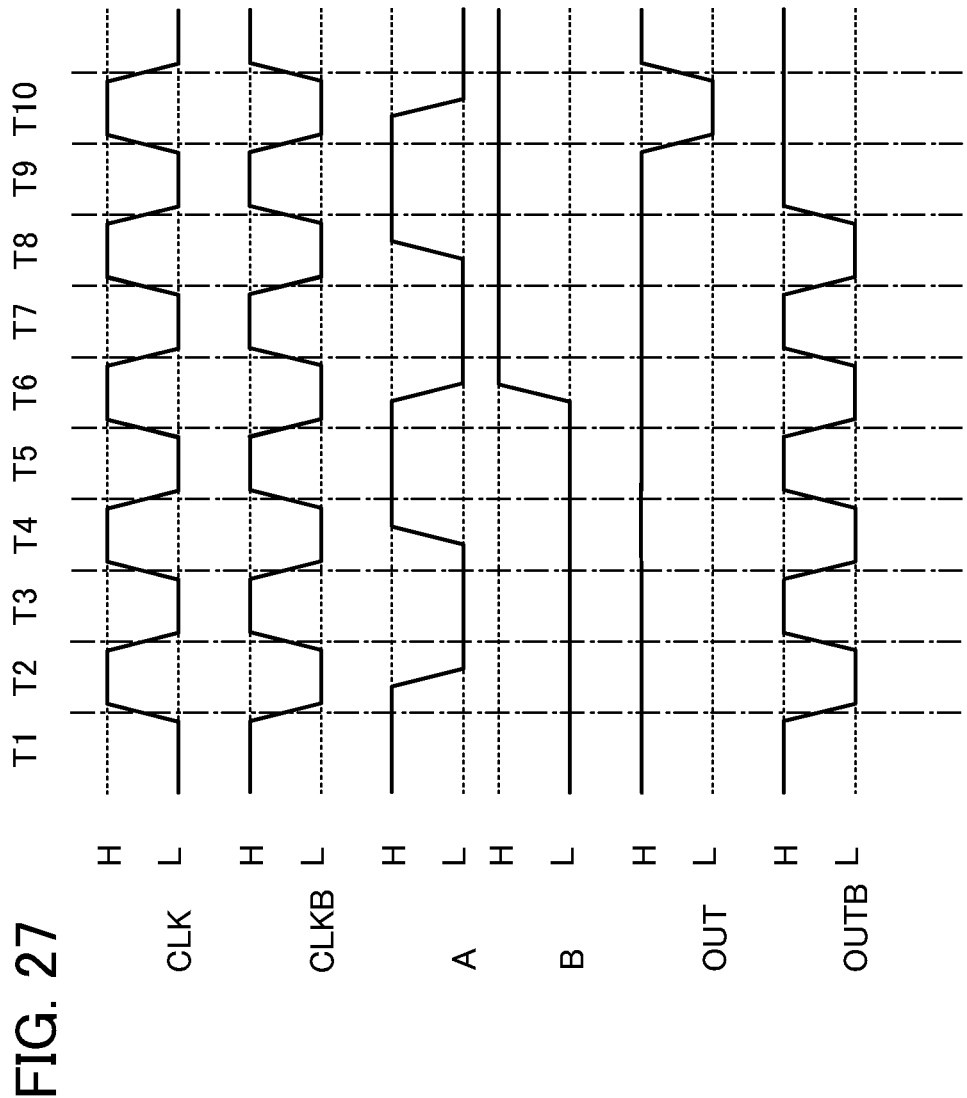
FIG. 27 is a timing chart of a NAND circuit.
Figure 28:
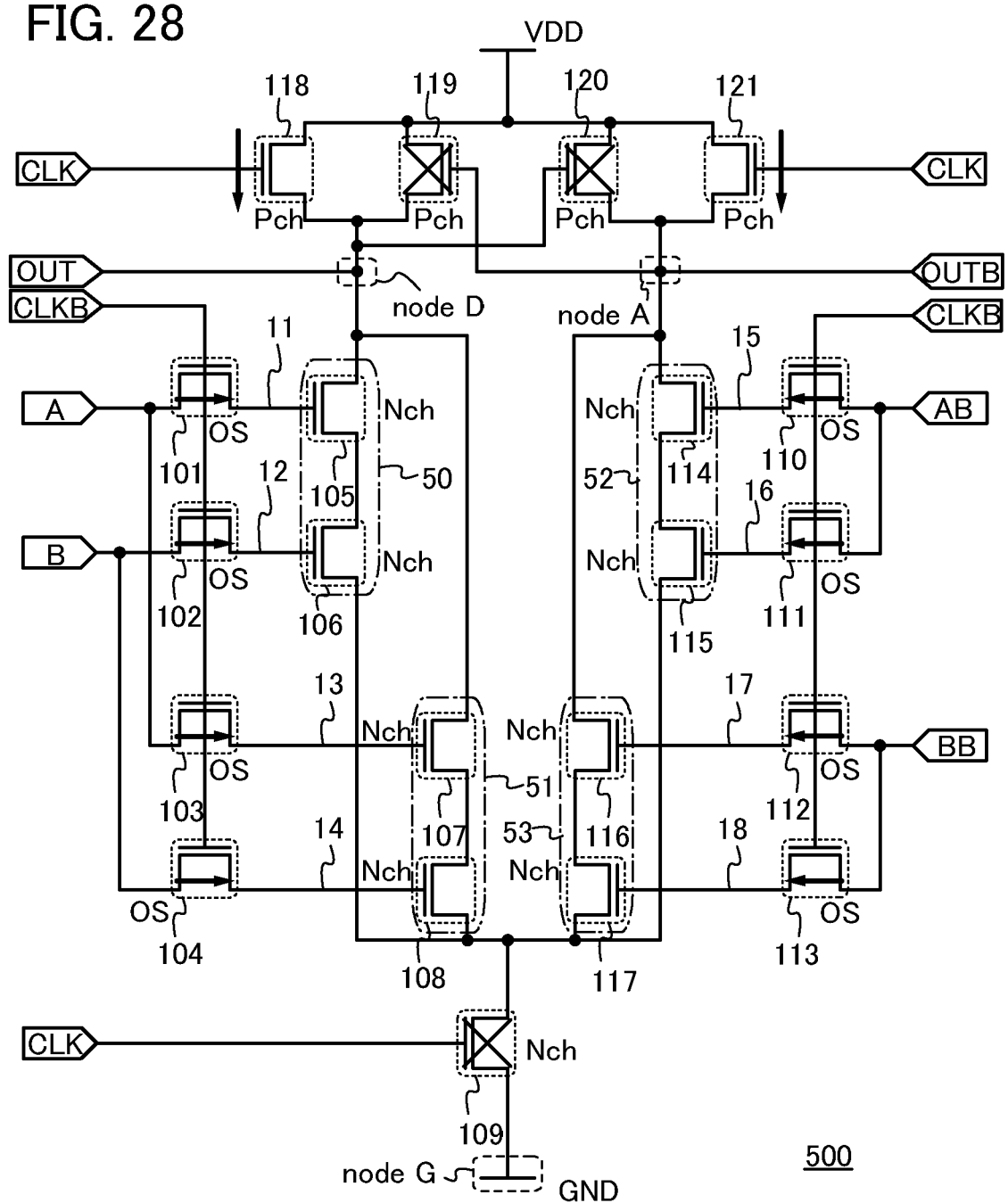
FIG. 28 shows operation of a NAND circuit.
Figure 29:
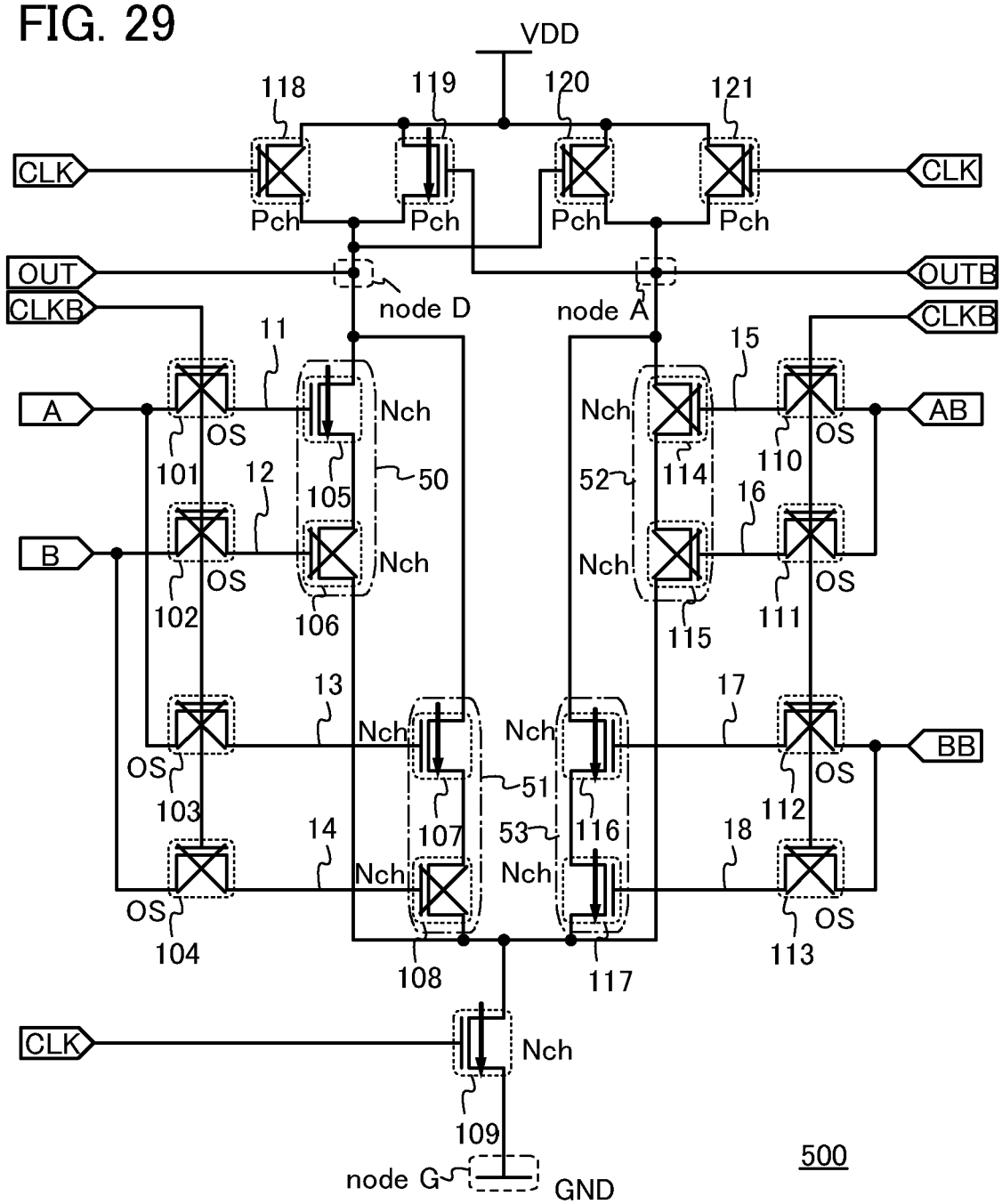
FIG. 29 shows operation of a NAND circuit.
Figure 30:
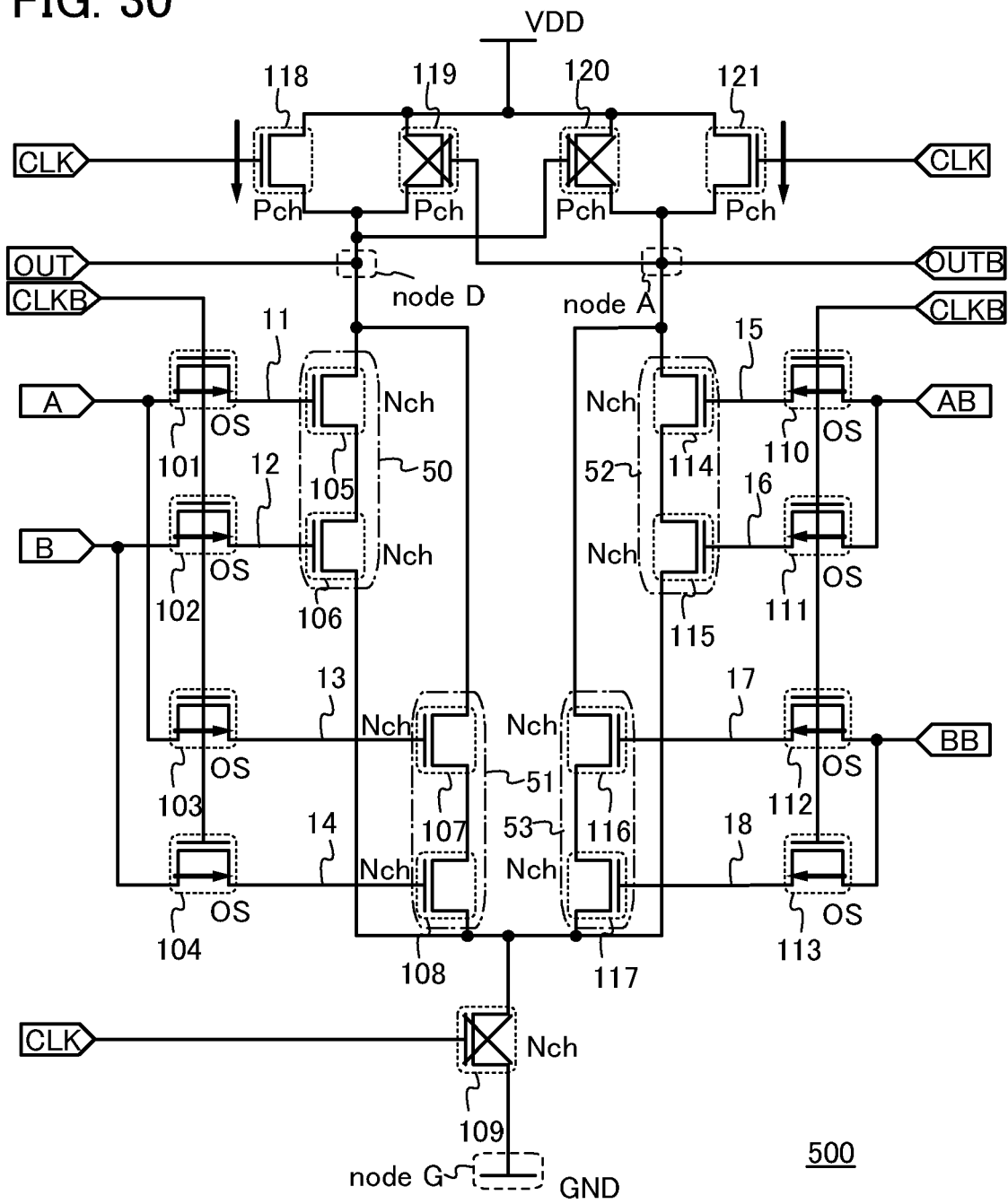
FIG. 30 shows operation of a NAND circuit.
Figure 31:
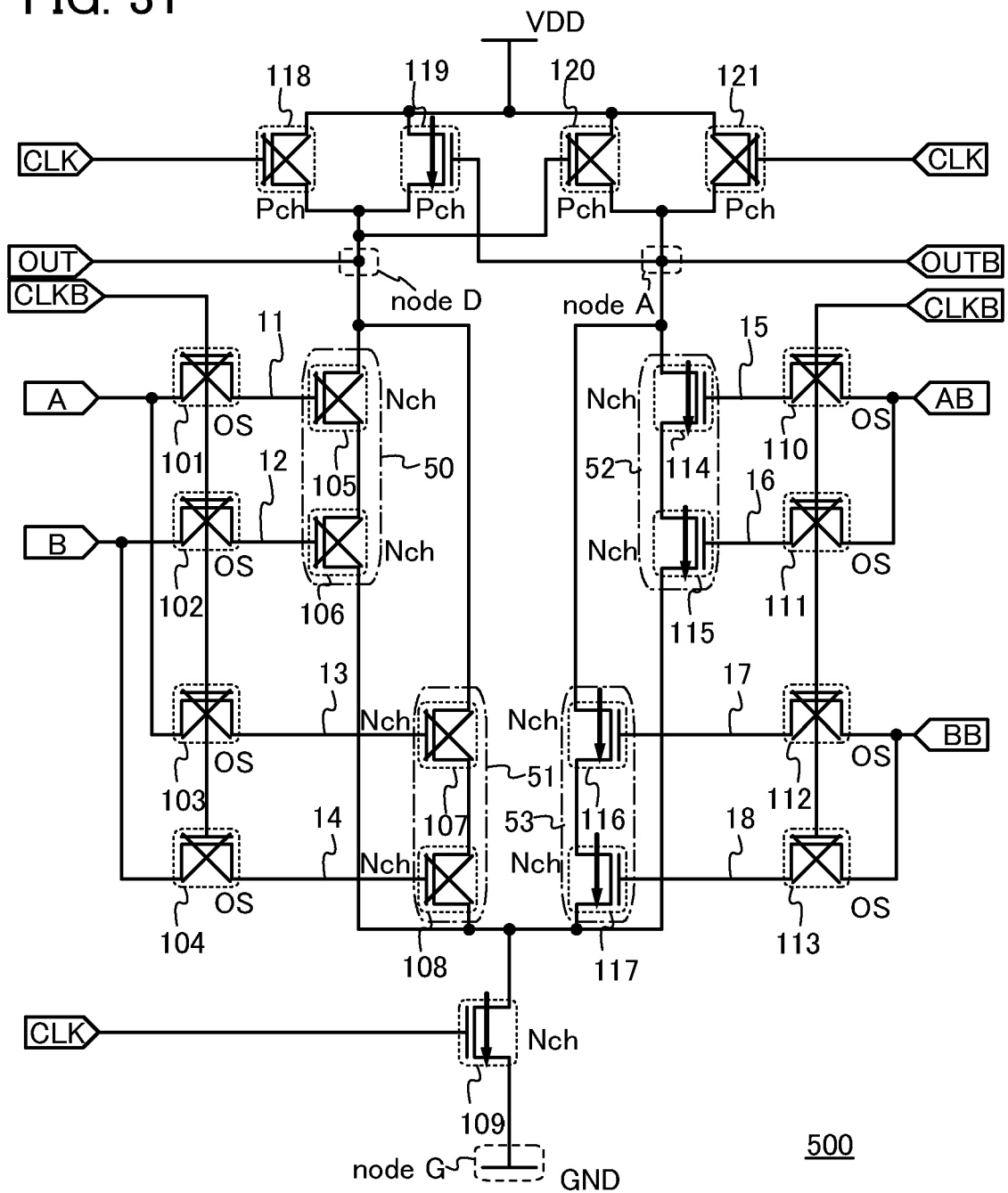
FIG. 31 shows operation of a NAND circuit.

The operation of the NAND circuit 500 is described with reference to FIG. 27, FIG. 28, FIG. 29, FIG. 30, and FIG. 31. FIG. 27 shows a timing chart of the NAND circuit 500. In the timing chart in FIG. 27, a period is divided into a period T1, a period T2, a period T3, a period T4, a period T5, a period T6, a period T7, a period T8, a period T9, and a period T10. FIG. 28, FIG. 29, FIG. 30, and FIG. 31 show operation states of the NAND circuit 500 in the period T1, the period T2, the period T3, and the period T4, respectively.

The NAND circuit 500 is a clock synchronization circuit and functions as a NAND circuit when the same clock signal CLK is input to the 18th transistor 118, the 21st transistor 121, and the 9th transistor 109. Note that the output signal OUT is determined only in the period T2, the period T4, the period T6, the period T8, and the period T10, in which the 9th transistor 109 is on in synchronization with the clock signal CLK.

<Period T1 (see FIG. 28)>

First, as shown in the period T1 in FIG. 27, a case where the H potential (VDD) is input as the input signal A to the first input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101 and the input terminal which inputs an input signal to the one of the source and the drain of the 3rd transistor 103 are electrically connected to each other (the first input terminal). The input terminal which inputs an input signal to the one of the source and the drain of the 2nd transistor 102 and the input terminal which inputs an input signal to the one of the source and the drain of the 4th transistor 104 are electrically connected to each other (the second input terminal).

Accordingly, the gate of the 5th transistor 105 (the node 11) and the gate of the 7th transistor 107 (the node 13) are charged with the H potential (VDD) which is the same as that of the input signal A, and the gate of the 6th transistor 106 (the node 12) and the gate of the 8th transistor 108 (the node 14) are charged with the L potential (VSS) which is the same as that of the input signal B.

Since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110 and the input terminal which inputs an input signal to the one of the source and the drain of the 11th transistor 111 are electrically connected to each other (the third input terminal). The input terminal which inputs an input signal to the one of the source and the drain of the 12th transistor 112 and the input terminal which inputs an input signal to the one of the source and the drain of the 13th transistor 113 are electrically connected to each other (the fourth input terminal).

Accordingly, the gate of the 14th transistor 114 (the node 15) and the gate of the 15th transistor 115 (the node 16) are charged with the L potential (VSS) that is the same as that of the signal AB having the phase opposite to that of the input signal A. The gate of the 16th transistor 116 (the node 17) and the gate of the 17th transistor 117 (the node 18) are charged with the H potential (VDD) that is the same as that of the signal BB having the phase opposite to that of the input signal B.

As described above, in the period T1, the node 11, the node 12, the node 13, the node 14, the node 15, the node 16, the node 17, and the node 18 are charged with the potentials corresponding to the input signal A, the potentials corresponding to the signal AB having the phase opposite to that of the input signal A, the potentials corresponding to the input signal B, and the potentials corresponding to the signal AB having the phase opposite to that of the input signal BB, and the node A and the node D are charged with the H potential (VDD).

<Period T2 (see FIG. 29)>

Next, as shown in the period T2 in FIG. 27, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the H potential (VDD) is accumulated in the node 11, when the 1st transistor 101 is off, the charge corresponding to the H potential (VDD) is retained in the node 11 (charge retention operation). Further, the 5th transistor 105 is turned on in response to the potential of the node 11. Since charge corresponding to the L potential (VSS) is accumulated in the node 12, when the 2nd transistor 102 is off, the charge corresponding to the L potential (VSS) is retained in the node 12 (charge retention operation). Further, the 6th transistor 106 is turned off in response to the potential of the node 12. Since charge corresponding to the H potential (VDD) is accumulated in the node 13, when the 3rd transistor 103 is off, the charge corresponding to the H potential (VDD) is retained in the node 13 (charge retention operation). Further, the 7th transistor 107 is turned on in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the L potential (VSS) is accumulated in the node 15, when the 10th transistor 110 is off, the charge corresponding to the L potential (VSS) is retained in the node 15 (charge retention operation). Further, the 14th transistor 114 is turned off in response to the potential of the node 15. Since charge corresponding to the L potential (VSS) is accumulated in the node 16, when the 11th transistor 111 is off, the charge corresponding to the L potential (VSS) is retained in the node 16 (charge retention operation). Further, the 15th transistor 115 is turned off in response to the potential of the node 16. Since charge corresponding to the H potential (VDD) is accumulated in the node 17, when the 12th transistor 112 is off, the charge corresponding to the H potential (VDD) is retained in the node 17 (charge retention operation). Further, the 16th transistor 116 is turned on in response to the potential of the node 17. Since charge corresponding to the H potential (VDD) is accumulated in the node 18, when the 13th transistor 113 is off, the charge corresponding to the H potential (VDD) is retained in the node 18 (charge retention operation). Further, the 17th transistor 117 is turned on in response to the potential of the node 18.

At this time, current flows in the region 53 but does not flow in the region 50, the region 51, and the region 52. Therefore, the H potential (VDD) accumulated in the node A is extracted to the reference potential (GND) of the node G via the region 53 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node D is determined, and the output signal OUT has the H potential (VDD).

In this manner, in the period T2, the output signal OUT at the H potential (VDD) is determined in response to the input of the input signal A at the H potential (VDD) and the input of the input signal B at the L potential (VSS).

<Period T3 (see FIG. 30)>

First, as shown in the period T3 in FIG. 27, a case where the L potential (VSS) is input as the input signal A to the second input terminal is given. At this time, the clock signal CLK is set to the L potential (VSS), and thus the L potential (VSS) is applied to the gate of the 18th transistor 118 and the gate of the 21st transistor 121. Accordingly, the 18th transistor 118 (p-channel) and the 21st transistor 121 (p-channel) are turned on. At this time, the H potential (VDD) flows into the node A and the node D (precharge operation). The 18th transistor 118 and the 21st transistor 121 are provided to control whether the node A and the node D are charged with the H potential (VDD).

In addition, the 9th transistor 109 (n-channel) is turned off.

The signal CLKB having the phase opposite to that of the clock signal CLK is set to the H potential (VDD), and thus the 1st transistor 101, the 2nd transistor 102, the 3rd transistor 103, and the 4th transistor 104 are turned on. The input terminal which inputs an input signal to the one of the source and the drain of the 1st transistor 101 and the input terminal which inputs an input signal to the one of the source and the drain of the 3rd transistor 103 are electrically connected to each other (the first input terminal). The input terminal which inputs an input signal to the one of the source and the drain of the 2nd transistor 102 and the input terminal which inputs an input signal to the one of the source and the drain of the 4th transistor 104 are electrically connected to each other (the second input terminal).

Accordingly, the gate of the 5th transistor 105 (the node 11) and the gate of the 7th transistor 107 (the node 13) are charged with the L potential (VSS) which is the same as that of the input signal A, and the gate of the 6th transistor 106 (the node 12) and the gate of the 8th transistor 108 (the node 14) are charged with the L potential (VSS) which is the same as that of the input signal B.

Since the signal CLKB having the phase opposite to that of the clock signal CLK is set to the H potential (VDD), the 10th transistor 110, the 11th transistor 111, the 12th transistor 112, and the 13th transistor 113 are turned on. The input terminal which inputs an input signal to the one of the source and the drain of the 10th transistor 110 and the input terminal which inputs an input signal to the one of the source and the drain of the 11th transistor 111 are electrically connected to each other (the third input terminal). The input terminal which inputs an input signal to the one of the source and the drain of the 12th transistor 112 and the input terminal which inputs an input signal to the one of the source and the drain of the 13th transistor 113 are electrically connected to each other (the fourth input terminal).

Accordingly, the gate of the 14th transistor 114 (the node 15) and the gate of the 15th transistor 115 (the node 16) are charged with the H potential (VDD) that is the same as that of the signal AB having the phase opposite to that of the input signal A. The gate of the 16th transistor 116 (the node 17) and the gate of the 17th transistor 117 (the node 18) are charged with the H potential (VDD) that is the same as that of the signal BB having the phase opposite to the input signal B.

As described above, in the period T1, the node 11, the node 12, the node 13, the node 14, the node 15, the node 16, the node 17, and the node 18 are charged with the potentials corresponding to the input signal A and the potentials corresponding to the signal AB having the phase opposite to that of the input signal A, the potentials corresponding to the input signal B, and the potentials corresponding to the signal AB having the phase opposite to that of the input signal BB, and the node A and the node D are charged with the H potential (VDD).

<Period T4 (see FIG. 31)>

Next, as shown in the period T4 in FIG. 27, the clock signal CLK is set to the H potential (VDD), and thus the H potential (VDD) is applied to the gate of the 18th transistor 118, the gate of the 21st transistor 121, and the gate of the 9th transistor 109. At this time, the 18th transistor 118 (p-channel) and the 21st transistor 121 (p-channel) are turned off. Since the 21st transistor 121 is turned off, the H potential (VDD) is not supplied to the node A. Therefore, the node A keeps the H potential (VDD). In addition, since the 18th transistor 118 is turned off, the H potential (VDD) is not supplied to the node D. Therefore, the node D keeps the H potential (VDD).

The 9th transistor 109 (n-channel) is turned on.

On the other hand, the signal CLKB having the phase opposite to that of the clock signal CLK is set to the L potential (VSS), and thus the 1st transistor 101 (n-channel), the 2nd transistor 102 (n-channel), the 3rd transistor 103 (n-channel), and the 4th transistor 104 (n-channel) are turned off. Since charge corresponding to the L potential (VSS) is accumulated in the node 11, when the 1st transistor 101 is off, the charge corresponding to the L potential (VSS) is retained in the node 11 (charge retention operation). Further, the 5th transistor 105 is turned off in response to the potential of the node 11. Since charge corresponding to the L potential (VSS) is accumulated in the node 12, when the 2nd transistor 102 is off, the charge corresponding to the L potential (VSS) is retained in the node 12 (charge retention operation). Further, the 6th transistor 106 is turned off in response to the potential of the node 12. Since charge corresponding to the L potential (VSS) is accumulated in the node 13, when the 3rd transistor 103 is off, the charge corresponding to the L potential (VSS) is retained in the node 13 (charge retention operation). Further, the 7th transistor 107 is turned off in response to the potential of the node 13. Since charge corresponding to the L potential (VSS) is accumulated in the node 14, when the 4th transistor 104 is off, the charge corresponding to the L potential (VSS) is retained in the node 14 (charge retention operation). Further, the 8th transistor 108 is turned off in response to the potential of the node 14.

In a similar manner, since the signal CLKB having the phase opposite to that of the clock signal CLK is set to the L potential (VSS), the 10th transistor 110 (n-channel), the 11th transistor 111 (n-channel), the 12th transistor 112, and the 13th transistor 113 (n-channel) are turned off. Since charge corresponding to the H potential (VDD) is accumulated in the node 15, when the 10th transistor 110 is off, the charge corresponding to the H potential (VDD) is retained in the node 15 (charge retention operation). Further, the 14th transistor 114 is turned on in response to the potential of the node 15. Since charge corresponding to the H potential (VDD) is accumulated in the node 16, when the 11th transistor 111 is off, the charge corresponding to the H potential (VDD) is retained in the node 16 (charge retention operation). Further, the 15th transistor 115 is turned on in response to the potential of the node 16. Since charge corresponding to the H potential (VDD) is accumulated in the node 17, when the 12th transistor 112 is off, the charge corresponding to the H potential (VDD) is retained in the node 17 (charge retention operation). Further, the 16th transistor 116 is turned on in response to the potential of the node 17. Since charge corresponding to the H potential (VDD) is accumulated in the node 18, when the 13th transistor 113 is off, the charge corresponding to the H potential (VDD) is retained in the node 18 (charge retention operation). Further, the 17th transistor 117 is turned on in response to the potential of the node 18.

At this time, current flows in the region 52 and the region 53 but does not flow in the region 50 and the region 51. Therefore, the H potential (VDD) accumulated in the node A is extracted to the reference potential (GND) of the node G via the region 52 or the region 53 and the 9th transistor 109. In short, current flows from the node A to the node G.

Since current flows from the node A to the node G, the potential of the node A is gradually reduced from the H potential (VDD) to the L potential (VSS). As a result, the L potential (VSS) is applied to the gate of the 19th transistor 119, so that the 19th transistor 119 (p-channel) is turned on. At this time, the potential of the node D is determined, and the output signal OUT has the H potential (VDD).

In this manner, in the period T4, the output signal OUT at the H potential (VDD) is determined in response to the input of the input signal A at the L potential (VSS) and the input of the input signal B at the L potential (VSS).

In other words, when the L potential (VSS) is input as either the input signal A or the input signal B, the node A is always set to the L potential. Since a potential which is opposite to the potential of the node A is supplied to the node D, the output signal OUT is always set to the H potential (VDD) at this time. When the H potential (VDD) is input as both the input signals, the node D is always set to the L potential (VSS), and the output signal OUT is always set to the L potential (VSS) at this time. The NAND circuit is configured to operate in this manner.

Operations in the period T5 and the period T6 are similar to those in the period T1 and the period T2. Operations in the period T7 and the period T8 correspond to the operations in the period T1 and the period T2 in the case where the L potential (VSS) and the H potential (VDD) are input as the input signal A and the input signal B, respectively. Operations in the period T9 and the period T10 correspond to the operations in the period T3 and the period T4 in the case where the H potential (VDD) is input as the input signal A and the input signal B.

According to this embodiment, increase in the number of paths of leakage current in the NAND circuit can be suppressed. Accordingly, the power consumption of the NAND circuit can be reduced.

According to this embodiment, the NAND circuit can retain data even when power supply is stopped.

According to this embodiment, it is possible to stack the transistor including an oxide semiconductor and the transistor including a silicon semiconductor in the NAND circuit; therefore, the area of the circuit can be reduced.

This embodiment can be appropriately combined with any of the other embodiments in this specification.

Embodiment 4

In this embodiment, a transistor including an oxide semiconductor which is used for any of Embodiments 1 to 3 will be described.

Figure 50A:
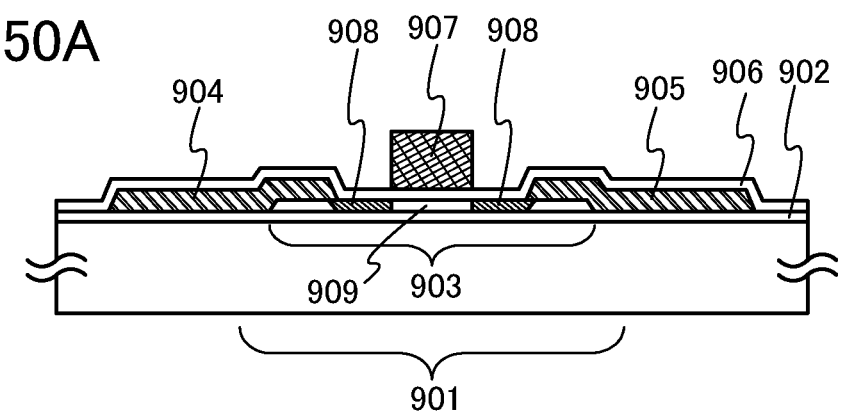
FIGS. 50A and 50B are cross-sectional views of transistors.

A transistor 901 including an oxide semiconductor illustrated in FIG. 50A includes an oxide semiconductor layer 903 that is formed over an insulating film 902 and functions as a semiconductor layer; a source electrode 904 and a drain electrode 905 that are formed over the oxide semiconductor layer 903; a gate insulating film 906 that is formed over the oxide semiconductor layer 903, the source electrode 904, and the drain electrode 905; and a gate electrode 907 that overlaps with the oxide semiconductor layer 903 over the gate insulating film 906.

The transistor 901 including an oxide semiconductor illustrated in FIG. 50A is a top-gate transistor in which the gate electrode 907 is formed over the oxide semiconductor layer 903 and also is a top-contact transistor in which the source electrode 904 and the drain electrode 905 are formed over the oxide semiconductor layer 903. The source electrode 904 and the drain electrode 905 do not overlap with the gate electrode 907 in the transistor 901 including an oxide semiconductor. That is, a distance between the source electrode 904 and the gate electrode 907 and a distance between the drain electrode 905 and the gate electrode 907 are each larger than the thickness of the gate insulating film 906. Therefore, in the transistor 901 including an oxide semiconductor, a parasitic capacitance which is generated between the gate electrode 907 and each of the source electrode 904 and the drain electrode 905 can be small, so that the transistor 901 can operate at high speed.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel formation region 909 which overlaps with the gate electrode 907 with the gate insulating film 906 provided therebetween. In the oxide semiconductor layer 903, the channel formation region 909 is provided between the pair of high-concentration regions 908. The dopant for forming the high-concentration regions 908 can be added by an ion implantation method. A rare gas such as helium, argon, and xenon; an atom belonging to Group 15, such as nitrogen, phosphorus, arsenic, and antimony; or the like can be used as the dopant.

For example, when nitrogen is used as the dopant, it is preferable that the high-concentration regions 908 contain nitrogen atoms at a concentration higher than or equal to $5 \times 10^{19}/cm^3$ and lower than or equal to $1 \times 10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be reduced.

In addition, by reducing the resistance between the source electrode 904 and the drain electrode 905, high on-state current and high-speed operation can be ensured even when the transistor 901 including an oxide semiconductor is miniaturized. Accordingly, when the transistor is used in a logic circuit, the area of the logic circuit can be reduced, so that a semiconductor integrated circuit can be miniaturized.

Figure 50B:
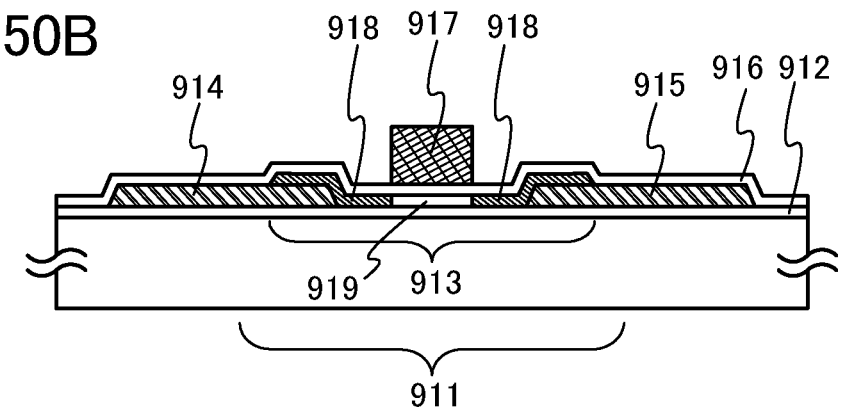

A transistor 911 including an oxide semiconductor illustrated in FIG. 50B includes a source electrode 914 and a drain electrode 915 that are formed over an insulating film 912; an oxide semiconductor layer 913 that is formed over insulating film 912, the source electrode 914, and the drain electrode 915 and functions as a semiconductor layer; a gate insulating film 916 that is formed over the oxide semiconductor layer 913, the source electrode 914, and the drain electrode 915; and a gate electrode 917 that overlaps with the oxide semiconductor layer 913 over the gate insulating film 916.

The transistor 911 including an oxide semiconductor illustrated in FIG. 50B is a top-gate transistor in which the gate electrode 917 is formed over the oxide semiconductor layer 913 and is also a bottom-contact transistor in which the source electrode 914 and the drain electrode 915 are formed below the oxide semiconductor layer 913. As in the transistor 901, the source electrode 914 and the drain electrode 915 do not overlap with the gate electrode 917 in the transistor 911. Thus, a parasitic capacitance generated between the gate electrode 917 and each of the source electrode 914 and the drain electrode 915 can be small, so that the transistor 911 can operate at high speed. In addition, a data retention function per unit area can be improved in the logic circuit.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 provided therebetween. In the oxide semiconductor layer 913, the channel formation region 919 is provided between the pair of high-concentration regions 918.

The high-concentration regions 918 can be formed by an ion implantation method in a similar manner to the case of the high-concentration regions 908 included in the transistor 901. The case of the high-concentration regions 908 can be referred to for the kind of the dopant for forming the high-concentration regions 918.

The high-concentration regions 918 to which the dopant imparting n-type conductivity is added have higher conductivity than the other regions in the oxide semiconductor layer 913. Thus, by providing the high-concentration regions 918 in the oxide semiconductor layer 913, resistance between the source electrode 914 and the drain electrode 915 can be reduced.

When the resistance between the source electrode 914 and the drain electrode 915 is reduced, high on-state current and high-speed operation can be ensured even when the transistor 911 including an oxide semiconductor is miniaturized. Accordingly, when the transistor is used for a logic circuit, the area of the logic circuit can be reduced, so that a semiconductor integrated circuit can be miniaturized. Further, a data retention function per unit area in the logic circuit can be improved.

As described above, any of the transistor 901 and the transistor 911 is applied to the transistor including an oxide semiconductor which is used in any of Embodiments 1 to 3, whereby a logic circuit whose data retention function per unit area is improved can be obtained. In addition, a NAND circuit or a NOR circuit whose logic circuit has a small area can be obtained.

Note that the structure of the transistor including an oxide semiconductor that is used in any of Embodiments 1 to 3 is not limited to this structure.

The methods and structures described in this embodiment can be combined as appropriate with any of the methods and structures described in the other embodiments.

Embodiment 5

In this embodiment, one mode of the structure of the logic circuit in any of Embodiments 1 to 3 will be described.

Figure 32:
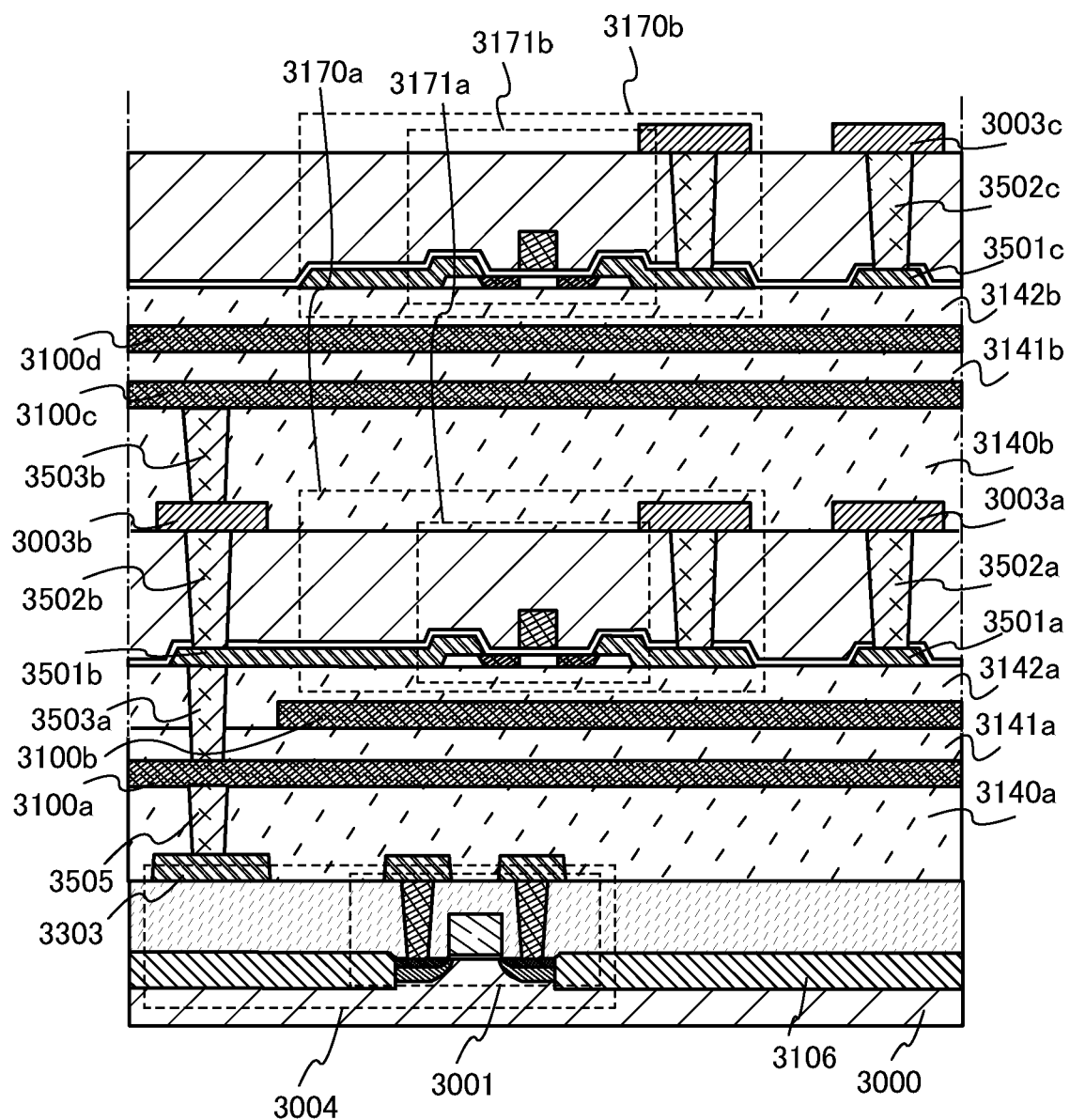
FIG. 32 is a cross-sectional view illustrating a structure of a logic circuit.

FIG. 32 is a cross-sectional view of a logic circuit. A memory device illustrated in FIG. 32 has a staked-layer structure, in which a memory element 3170a and a memory element 3170b which are formed in their respective layers are provided in a top portion, and a logic circuit 3004 is provided in a bottom portion. Note that there are no particular limitations on the number of memory elements, the number of layers in which the memory elements are formed, and the arrangement structure.

The "memory element" in this embodiment includes a transistor including an oxide semiconductor, and refers to an element which can retain data even when power supply is stopped. The memory element 3170a includes a transistor 3171a including an oxide semiconductor, and the memory element 3170b includes a transistor 3171b including an oxide semiconductor.

Although the same structure as the transistor 901 illustrated in FIG. 50A is applied to the transistor 3171a used in the memory element 3170a and the transistor 3171b used in the memory element 3170b in FIG. 32, this embodiment is not limited to the structure. Alternatively, the same structure as the transistor 911 illustrated in FIG. 50B may be used.

An electrode 3501a which is formed in the same layer as a source electrode and a drain electrode of the transistor 3171a is electrically connected to an electrode 3003a via an electrode 3502a. An electrode 3501c which is formed in the same layer as a source electrode and a drain electrode of the transistor 3171b is electrically connected to an electrode 3003c via an electrode 3502c.

The logic circuit 3004 includes a transistor 3001 including a silicon semiconductor. Note that the logic circuit 3004 may include a transistor including an oxide semiconductor or a transistor including a material other than an oxide semiconductor. The transistor including a silicon semiconductor may overlap with the transistor including an oxide semiconductor.

Further, the transistor 3001 is obtained in such a manner that an element separation insulating film 3106 is provided over a substrate 3000 including a semiconductor material (e.g., silicon) and a channel formation region is provided in a region surrounded by the element separation insulating film 3106. Note that the transistor 3001 may be a transistor in which the channel formation region is provided in a semiconductor film such as a silicon film formed on an insulating surface or a silicon film in an SOI substrate. Description of the transistor 3001 is omitted because a known structure can be used.

A wiring 3100a and a wiring 3100b are formed between a layer including the transistor 3171a and a layer including the transistor 3001. An insulating film 3140a is provided between the wiring 3100a and the layer including the transistor 3001. An insulating film 3141a is provided between the wiring 3100a and the wiring 3100b. An insulating film 3142a is provided between the wiring 3100b and the layer including the transistor 3171a.

Similarly, a wiring 3100c and a wiring 3100d are formed between a layer including the transistor 3171b and the layer including the transistor 3171a. An insulating film 3140b is provided between the wiring 3100c and the layer including the transistor 3171a. An insulating film 3141b is provided between the wiring 3100c and the wiring 3100d. An insulating film 3142b is provided between the wiring 3100d and the layer including the transistor 3171b.

The insulating films 3140a, 3141a, 3142a, 3140b, 3141b, and 3142b each function as an interlayer insulating film whose surface can be planarized.

Through the wiring 3100a, the wiring 3100b, the wiring 3100c, and the wiring 3100d, electrical connection between the memory elements, electrical connection between the logic circuit and the memory element, and the like can be established.

An electrode 3303 included in the logic circuit 3004, an electrode 3505, and an electrode 3503a allow the memory element provided in the top portion and the logic circuit provided in the bottom portion to be electrically connected to each other. For example, as illustrated in FIG. 32, the electrode 3303 can be electrically connected to the wiring 3100a via the electrode 3505. The electrode 3503a allows the wiring 3100a to be electrically connected to an electrode 3501b. In this manner, the electrode 3303 included in the logic circuit 3004 can be electrically connected to the source electrode or the drain electrode of the transistor 3171a included in the memory element 3170a.

An electrode 3502b allows the electrode 3501b to be electrically connected to an electrode 3003b. An electrode 3503b allows the electrode 3003b to be electrically connected to the wiring 3100c.

Although the electrode 3303 is electrically connected to the transistor 3171a via the wiring 3100a in FIG. 32, this embodiment is not limited thereto. The electrode 3303 may be electrically connected to the transistor 3171a via either the wiring 3100b, or the wiring 3100a and the wiring 3100b.

FIG. 32 illustrates the structure in which two wiring layers, i.e., a wiring layer including the wiring 3100a and a wiring layer including the wiring 3100b are provided between the layer including the transistor 3171a and the layer including the transistor 3001; however, the number of wiring layers provided therebetween is not limited to two. One wiring layer or three or more wiring layers may be provided between the layer including the transistor 3171a and the layer including the transistor 3001.

FIG. 32 illustrates the structure in which two wiring layers, i.e., a wiring layer including the wiring 3100c and a wiring layer including the wiring 3100d are provided between the layer including the memory element 3170a and the layer including the memory element 3170b; however, the number of wiring layers provided therebetween is not limited to two. One wiring layer may be provided or three or more wiring layers may be provided between the layer including the memory element 3170a and the layer including the memory element 3170b.

As described above, a transistor including an oxide semiconductor, which is included in a memory element, and a transistor including a silicon semiconductor, which is included in a logic circuit, are stacked, whereby the area of the logic circuit can be reduced and a semiconductor integrated circuit can be further miniaturized. In addition, it is possible to obtain a novel logic circuit which can retain data even when power supply is stopped. Note that there is no limitation on the stacked-layer structures of the transistors used in Embodiments 1 to 3.

This embodiment can be combined with any of the above embodiments as appropriate.

Embodiment 6

In this embodiment, a configuration of a central processing unit (CPU) which is one of signal processing circuits according to one embodiment of the disclosed invention will be described.

Figure 33:
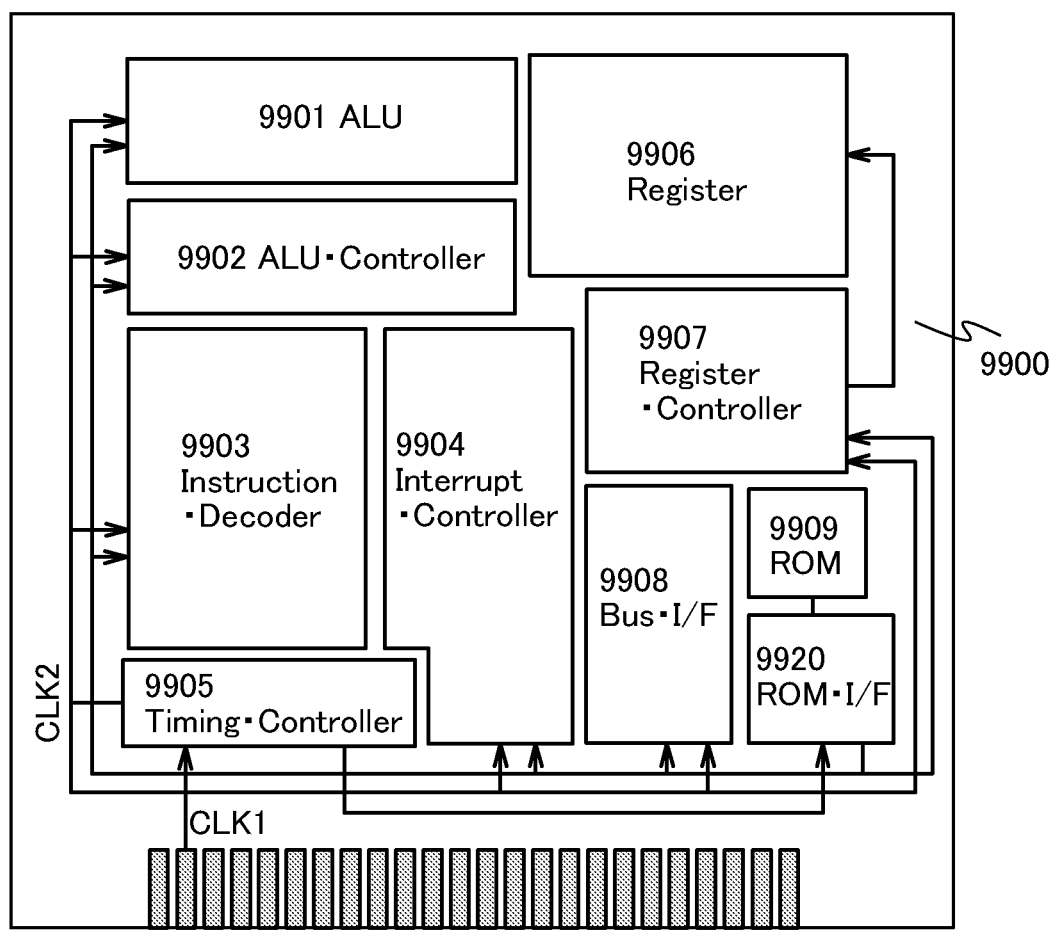
FIG. 33 is a block diagram of a CPU including a logic circuit.

FIG. 33 illustrates the structure of the CPU of this embodiment. The CPU illustrated in FIG. 33 mainly includes an ALU 9901, an ALU controller 9902, an instruction decoder 9903, an interrupt controller 9904, a timing controller 9905, a register 9906, a register controller 9907, a bus I/F 9908, a rewritable ROM 9909, and a ROM I/F 9920, over a substrate 9900. Note that "ALU" means "arithmetic logic unit", the "bus I/F" means "bus interface", and the "ROM I/F" means "ROM interface". Further, the ROM 9909 and the ROM I/F 9920 may be provided over different chips. Needless to say, the CPU illustrated in FIG. 33 is only an example having a simplified configuration, and an actual CPU may have various configurations depending on the uses.

An instruction which is input to the CPU via the bus I/F 9908 is input to the instruction decoder 9903 and decoded therein, and then input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the operation of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timing of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, the logic circuit described in any of Embodiments 1 to 3 is provided in the register 9906. When the logic circuit that retains data even when power supply is stopped is provided in the CPU of this embodiment, the data retention function can be improved and power consumption can be reduced. In addition, when the logic circuit whose area is reduced is provided in the CPU, the area of the CPU and the number of transistors included in the CPU can be reduced.

Although the CPU is described as an example in this embodiment, the signal processing circuit of one embodiment of the disclosed invention is not limited to the CPU and can be applied to an LSI such as a microprocessor, an image processing circuit, a DSP, or an FPGA.

This embodiment can be combined with any of the above embodiments as appropriate.

Embodiment 7

In this embodiment, a transistor including an oxide semiconductor which is used in one embodiment of the disclosed invention will be described in detail. Note that the transistor including an oxide semiconductor of this embodiment can be used for any of the transistors described in Embodiments 1 to 6.

An oxide semiconductor to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

In an oxide semiconductor having crystallinity, when a surface flatness is improved, higher mobility can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that the average surface roughness ($R_a$) is obtained by expanding, into three dimensions, center line average roughness that is defined by JIS B 0601 so as to be applied to a surface. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

An oxide having crystallinity is described below. Specifically, the oxide including a crystal with c-axis alignment (also referred to as c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 34A to 34E, FIGS. 35A to 35C, and FIGS. 36A to 36C. In FIGS. 34A to 34E, FIGS. 35A to 35C, and FIGS. 36A to 36C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 34A to 34E, O surrounded by a circle represents tetracoordinate O and O surrounded by a double circle represents tricoordinate O.

Figure 34A:
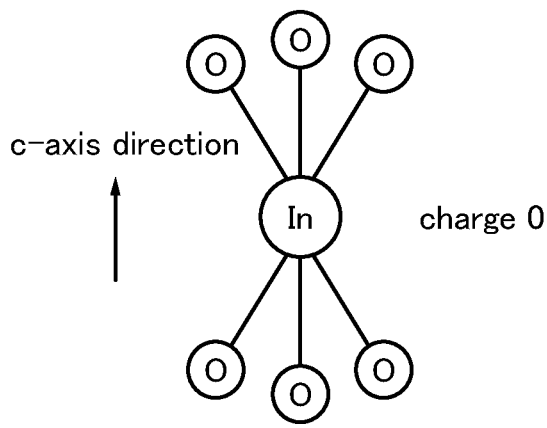
FIGS. 34A to 34E illustrate crystal structures of oxide materials.

FIG. 34A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 34A is actually an octahedral structure, but is illustrated as a planar structure for simplicity. Note that three tetracoordinate O atoms exist in each of an upper half and a lower half in FIG. 34A. In the small group illustrated in FIG. 34A, electric charge is 0.

Figure 34D:
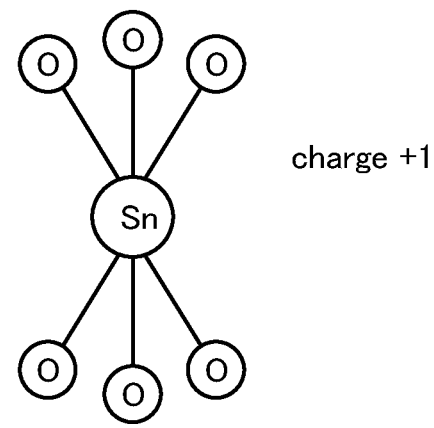
Figure 34B:
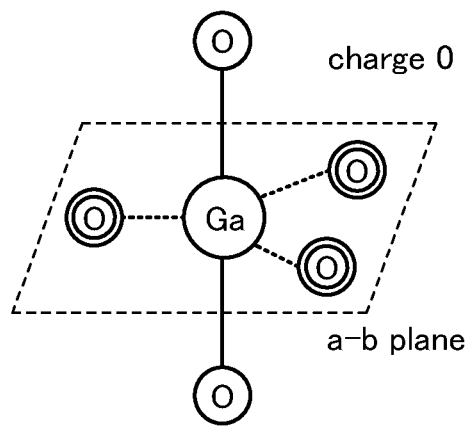

FIG. 34B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 34B. An In atom can also have the structure illustrated in FIG. 34B because an In atom can have five ligands. In the small group illustrated in FIG. 34B, electric charge is 0.

Figure 34E:
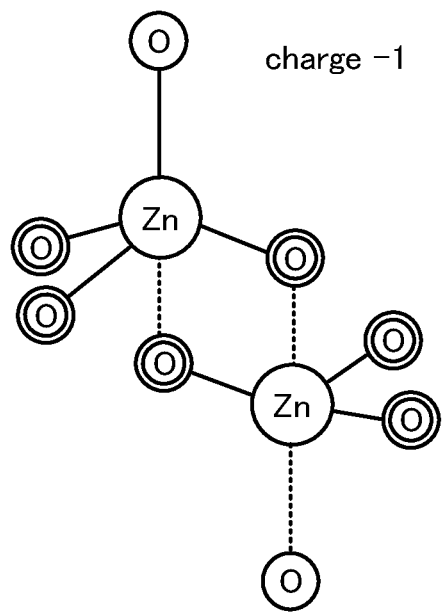
Figure 34C:
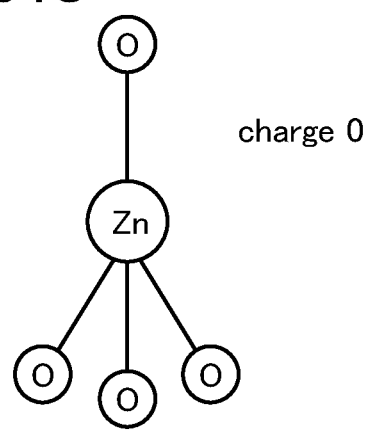

FIG. 34C illustrates a structure including one tetracoordinate Zn atom and four tetracoordinate O atoms proximate to the Zn atom. In FIG. 34C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 34C. In the small group illustrated in FIG. 34C, electric charge is 0.

FIG. 34D illustrates a structure including one hexacoordinate Sn atom and six tetracoordinate O atoms proximate to the Sn atom. In FIG. 34D, three tetracoordinate O atoms exist in each of an upper half and a lower half. In the small group illustrated in FIG. 34D, electric charge is +1.

FIG. 34E illustrates a small group including two Zn atoms. In FIG. 34E, one tetracoordinate O atom exists in each of an upper half and a lower half. In the small group illustrated in FIG. 34E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 34A each have three proximate In atoms in the downward direction, and the three O atoms in the lower half each have three proximate In atoms in the upward direction. The one O atom in the upper half with respect to the pentacoordinate Ga atom in FIG. 34B has one proximate Ga atom in the downward direction, and the one O atom in the lower half has one proximate Ga atom in the upward direction. The one O atom in the upper half with respect to the tetracoordinate Zn atom in FIG. 34C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 35A illustrates a model of a medium group included in a layered structure of an In—Sn—Zn—O-based material. FIG. 35B illustrates a large group including three medium groups. Note that FIG. 35C illustrates an atomic arrangement in the case where the layered structure in FIG. 35B is observed from the c-axis direction.

In FIG. 35A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 35A, one tetracoordinate O atom existing in each of an upper half and a lower half with respect to an In atom is denoted by circled 1. FIG. 35A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based oxide in FIG. 35A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 34E can be given. For example, with one small group including two Zn atoms, electric charge of one small group including a Sn atom can be cancelled, so that the total electric charge of the layered structure can be 0.

When the large group illustrated in FIG. 35B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

As an example, FIG. 36A illustrates a model of a medium group included in a layered structure of an In—Ga—Zn—O-based material.

In the medium group included in the layered structure of the In—Ga—Zn—O-based material in FIG. 36A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 36B illustrates a large group including three medium groups. Note that FIG. 36C illustrates an atomic arrangement in the case where the layered structure in FIG. 36B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 36A but also a medium group in which the arrangement of the In atom, the Ga atom, and the Zn atom is different from that in FIG. 36A.

When the large group illustrated in FIG. 36B is repeated, an In—Ga—Zn—O-based crystal can be obtained. Note that a layered structure of the obtained In—Ga—Zn—O-based crystal can be expressed as a composition formula, InGaO$_3$(ZnO)$_n$ (n is a natural number).

Figure 37A:
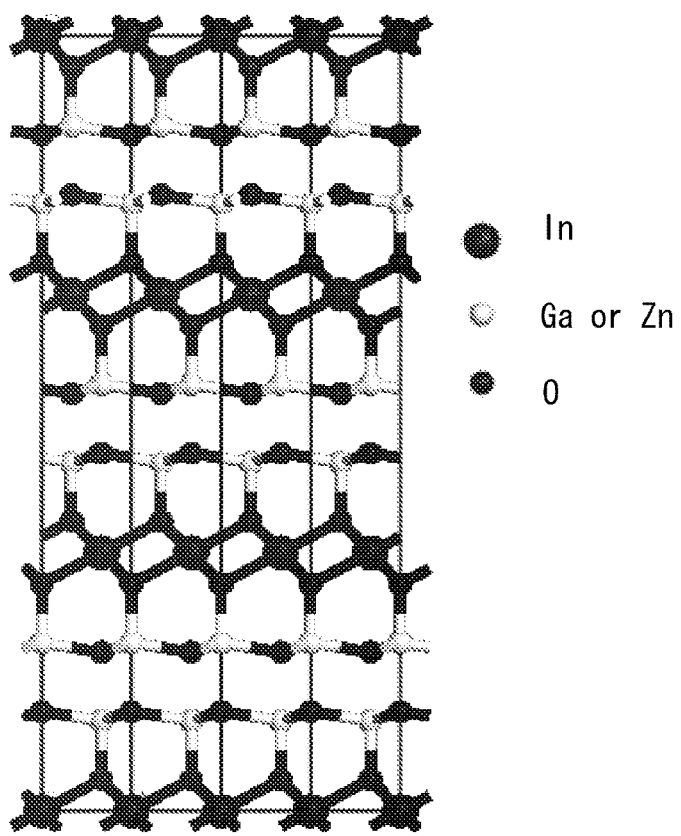
FIGS. 37A and 37B illustrate crystal structures of oxide materials.

In the case where n=1 (InGaZnO$_4$), a crystal structure illustrated in FIG. 37A can be obtained, for example. Note that in the crystal structure in FIG. 37A, since a Ga atom and an In atom each have five ligands as described in FIG. 34B, a structure in which Ga is replaced with In can be obtained.

Figure 37B:
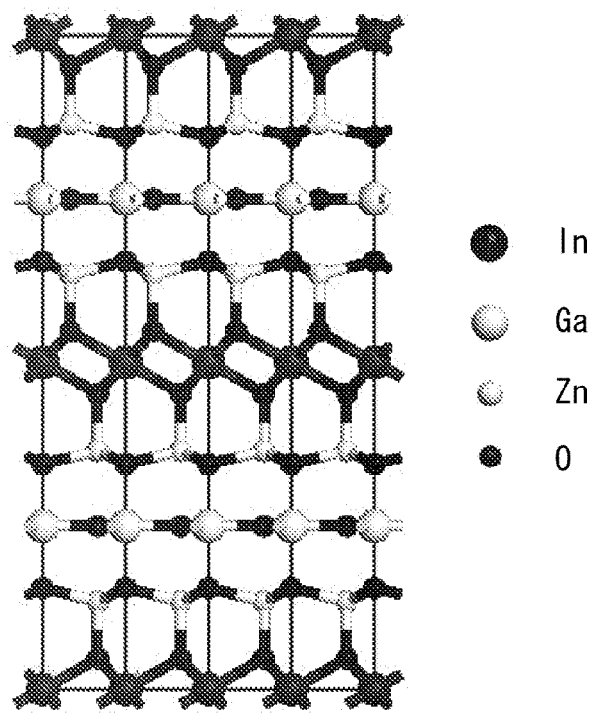

In the case where n=2 (InGaZn$_2$O$_5$), a crystal structure illustrated in FIG. 37B can be obtained, for example. Note that in the crystal structure in FIG. 37B, since a Ga atom and an In atom each have five ligands as described in FIG. 34B, a structure in which Ga is replaced with In can be obtained.

Embodiment 8

In this embodiment, mobility of a semiconductor used in the transistor described in any of Embodiments 1 to 3 will be described.

The actually measured field-effect mobility of an insulated gate transistor can be lower than its original mobility because of a variety of reasons; this phenomenon occurs not only in the case of an oxide semiconductor. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. Further, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 5]}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B} \exp\left(-\frac{x}{G}\right) \quad \text{[Formula 6]}$$

Here, D represents the electric field in the gate direction, and B and G are constants. Note that B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 38:
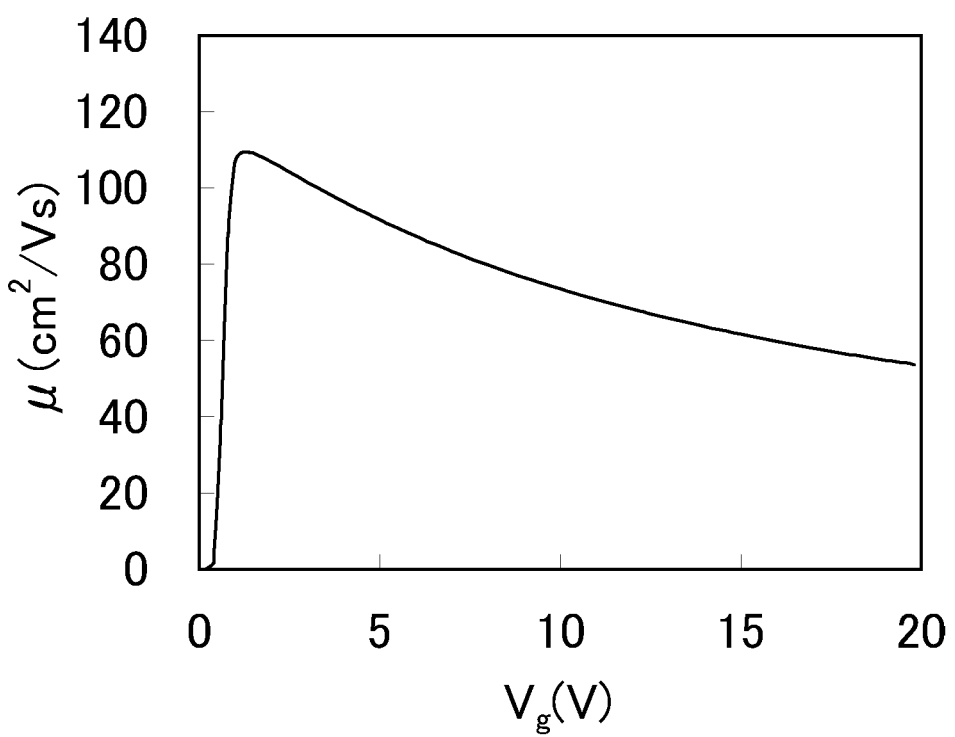
FIG. 38 shows gate voltage dependence of mobility obtained by calculation.

FIG. 38 shows calculation results of the field-effect mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 38, the field-effect mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 39A to 39C, FIGS. 40A to 40C, and FIGS. 41A to 41C. FIGS. 42A and 42B illustrate cross-sectional structures of the transistors used for the calculation. The transistors illustrated in FIGS. 42A and 42B each include a semiconductor region 403$a$ and a semiconductor region 403$c$ that have n$^+$-type conductivity in an oxide semiconductor layer. The resistivity of the semiconductor regions 403$a$ and 403$c$ is 2×10$^{-3}$ Ωcm.

The transistor in FIG. 42A includes a base insulating layer 401, an embedded insulator 402 that is embedded in the base insulating layer 401 and formed of aluminum oxide, the semiconductor region 403$a$, the semiconductor region 403$c$, an intrinsic semiconductor region 403$b$ that is placed between the semiconductor regions 403$a$ and 403$c$ and serves as a channel formation region, and a gate 405. The width of the gate 405 is 33 nm.

A gate insulating film 404 is formed between the gate 405 and the semiconductor region 403$b$. A sidewall insulator 406$a$ and a sidewall insulator 406$b$ are formed on both side surfaces of the gate 405, and an insulator 407 is formed over the gate 405 so as to prevent a short circuit between the gate 405 and another wiring. The sidewall insulator has a width of 5 nm. A source 408$a$ and a drain 408$b$ are provided in contact with the semiconductor region 403$a$ and the semiconductor region 403$c$, respectively. Note that the channel width of this transistor is 40 nm.

The transistor in FIG. 42B is the same as the transistor in FIG. 42A in that it includes the base insulating layer 401, the embedded insulator 402 formed of aluminum oxide, the semiconductor region 403$a$, the semiconductor region 403$c$, the intrinsic semiconductor region 403$b$ provided therebetween, the gate 405 having a width of 33 nm, the gate insulating film 404, the sidewall insulator 406$a$, the sidewall insulator 406$b$, the insulator 407, the source 408$a$, and the drain 408$b$.

The difference between the transistor in FIG. 42A and the transistor in FIG. 42B is the conductivity type of semiconductor regions under the sidewall insulators 406$a$ and 406$b$. In the transistor in FIG. 42A, the semiconductor regions under the sidewall insulator 406$a$ and the sidewall insulator 406$b$ are part of the semiconductor region 403$a$ having n$^+$-type conductivity and part of the semiconductor region 403$c$ having n$^+$-type conductivity, whereas in the transistor in FIG. 42B, the semiconductor regions under the sidewall insulator 406$a$ and the sidewall insulator 406$b$ are part of the intrinsic semiconductor region 403$b$. In other words, in the semiconductor layer of FIG. 42B, a region having a width of L$_{off}$ which overlaps with neither the semiconductor region 403$a$ (the semiconductor region 403$c$) nor the gate 405 is provided. This region is called an offset region, and the width L$_{off}$ is called an offset length. As is seen from the drawing, the offset length is equal to the width of the sidewall insulator 406$a$ (the sidewall insulator 406$b$)

Figure 39A:
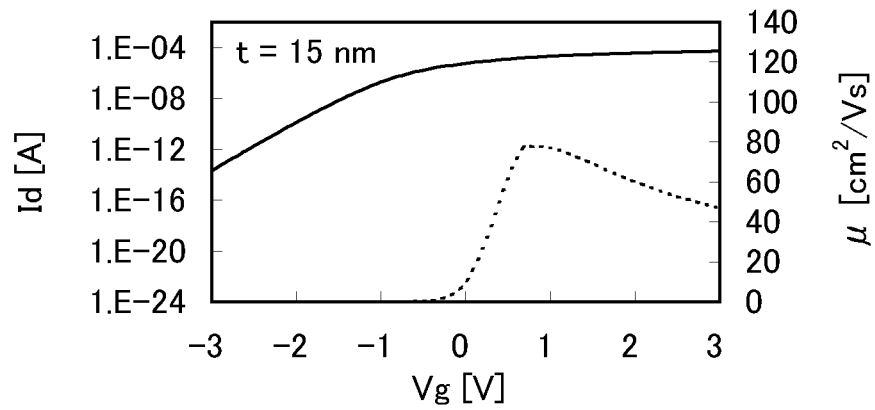
FIGS. 39A to 39C show gate voltage dependence of drain current and mobility obtained by calculation.
Figure 39B:
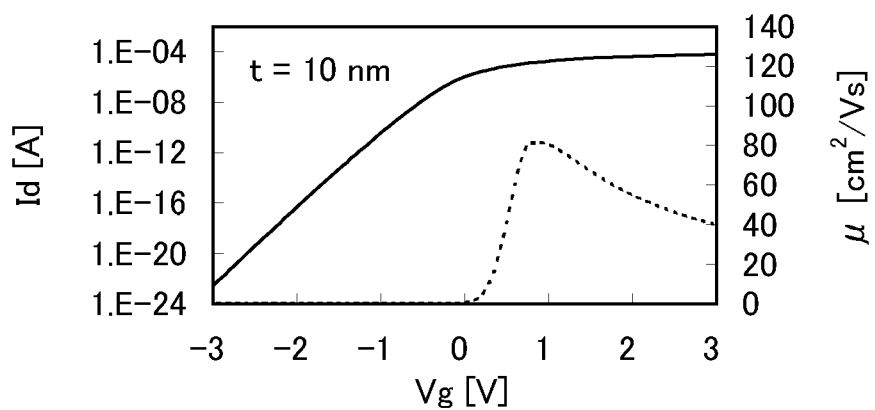
Figure 39C:
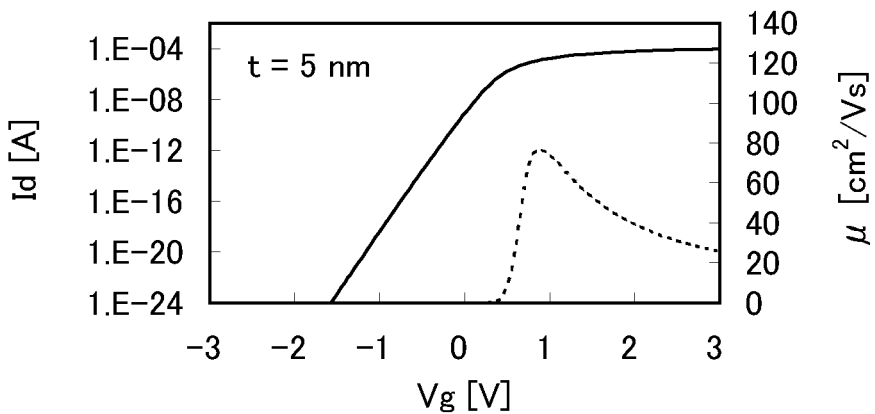

The other parameters used in calculation are as described above. For the calculation, device simulation software Sentaurus Device manufactured by Synopsys, Inc. was used. FIGS. 39A to 39C show the gate voltage (V$_g$: a potential difference between the gate and the source) dependence of the drain current (I$_d$, a solid line) and the field-effect mobility (μ, a dotted line) of the transistor having the structure illustrated in FIG. 42A. The drain current I$_d$ is obtained by calculation under the assumption that the drain voltage (a potential difference between the drain and the source) is +1 V, and the field-effect mobility μ is obtained by calculation under the assumption that the drain voltage is +0.1 V.

FIG. 39A shows the gate voltage dependence of the transistor in the case where the thickness of the gate insulating film is 15 nm, FIG. 39B shows that of the transistor in the case where the thickness of the gate insulating film is 10 nm, and FIG. 39C shows that of the transistor in the case where the thickness of the gate insulating film is 5 nm. As the gate insulating film is thinner, the drain current I$_d$ in an off state (the off-state current) in particular is significantly decreased. In contrast, there is no noticeable change in peak value of the field-effect mobility μ and the drain current I$_d$ in an on state (the on-state current). The graphs show that the drain current exceeds 10 μA at a gate voltage of around 1 V.

Figure 40A:
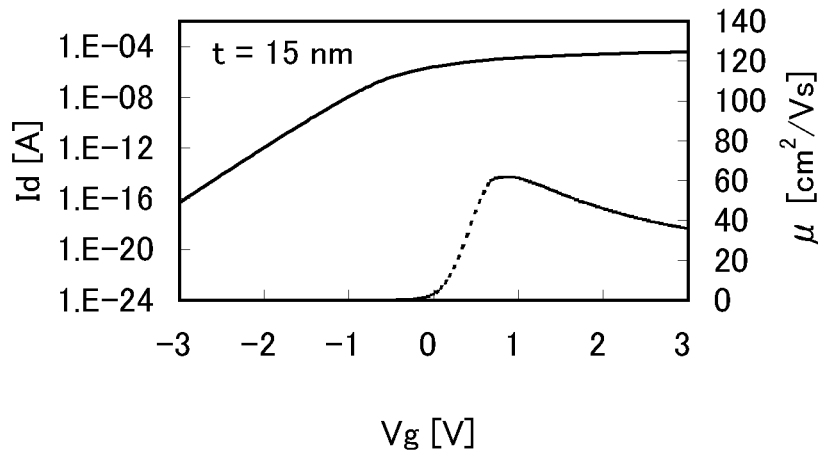
FIGS. 40A to 40C show gate voltage dependence of drain current and mobility obtained by calculation.
Figure 40B:
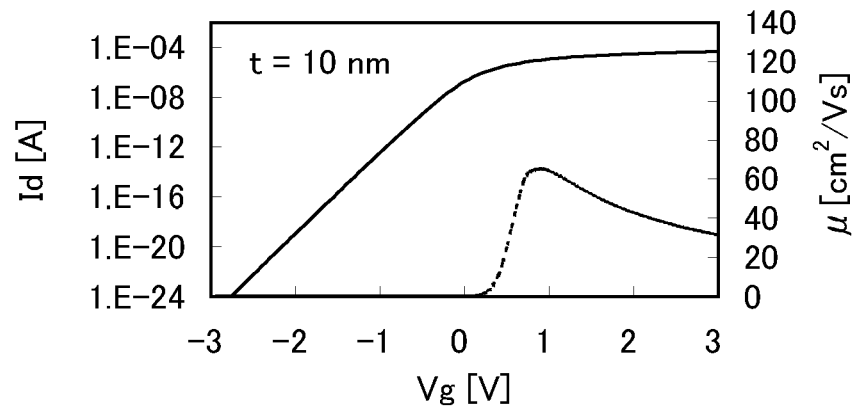
Figure 40C:
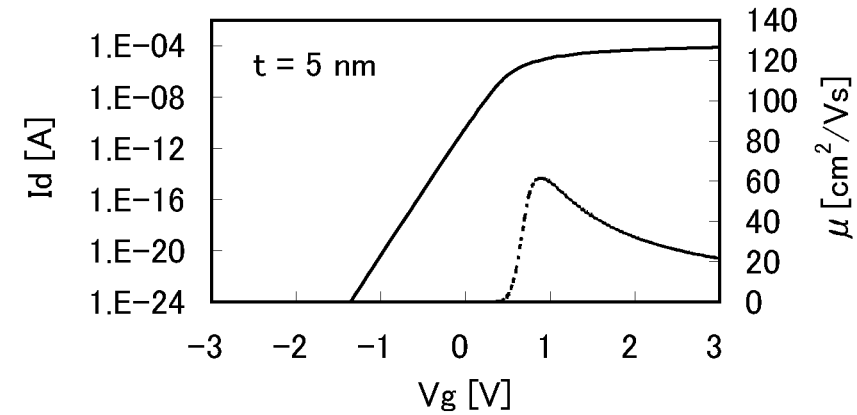

FIGS. 40A to 40C show the gate voltage V$_g$ dependence of the drain current I$_d$ (a solid line) and the field-effect mobility μ (a dotted line) of the transistor having the structure in FIG. 42B and an offset length L$_{off}$ of 5 nm. The drain current I$_d$ is obtained by calculation under the assumption that the drain voltage is +1 V, and the field-effect mobility μ is obtained by calculation under the assumption that the drain voltage is +0.1 V. FIG. 40A shows the gate voltage dependence of the transistor in the case where the thickness of the gate insulating film is 15 nm, FIG. 40B shows that of the transistor in the case where the thickness of the gate insulating film is 10 nm, and FIG. 40C shows that of the transistor in the case where the thickness of the gate insulating film is 5 nm.

Figure 41A:
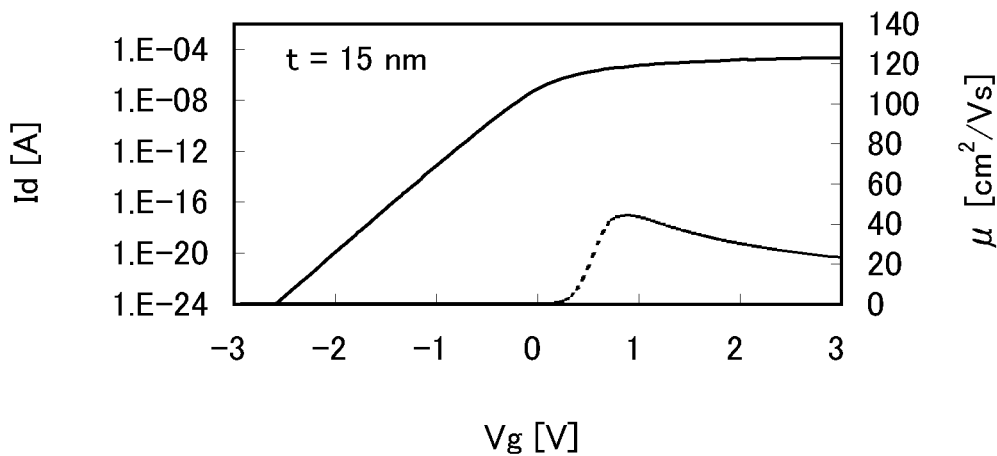
FIGS. 41A to 41C show gate voltage dependence of drain current and mobility obtained by calculation.
Figure 41B:
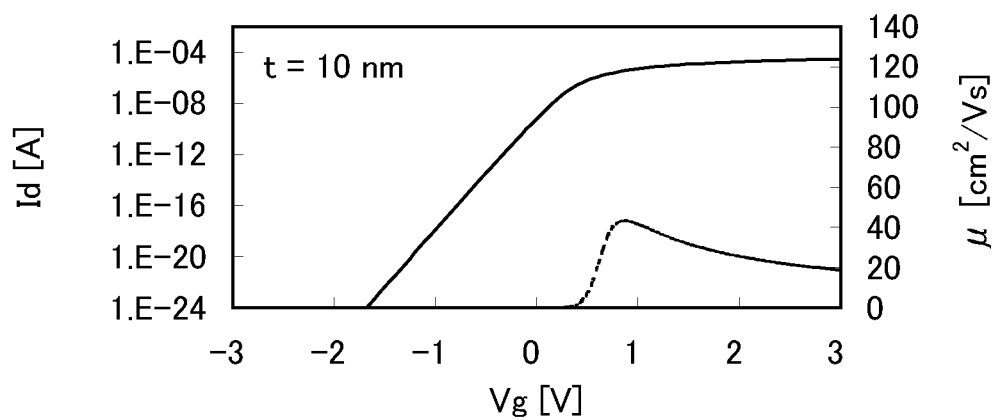
Figure 41C:
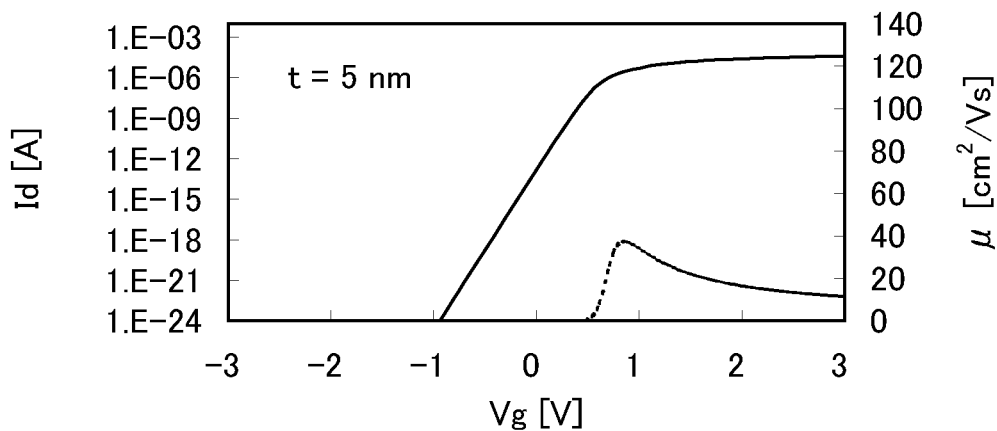
Figure 42A:
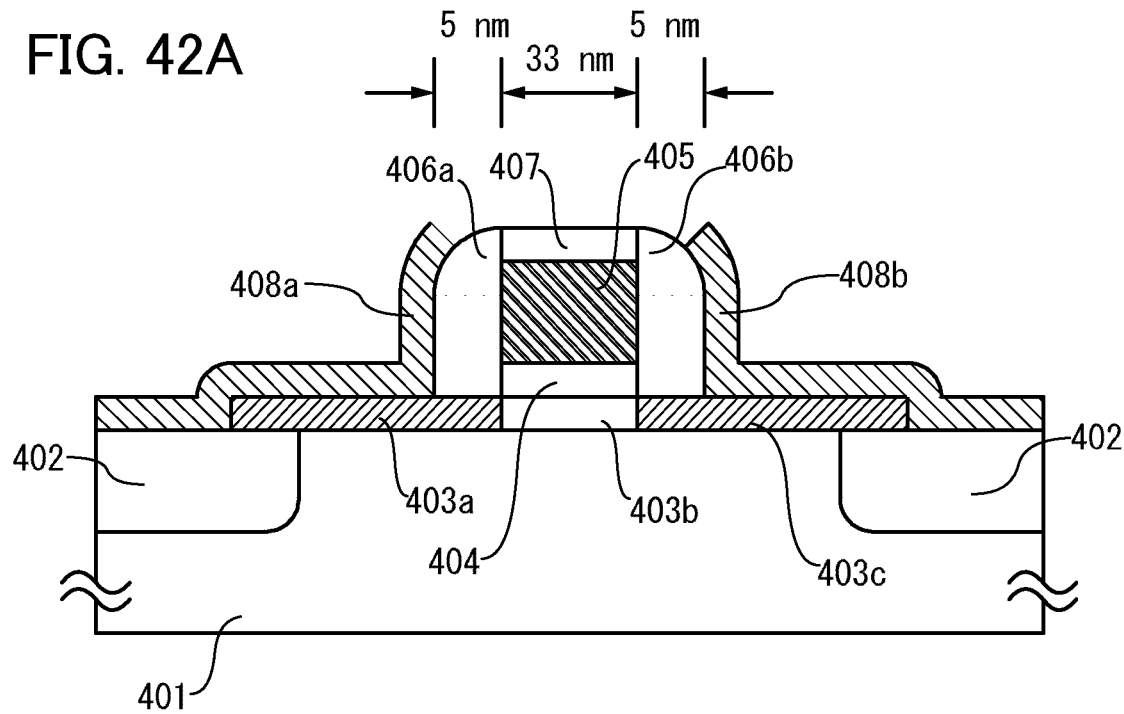
FIGS. 42A and 42B illustrate cross-sectional structures of transistors used for calculation.
Figure 42B:
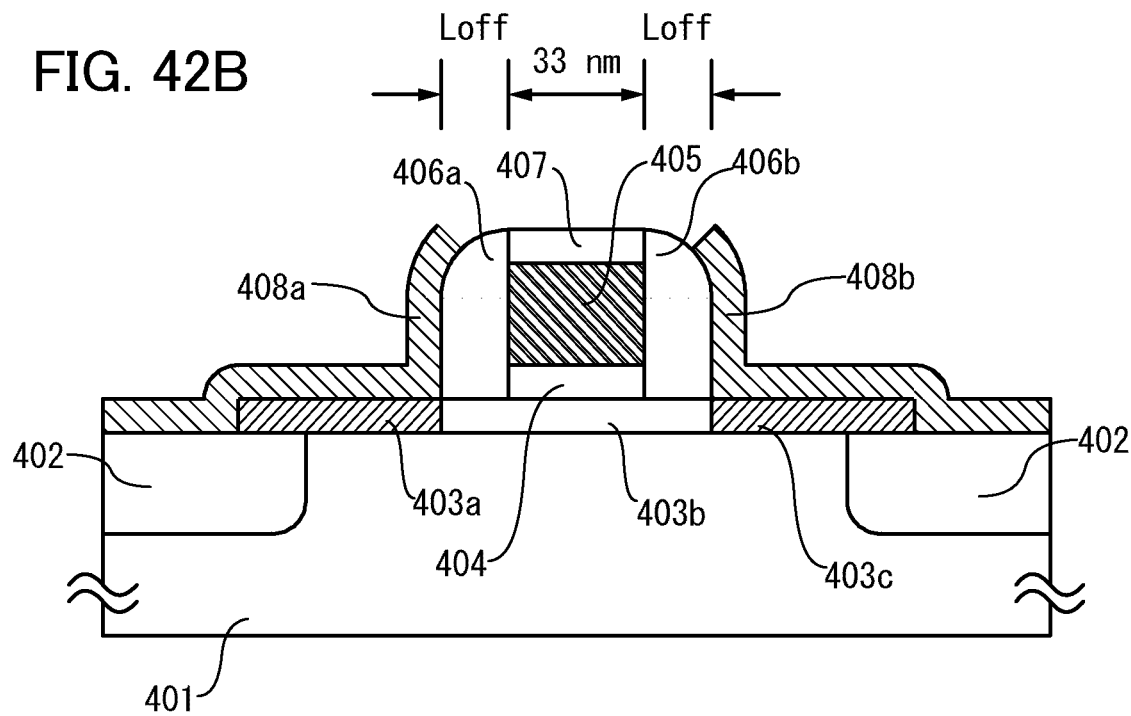

FIGS. 41A to 41C show the gate voltage dependence of the drain current I$_d$ (a solid line) and the field-effect mobility μ (a dotted line) of the transistor having the structure in FIG. 42B and an offset length L$_{off}$ of 15 nm. The drain current I$_d$ is obtained by calculation under the assumption that the drain voltage is +1 V, and the field-effect mobility μ is obtained by calculation under the assumption that the drain voltage is +0.1 V. FIG. 41A shows the gate voltage dependence of the transistor in the case where the thickness of the gate insulating film is 15 nm, FIG. 41B shows that of the transistor in the case where the thickness of the gate insulating film is 10 nm, and FIG. 41C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 39A to 39C, approximately 60 cm$^2$/Vs in FIGS. 40A to 40C, and approximately 40 cm$^2$/Vs in FIGS. 41A to 41C; thus, the peak of the mobility μ is decreased as the offset length L$_{off}$ is increased. Further, the same applies to the off-state current. The on-state current is also decreased as the offset length L$_{off}$ is increased; however, the decrease in the on-state current is much more gradual than the decrease in the off-state current. Further, the graphs show that in either of the structures, the drain current exceeds 10 μA at a gate voltage of around 1 V.

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 43A:
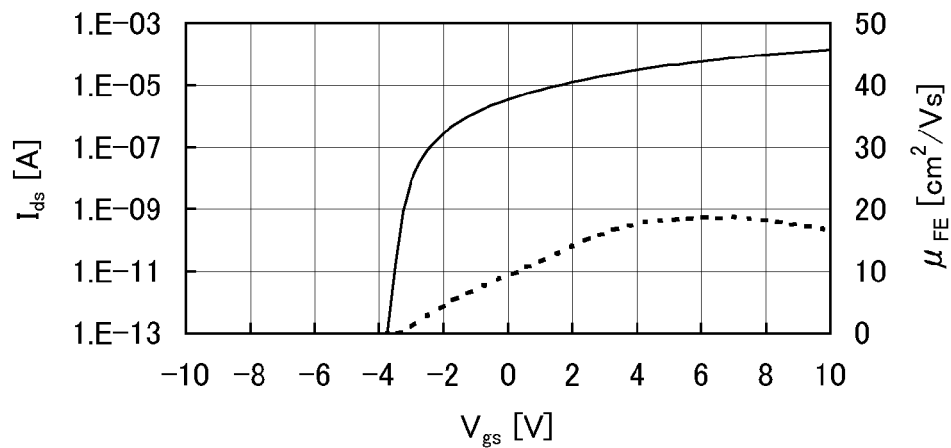
FIGS. 43A to 43C are graphs showing characteristics of transistors each including an oxide semiconductor film.
Figure 43B:
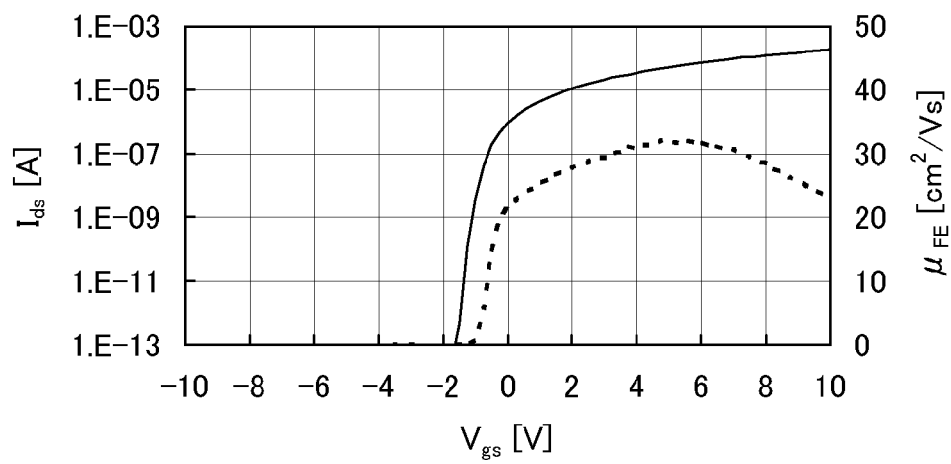
Figure 43C:
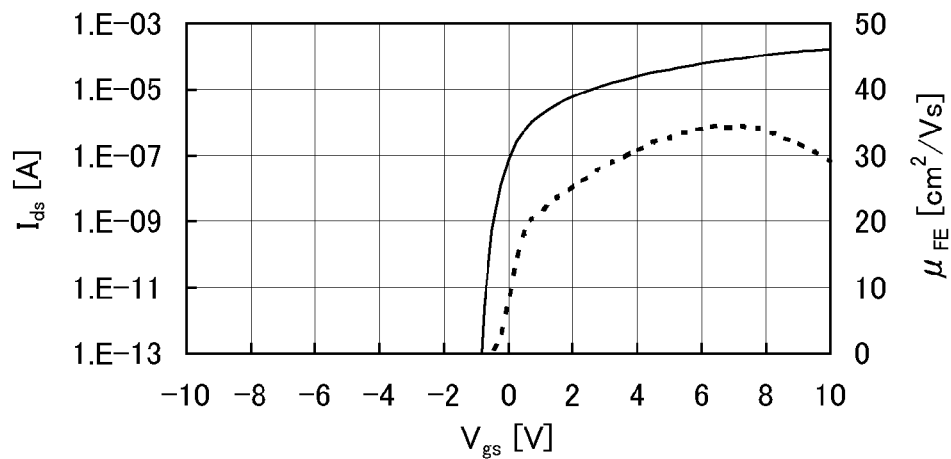

As an example, FIGS. 43A to 43C are graphs each showing characteristics of a transistor in which an oxide semiconductor film containing In, Sn, and Zn as main components and having a channel length L of 3 µm and a channel width W of 10 µm, and a gate insulating film with a thickness of 100 nm are used. Note that $V_d$ was set to 10 V.

FIG. 43A is a graph showing characteristics of a transistor whose oxide semiconductor film containing In, Sn, and Zn as main components was formed by a sputtering method without heating a substrate intentionally. The field-effect mobility of the transistor was 18.8 cm$^2$/Vsec. On the other hand, when the oxide semiconductor film containing In, Sn, and Zn as main components is formed while heating the substrate intentionally, the field-effect mobility can be improved. FIG. 43B shows characteristics of a transistor whose oxide semiconductor film containing In, Sn, and Zn as main components was formed while heating a substrate at 200° C. The field-effect mobility of the transistor was 32.2 cm$^2$/Vsec.

The field-effect mobility can be further improved by performing heat treatment after formation of the oxide semiconductor film containing In, Sn, and Zn as main components. FIG. 43C shows characteristics of a transistor whose oxide semiconductor film containing In, Sn, and Zn as main components was formed by sputtering at 200° C. and then subjected to heat treatment at 650° C. The field-effect mobility of the transistor was 34.5 cm$^2$/Vsec.

The intentional heating of the substrate is expected to have an effect of reducing moisture taken into the oxide semiconductor film during the formation by sputtering. Further, the heat treatment after deposition enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 43A and 43B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1 \times 10^{16}$/cm$^3$ to $2 \times 10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 46:
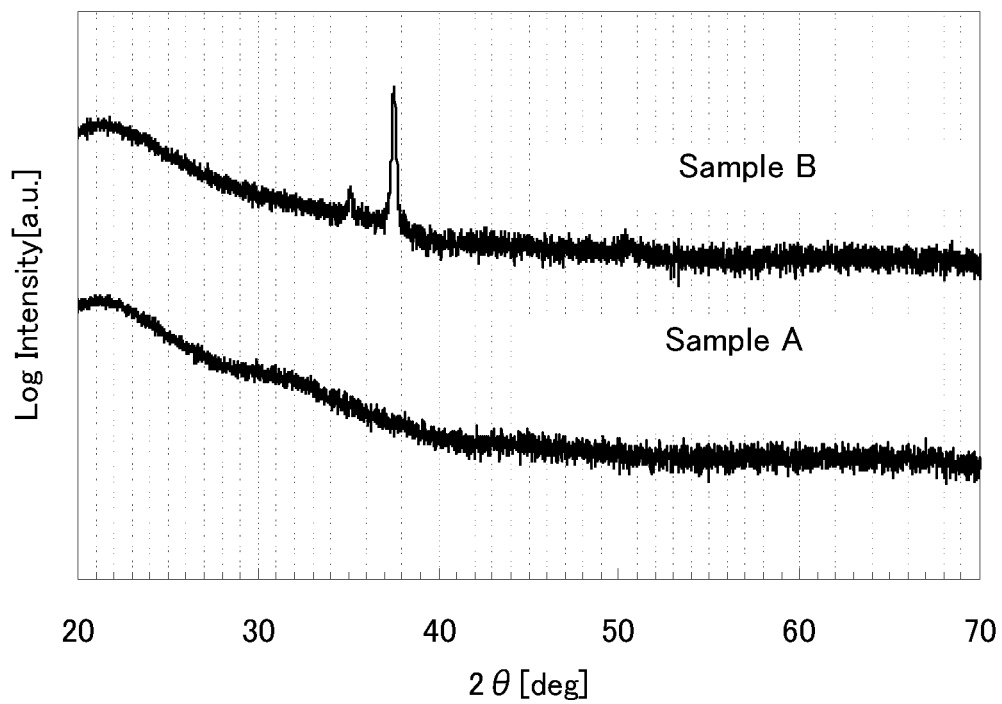
FIG. 46 shows XRD spectra of Sample A and Sample B.

FIG. 46 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 47:
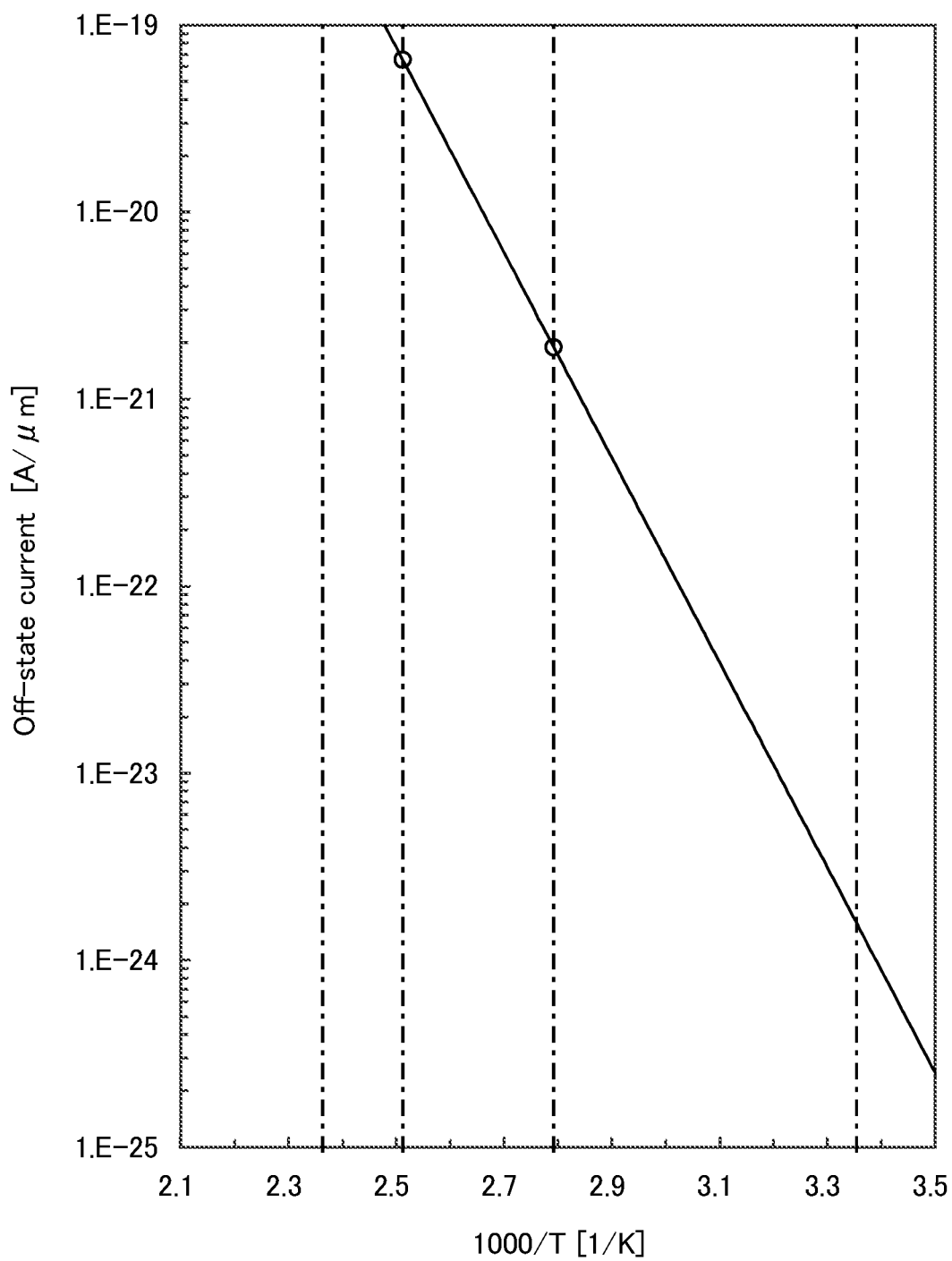
FIG. 47 shows a relation between off-state current of a transistor and substrate temperature.

FIG. 47 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 47, the off-state current was 0.1 aA/μm ($1 \times 10^{-19}$ A/μm) or smaller and 10 zA/μm ($1 \times 10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively. The above values of off-state currents are clearly much lower than that of the transistor using Si as a semiconductor film. By using a transistor including an oxide semiconductor whose off-state current value is extremely low as the transistor described in any of Embodiments 1 to 3, a logic circuit whose data retention characteristics are kept extremely high even after power is turned off can be provided. Further, since data retention characteristics are improved, a logic circuit with low power consumption can be provided.

The relation between the substrate temperature and electrical characteristics of a transistor of Sample B, on which heat treatment at 650° C. was performed after deposition of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was –40° C., –25° C., 25° C., 75° C., 125° C., and 150° C.

One example of a transistor used for the measurement will be described with reference to FIGS. 44A and 44B and FIGS. 45A and 45B. Note that in FIGS. 44A and 44B and FIGS. 45A and 45B, an In—Sn—Zn—O film is used as a semiconductor film.

Figure 44A:
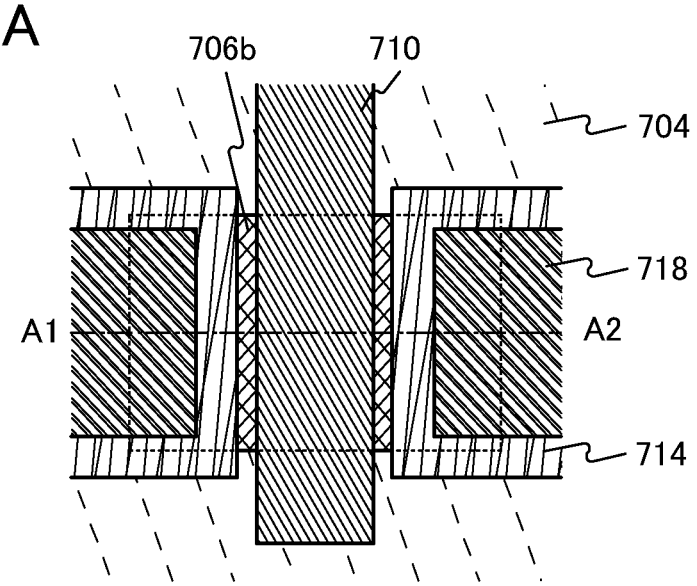
FIGS. 44A and 44B are a top view and a cross-sectional view illustrating a structure of a transistor.
Figure 44B:
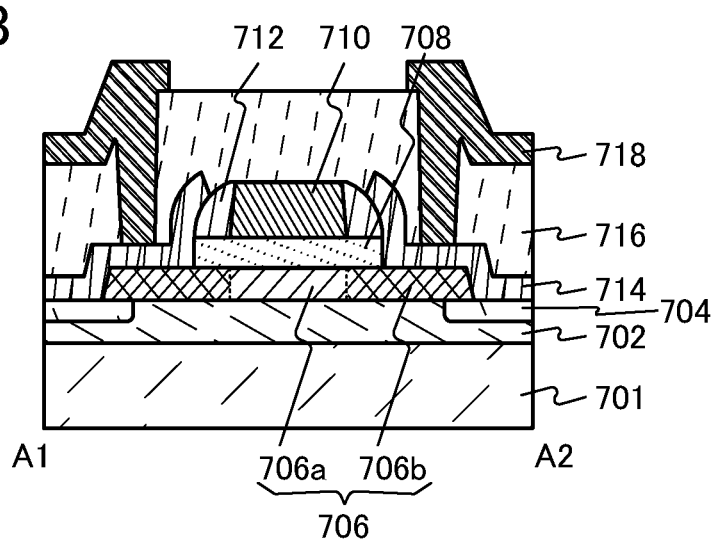

FIGS. 44A and 44B are a top view and a cross-sectional view of a coplanar transistor having a top-gate top-contact structure. FIG. 44A is the top view of the transistor. FIG. 44B is the cross-sectional view taken along dashed-dotted line A1-A2 in FIG. 44A.

The transistor illustrated in FIG. 44B includes a substrate 701; a base insulating film 702 provided over the substrate 701; a protective insulating film 704 provided in the periphery of the base insulating film 702; an oxide semiconductor film 706 which is provided over the base insulating film 702 and the protective insulating film 704 and includes a high-resistance region 706a and low-resistance regions 706b; a gate insulating film 708 provided over the oxide semiconductor film 706; a gate electrode 710 provided to overlap with the oxide semiconductor film 706 with the gate insulating film 708 provided therebetween; a sidewall insulating film 712 provided in contact with a side surface of the gate electrode 710; a pair of electrodes 714 provided in contact with at least the low-resistance regions 706b; an interlayer insulating film 716 provided to cover at least the oxide semiconductor film 706, the gate electrode 710, and the pair of electrodes 714; and a wiring 718 provided to be connected to at least one of the pair of electrodes 714 through an opening formed in the interlayer insulating film 716.

Although not illustrated, a protective film may be provided to cover the interlayer insulating film 716 and the wiring 718. With the protective film, a minute amount of leakage current generated by surface conduction of the interlayer insulating film 716 can be reduced and thus the off-state current of the transistor can be reduced.

Figure 45A:
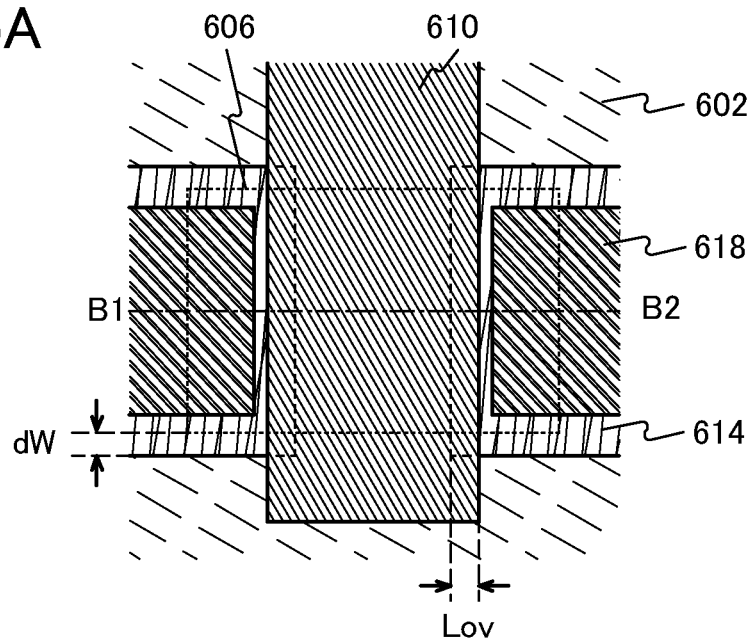
FIGS. 45A and 45B are a top view and a cross-sectional view illustrating a structure of a transistor.
Figure 45B:
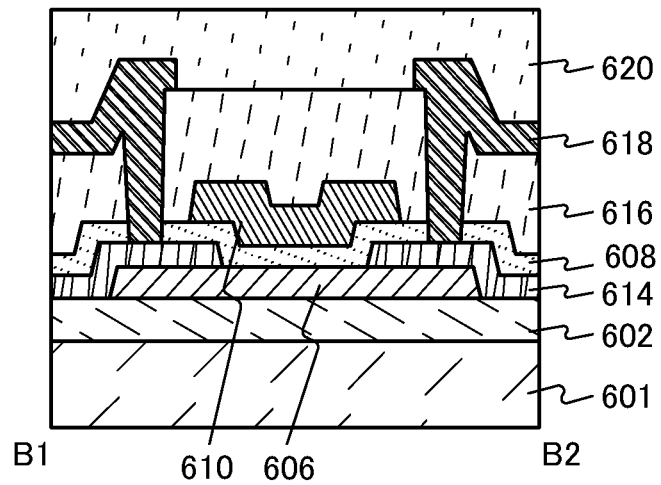

FIGS. 45A and 45B are a top view and a cross-sectional view of a transistor having a top-gate top-contact structure. FIG. 45A is the top view of the transistor. FIG. 45B is the cross-sectional view taken along dashed-dotted line B1-B2 in FIG. 45A.

The transistor illustrated in FIG. 45B includes a substrate 601; a base insulating film 602 provided over the substrate 601; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 601, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 45A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 48:
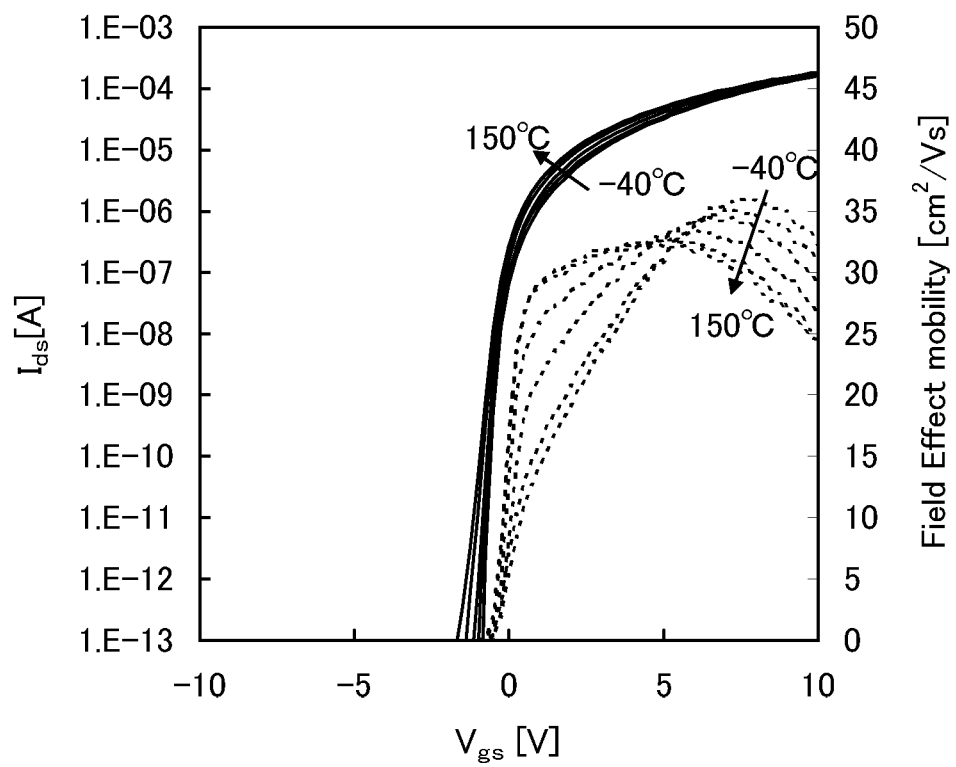
FIG. 48 shows $V_{gs}$ dependence of $I_{ds}$ and field-effect mobility.
Figure 49A:
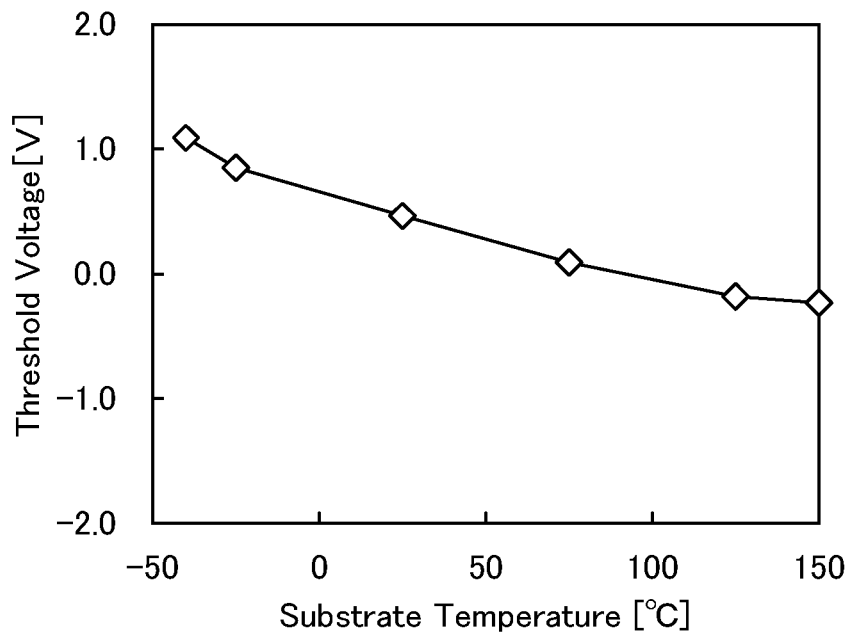
FIG. 49A shows a relation between the threshold voltage and the substrate temperature.

FIG. 48 shows the $V_{gs}$ dependence of $I_{ds}$ (a solid line) and field-effect mobility (a dotted line). FIG. 49A shows a relation between the substrate temperature and the threshold voltage, and FIG. 49B shows a relation between the substrate temperature and the field-effect mobility.

From FIG. 49A, it is found that the threshold voltage gets lower as the substrate temperature increases. Note that the threshold voltage is decreased from 1.09 V to −0.23 V in the range from −40° C. to 150° C.

Figure 49B:
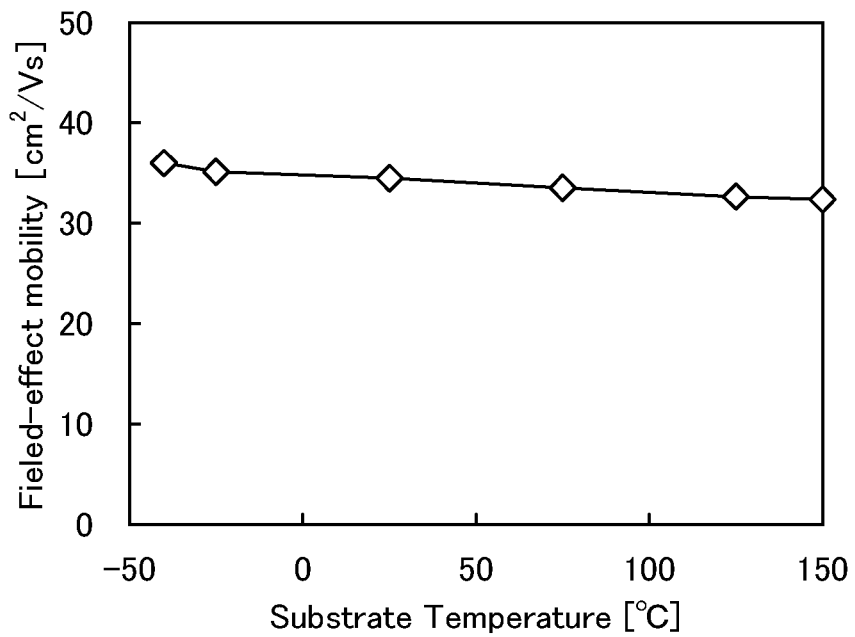
FIG. 49B shows a relation between the field-effect mobility and the substrate temperature.

From FIG. 49B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current kept at 1 aA/μm or lower, which can achieve on-state current needed for a logic circuit. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, a logic circuit having a novel function can be achieved without decreasing the operation speed even when a transistor including an oxide semiconductor is provided in a logic circuit formed using a silicon semiconductor.

This application is based on Japanese Patent Application serial no. 2011-113711 filed with Japan Patent Office on May 20, 2011, the entire contents of which are hereby incorporated by reference.

What is claimed is:

1. A logic circuit including:
a first transistor whose gate is electrically connected to one of a source or a drain of a second transistor;
a third transistor whose gate is electrically connected to one of a source or a drain of a fourth transistor;
a fifth transistor whose gate is electrically connected to one of a source or a drain of a sixth transistor;
a seventh transistor whose gate is electrically connected to one of a source or a drain of an eighth transistor;
a ninth transistor whose gate is electrically connected to one of a source or a drain of a tenth transistor;
an eleventh transistor whose gate is electrically connected to one of a source or a drain of a twelfth transistor;
a thirteenth transistor whose gate is electrically connected to one of a source or a drain of a fourteenth transistor; and
a fifteenth transistor whose gate is electrically connected to one of a source or a drain of a sixteenth transistor including an oxide semiconductor; and
a seventeenth transistor, an eighteenth transistor, a nineteenth transistor, a twentieth transistor and a twenty-first transistor,
wherein each of the first transistor, the third transistor, the fifth transistor, the seventh transistor, the ninth transistor, the eleventh transistor, the thirteenth transistor and the fifteenth transistor includes silicon,
wherein each of the second transistor, the fourth transistor, the sixth transistor, the eighth transistor, the tenth transistor, the twelfth transistor, the fourteenth transistor and the sixteenth transistor includes an oxide semiconductor,
wherein one of a source and a drain of the eighteenth transistor, one of a source and a drain of the nineteenth transistor, one of a source and a drain of the twentieth transistor and one of a source and a drain of the twenty-first transistor are electrically connected to each other,
wherein the other of the source and the drain of the eighteenth transistor, a gate of the twentieth transistor, one of a source and a drain of the first transistor, and one of a source and a drain of the fifth transistor are electrically connected to each other at a first node,
wherein the other of the source and the drain of the twenty-first transistor, a gate of the nineteenth transistor, one of a source and a drain of the ninth transistor, and one of a source and a drain of the thirteenth transistor are electrically connected to each other at a second node,
wherein the other of the source and the drain of the first transistor is electrically connected to one of a source and a drain of the third transistor,
wherein the other of the source and the drain of the fifth transistor is electrically connected to one of a source and a drain of the seventh transistor,
wherein the other of the source and the drain of the ninth transistor is electrically connected to one of a source and a drain of the eleventh transistor,
wherein the other of the source and the drain of the thirteenth transistor is electrically connected to one of a source and a drain of the fifteenth transistor, and
wherein the other of the source and the drain of the third transistor, the other of the source and the drain of the seventh transistor, the other of the source and the drain of the eleventh transistor, the other of the source and the drain of the fifteenth transistor and one of a source and a drain of the seventeenth transistor are electrically connected to each other.

2. The logic circuit according to claim 1, further comprising:
a comparator including the eighteenth transistor, the nineteenth transistor, the twentieth transistor and the twenty-first transistor; and
an output-node-potential determining portion comprising the seventeenth transistor,
wherein each of the eighteenth transistor, the nineteenth transistor, the twentieth transistor and the twenty-first transistor is a p-channel transistor,
wherein the seventeenth transistor is an n-channel transistor, and
wherein each of a gate of the eighteenth transistor, a gate of the twenty-first transistor and a gate of the seventeenth transistor is supplied with a clock signal.

3. The logic circuit according to claim 1, further comprising:
a comparator including the eighteenth transistor, the nineteenth transistor, the twentieth transistor and the twenty-first transistor; and
an output-node-potential determining portion comprising the seventeenth transistor,
wherein each of the eighteenth transistor, the nineteenth transistor, the twentieth transistor and the twenty-first transistor is an n-channel transistor, wherein the seventeenth transistor is a p-channel transistor, and wherein each of a gate of the eighteenth transistor, a gate of the twenty-first transistor and a gate of the seventeenth transistor is supplied with a clock signal.

4. The logic circuit according to claim 1, wherein the logic circuit is an XOR circuit.

5. The logic circuit according to claim 1, wherein the logic circuit is a MUX circuit.

6. A semiconductor integrated circuit comprising the logic circuit according to claim 1.

7. A logic circuit comprising:
a first node and a second node;
a comparator configured to compare potentials of the first and the second node;
a charge retaining portion electrically connected to the comparator via the first node and the second node; and
an output-node-potential determining portion electrically connected to the charge retaining portion,
wherein the charge retaining portion comprises a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor and a sixteenth transistor,
wherein each of the first transistor, the second transistor, the third transistor, the fourth transistor, the ninth transistor, the tenth transistor, the eleventh transistor and the twelfth transistor includes an oxide semiconductor,
wherein a gate of the fifth transistor is electrically connected to one of a source and a drain of the first transistor,
wherein a gate of the sixth transistor is electrically connected to one of a source and a drain of the second transistor,
wherein a gate of the seventh transistor is electrically connected to one of a source and a drain of the third transistor,
wherein a gate of the eighth transistor is electrically connected to one of a source and a drain of the fourth transistor,
wherein a gate of the thirteenth transistor is electrically connected to one of a source and a drain of the ninth transistor,
wherein a gate of the fourteenth transistor is electrically connected to one of a source and a drain of the tenth transistor,
wherein a gate of the fifteenth transistor is electrically connected to one of a source and a drain of the eleventh transistor,
wherein a gate of the sixteenth transistor is electrically connected to one of a source and a drain of the twelfth transistor,
wherein one of a source and a drain of the fifth transistor is electrically connected to the first node,
wherein one of a source and a drain of the sixth transistor is electrically connected to the other of the source and the drain of the fifth transistor,
wherein one of a source and a drain of the seventh transistor is electrically connected to the first node,
wherein one of a source and a drain of the eighth transistor is electrically connected to the other of the source and the drain of the seventh transistor,
wherein one of a source and a drain of the thirteenth transistor is electrically connected to the second node, wherein one of a source and a drain of the fourteenth transistor is electrically connected to the other of the source and the drain of the thirteenth transistor,
wherein one of a source and a drain of the fifteenth transistor is electrically connected to the second node,
wherein one of a source and a drain of the sixteenth transistor is electrically connected to the other of the source and the drain of the fifteenth transistor, and
wherein the output-node-potential determining portion comprises a seventeenth transistor whose source or drain is electrically connected to the other of the source and the drain of the sixth transistor, the other of the source and the drain of the eighth transistor, the other of the source or the drain of the fourteenth transistor and the other of the source or the drain of the sixteenth transistor.

8. The logic circuit according to claim 7, wherein each of the fifth transistor, the sixth transistor, the seventh transistor, the eighth transistor, the thirteenth transistor, the fourteenth transistor, the fifteenth transistor, the sixteenth transistor and the seventeenth transistor includes silicon.

9. The logic circuit according to claim 7,
wherein the seventeenth transistor is an n-channel transistor,
wherein the comparator includes a first p-channel transistor, a second p-channel transistor, a third p-channel transistor and a fourth p-channel transistor,
wherein a source or a drain of the first p-channel transistor and a source or a drain of the second p-channel transistor are electrically connected to the first node,
wherein a source or a drain of the third p-channel transistor and a source or a drain of the fourth p-channel transistor are electrically connected to the second node,
wherein a gate of the second p-channel transistor is electrically connected to the second node,
wherein a gate of the third p-channel transistor is electrically connected to the first node, and
wherein a gate of the first p-channel transistor, a gate of the fourth p-channel transistor and a gate of the seventeenth transistor are supplied with a clock signal.

10. The logic circuit according to claim 7,
wherein the seventeenth transistor is a p-channel transistor,
wherein the comparator includes a first n-channel transistor, a second n-channel transistor, a third n-channel transistor and a fourth n-channel transistor,
wherein a source or a drain of the first n-channel transistor and a source or a drain of the second n-channel transistor are electrically connected to the first node,
wherein a source or a drain of the third n-channel transistor and a source or a drain of the fourth n-channel transistor are electrically connected to the second node,
wherein a gate of the second n-channel transistor is electrically connected to the second node,
wherein a gate of the third n-channel transistor is electrically connected to the first node, and
wherein a gate of the first n-channel transistor, a gate of the fourth n-channel transistor and a gate of the seventeenth transistor are supplied with a clock signal.

11. The logic circuit according to claim 9,
each of a gate of the first transistor, a gate of the second transistor, a gate of the third transistor, a gate of the fourth transistor, a gate the ninth transistor, a gate of the tenth transistor, a gate of the eleventh transistor and a gate of the twelfth transistor is supplied with an inverted signal of the clock signal, wherein each of the other of the source and the drain of the first transistor and the other of the source and the drain of the eleventh transistor is supplied with a first input signal, wherein each of the other of the source and the drain of the third transistor and the other of the source and the drain of the ninth transistor is supplied with an inverted signal of the first input signal, wherein each of the other of the source and the drain of the fourth transistor and the other of the source and the drain of the twelfth transistor is supplied with a second input signal, and wherein each of the other of the source and the drain of the second transistor and the other of the source and the drain of the tenth transistor is supplied with an inverted signal of the second input signal.

12. The logic circuit according to claim 9, wherein each of a gate of the first transistor, a gate of the second transistor, a gate of the third transistor, a gate of the fourth transistor, a gate of the ninth transistor, a gate of the tenth transistor, a gate of the eleventh transistor and a gate of the twelfth transistor is supplied with an inverted signal of the clock signal, wherein the other of the source and the drain of the first transistor is supplied with a first input signal, wherein the other of the source and the drain of the eleventh transistor is supplied with an inverted signal of the first input signal, wherein each of the other of the source and the drain of the second transistor and the other of the source and the drain of the twelfth transistor is supplied with a second input signal, wherein each of the other of the source and the drain of the fourth transistor and the other of the source and the drain of the tenth transistor is supplied with an inverted signal of the second input signal, wherein the other of the source and the drain of the third transistor is supplied with a third input signal, and wherein the other of the source and the drain of the ninth transistor including an oxide semiconductor is supplied with an inverted signal of the third input signal.

13. The logic circuit according to claim 7, wherein the logic circuit is an XOR circuit.

14. The logic circuit according to claim 7, wherein the logic circuit is a MUX circuit.

15. A semiconductor integrated circuit comprising the logic circuit according to claim 7.

16. A logic circuit comprising:
a first node and a second node;
a comparator configured to compare potentials of the first node and the second node;
a charge retaining portion electrically connected to the comparator via the first node and the second node; and
an output-node-potential determining portion electrically connected to the charge retaining portion, wherein the charge retaining portion comprises a first transistor, a second transistor, a third transistor, a fourth transistor, a fifth transistor, a sixth transistor, a seventh transistor and an eighth transistor, wherein each of the first transistor, the second transistor, the third transistor and the fourth transistor includes an oxide semiconductor, wherein a gate of the fifth transistor is electrically connected to one of a source and a drain of the first transistor, wherein a gate of the sixth transistor is electrically connected to one of a source and a drain of the second transistor, wherein a gate of the seventh transistor is electrically connected to one of a source and a drain of the third transistor, wherein a gate of the eighth transistor is electrically connected to one of a source and a drain of the fourth transistor, wherein one of a source and a drain of the fifth transistor is electrically connected to the first node, wherein one of a source and a drain of the sixth transistor is electrically connected to the other of the source and the drain of the fifth transistor, wherein one of a source and a drain of the seventh transistor is electrically connected to the first node, wherein one of a source and a drain of the eighth transistor is electrically connected to the other of the source and the drain of the seventh transistor, and wherein the output-node-potential determining portion is electrically connected to the other of the source and the drain of the sixth transistor and the other of the source and the drain of the eighth transistor.

17. The logic circuit according to claim 16, wherein the comparator includes a first p-channel transistor, a second p-channel transistor, a third p-channel transistor and a fourth p-channel transistor, wherein the output-node-potential determining portion comprises a n-channel transistor whose source or drain is electrically connected to the charge retaining portion, wherein a source or a drain of the first p-channel transistor and a source or a drain of the second p-channel transistor are electrically connected to the first node, wherein a source or a drain of the third p-channel transistor and a source or a drain of the fourth p-channel transistor are electrically connected to the second node, wherein a gate of the second p-channel transistor is electrically connected to the second node, wherein a gate of the third p-channel transistor is electrically connected to the first node, and wherein each of a gate of the first p-channel transistor, a gate of the fourth p-channel transistor and a gate of the n-channel transistor is supplied with a clock signal.

18. The logic circuit according to claim 16, wherein the comparator includes a first n-channel transistor, a second n-channel transistor, a third n-channel transistor and a fourth n-channel transistor, wherein the output-node-potential determining portion comprises a p-channel transistor, wherein a source or a drain of the first n-channel transistor and a source or a drain of the second n-channel transistor are electrically connected to the first node, wherein a source or a drain of the third n-channel transistor and a source or a drain of the fourth n-channel transistor are electrically connected to the second node, wherein a gate of the second n-channel transistor is electrically connected to the second node, wherein a gate of the third n-channel transistor is electrically connected to the first node, and wherein each of a gate of the first n-channel transistor, a gate of the fourth n-channel transistor and a gate of the p-channel transistor is supplied with a clock signal.

19. The logic circuit according to claim 16, wherein the logic circuit is an XOR circuit.

20. The logic circuit according to claim 16, wherein the logic circuit is a MUX circuit.

21. A semiconductor integrated circuit comprising the logic circuit according to claim 16.

* * * * *